(12) United States Patent  
Kusunoki et al.

(10) Patent No.: US 8,253,163 B2  
(45) Date of Patent: Aug. 28, 2012

(54) HIGH VOLTAGE SEMICONDUCTOR DEVICE INCLUDING A FREE WHEEL DIODE

(75) Inventors: Shigeru Kusunoki, Chiyoda-ku (JP);  
Junji Yahiro, Chiyoda-ku (JP);  
Yoshihiko Hirota, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/899,758

(22) Filed: Oct. 7, 2010

(65) Prior Publication Data

US 2011/0140165 A1 Jun. 16, 2011

(30) Foreign Application Priority Data

Dec. 16, 2009 (JP) ................. 2009-285109

(51) Int. Cl.  
*H01L 29/739* (2006.01)

(52) U.S. Cl. ........ 257/139; 257/141; 257/153; 257/341; 257/343; 257/344; 257/345; 257/346; 257/E27.091; 257/E27.095; 257/E27.274; 257/E27.318

(58) Field of Classification Search .......... 257/141–153, 257/139, 341, 342, 343, 344, 345, 346, E27.091, 257/E27.095, E27.274, E27.318  
See application file for complete search history.

(56) References Cited

U.S. PATENT DOCUMENTS

| | | | |
|---|---|---|---|
| 6,667,515 B2 * | 12/2003 | Inoue | 257/341 |
| 7,154,145 B2 | 12/2006 | Takahashi | |
| 7,400,017 B2 | 7/2008 | Aono et al. | |
| 2002/0100935 A1 * | 8/2002 | Inoue | 257/341 |
| 2008/0251810 A1 * | 10/2008 | Torii | 257/139 |
| 2008/0315248 A1 * | 12/2008 | Tokura et al. | 257/139 |
| 2009/0140289 A1 | 6/2009 | Torii | |

FOREIGN PATENT DOCUMENTS

| | | |
|---|---|---|
| JP | 4-192366 | 7/1992 |
| JP | 6-21358 | 1/1994 |
| JP | 9-186315 | 7/1997 |
| JP | 9-283754 | 10/1997 |

(Continued)

OTHER PUBLICATIONS

Office Action issued Apr. 17, 2012 in Japanese Application No. 2009-285109 filed Dec. 16, 2009.

*Primary Examiner* — Marc Armand  
(74) *Attorney, Agent, or Firm* — Oblon, Spivak, McClelland, Maier & Neustadt, L.L.P.

(57) ABSTRACT

A high voltage semiconductor device includes a semiconductor substrate, a p type base region in a first main surface, an $n^+$ type emitter region in the p type base region, an $n^+$ type cathode region adjacent to an end surface of the semiconductor substrate and not penetrating the semiconductor substrate, a $p^+$ type collector region in a second main surface, a first main electrode, a second main electrode, a third main electrode, and a connection portion connecting the second main electrode and the third main electrode. A resistance between the p type base region and the $n^+$ type cathode region is greater than a resistance between the p type base region and the $p^+$ type collector region. In the high voltage semiconductor device in which an IGBT and a free wheel diode are formed in a single semiconductor substrate, occurrence of a snap-back phenomenon is suppressed.

15 Claims, 40 Drawing Sheets

FOREIGN PATENT DOCUMENTS

| | | |
|---|---|---|
| JP | 2003-78138 | 3/2003 |
| JP | 2004-363328 | 12/2004 |
| JP | 2005-175161 | 6/2005 |
| JP | 2006-332182 | 12/2006 |
| JP | 2007-184486 | 7/2007 |
| JP | 2007-227982 | 9/2007 |
| JP | 2009-141185 | 6/2009 |
| WO | 2007/108456 | 9/2007 |

\* cited by examiner

HIGH VOLTAGE SEMICONDUCTOR DEVICE INCLUDING A FREE WHEEL DIODE

BACKGROUND OF THE INVENTION

1. Field of the Invention

The present invention relates to a high voltage semiconductor device, and in particularly to a high voltage semiconductor device in which an IGBT or a power MOSFET and a free wheel diode are formed in a single semiconductor substrate.

2. Description of the Background Art

Recently, from the viewpoint of energy saving, inverter circuits have been widely used. Inverter circuits control electric power for home electric appliances, industrial electric power equipment, or the like. An inverter circuit switches ON and OFF of voltage or current using a power semiconductor device embedded in the inverter circuit. Examples of the power semiconductor device include an Insulated Gate Bipolar Transistor (IGBT), a power Metal-Oxide-Semiconductor Field-Effect Transistor (MOSFET), and the like.

The inverter circuit drives an inductive load such as an induction motor. The inductive load generates a counter-electromotive force. The inverter circuit requires a free wheel diode. The free wheel diode causes a current to flow in a direction opposite to a direction in which a main current of an IGBT or the like generated by the counter-electromotive force flows.

In a typical inverter circuit, an IGBT or the like and a free wheel diode as separate components are connected in anti-parallel. In order to provide a small-sized and lightweight inverter device, high voltage semiconductor devices in which an IGBT or the like and a free wheel diode are formed into one chip (integrated) have been developed (see Japanese Patent Laying-Open Nos. 04-192366, 2004-363328, and 2007-227982, and U.S. Patent Application Publication No. 2009/0140289). In a high voltage semiconductor device formed into one chip, for example, a collector region of the IGBT and a cathode region of the free wheel diode are formed on a back surface side of a semiconductor substrate.

Unless the collector region of the IGBT and the cathode region of the free wheel diode are formed on the back surface side of the semiconductor substrate with being separated sufficiently, a snap-back phenomenon occurs. If the collector region of the IGBT and the cathode region of the free wheel diode are formed on the back surface side of the semiconductor substrate with being separated sufficiently, an effective area of the collector region of the IGBT is decreased, and a chip area is increased. A decrease in the effective area of the collector region of the IGBT causes deterioration of performance of the high voltage semiconductor device. An increase in the chip area causes an increase in the cost of manufacturing the high voltage semiconductor device.

It is assumed that, in order to avoid deterioration of performance and increase in the manufacturing cost of the high voltage semiconductor device, the collector region of the IGBT and the cathode region of the free wheel diode are formed on the back surface side of the semiconductor substrate without being separated sufficiently. In this case, occurrence of a snap-back phenomenon is suppressed by forming a separating portion such as a trench having an insulator embedded therein between the collector region of the IGBT and the cathode region of the free wheel diode. However, in order to form the separating portion such as a trench having an insulator embedded therein, it is necessary to form a deep groove in a thickness direction of the semiconductor substrate. As a result, the cost of manufacturing the high voltage semiconductor device is increased.

SUMMARY OF THE INVENTION

One object of the present invention is to provide a high voltage semiconductor device in which an IGBT or a power MOSFET and a free wheel diode are formed in a single semiconductor substrate, and which can suppress occurrence of a snap-back phenomenon.

A high voltage semiconductor device according to a first aspect of the present invention includes a semiconductor substrate, a first semiconductor region, a second semiconductor region, a third semiconductor region, a fourth semiconductor region, an electric field relaxing portion, a control electrode, a first main electrode, a second main electrode, a third main electrode, and a connection portion. The semiconductor substrate is of a first conductivity type, and has first and second main surfaces. The first semiconductor region is of a second conductivity type, and is formed in the first main surface of the semiconductor substrate and surrounded by the semiconductor substrate in the first main surface. The second semiconductor region is of the first conductivity type, and is formed in the first main surface and sandwiches the first semiconductor region between it and the semiconductor substrate. The third semiconductor region is of the first conductivity type, and is formed adjacent to an end surface of the semiconductor substrate, from the first main surface toward the second main surface, with a depth not penetrating the semiconductor substrate. The fourth semiconductor region is of the second conductivity type, and is formed in the second main surface of the semiconductor substrate. The electric field relaxing portion is in an annular shape, and is formed in the first main surface of the semiconductor substrate and surrounds the first semiconductor region in the first main surface. The control electrode is formed to face a channel region in the first semiconductor region sandwiched between the semiconductor substrate and the second semiconductor region, with an insulating film interposed therebetween. The first main electrode is formed in contact with both of the first semiconductor region and the second semiconductor region. The second main electrode is formed in contact with the fourth semiconductor region. The third main electrode is formed in contact with the third semiconductor region. The connection portion electrically connects the second and third main electrodes. A resistance between the first semiconductor region and the third semiconductor region is greater than a resistance between the first semiconductor region and the fourth semiconductor region.

A high voltage semiconductor device according to a second aspect of the present invention includes a semiconductor substrate, a first semiconductor region, a second semiconductor region, a third semiconductor region, a fourth semiconductor region, a trench region, a control electrode, a first main electrode, and a second main electrode. The semiconductor substrate is of a first conductivity type, and has first and second main surfaces. The first semiconductor region is of a second conductivity type, and is formed in the first main surface of the semiconductor substrate and surrounded by the semiconductor substrate in the first main surface. The second semiconductor region is of the first conductivity type, and is formed in the first main surface and sandwiches the first semiconductor region between it and the semiconductor substrate. The third semiconductor region is of the first conductivity type, the fourth semiconductor region is of the second conductivity type, and they are provided to be alternately arranged adjacent to an end surface of the semiconductor substrate in the first main surface, and each formed from the first main surface toward the second main surface with a depth not penetrating the semiconductor substrate. The trench region is formed adjacent to the end surface of the semiconductor substrate in the first main surface, from the first main surface toward the second main surface, to separate the third semiconductor region and the fourth semiconductor region. The control electrode is formed to face the first semiconductor region sandwiched between the semiconductor substrate and the second semiconductor region, with an interlayer insulating film interposed therebetween. The first main electrode is formed in contact with both of the first semiconductor region and the second semiconductor region. The second main electrode is formed to be electrically connected to the third semiconductor region and the fourth semiconductor region.

A high voltage semiconductor device according to a third aspect of the present invention includes a semiconductor substrate, a first semiconductor region, a second semiconductor region, a third semiconductor region, a fourth semiconductor region, a control electrode, a first main electrode, a resistor or a diode, and a second main electrode. The semiconductor substrate is of a first conductivity type, and has first and second main surfaces. The first semiconductor region is of a second conductivity type, and is formed in the first main surface of the semiconductor substrate and surrounded by the semiconductor substrate in the first main surface. The second semiconductor region is of the first conductivity type, and is formed in the first main surface and sandwiches the first semiconductor region between it and the semiconductor substrate. The third semiconductor region is of the first conductivity type, the fourth semiconductor region is of the second conductivity type, and they are provided to be alternately arranged adjacent to an end surface of the semiconductor substrate in the first main surface with the semiconductor substrate sandwiched therebetween, and each formed from the first main surface toward the second main surface with a depth not penetrating the semiconductor substrate. The control electrode is formed to face the first semiconductor region sandwiched between the semiconductor substrate and the second semiconductor region, with an interlayer insulating film interposed therebetween. The first main electrode is formed in contact with both of the first semiconductor region and the second semiconductor region. The resistor or the diode connects the third semiconductor region and the fourth semiconductor region. The second main electrode is electrically connected to the fourth semiconductor region.

According to the present invention, a high voltage semiconductor device in which an IGBT or a power MOSFET and a free wheel diode are formed in a single semiconductor substrate and which can suppress occurrence of a snap-back phenomenon can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
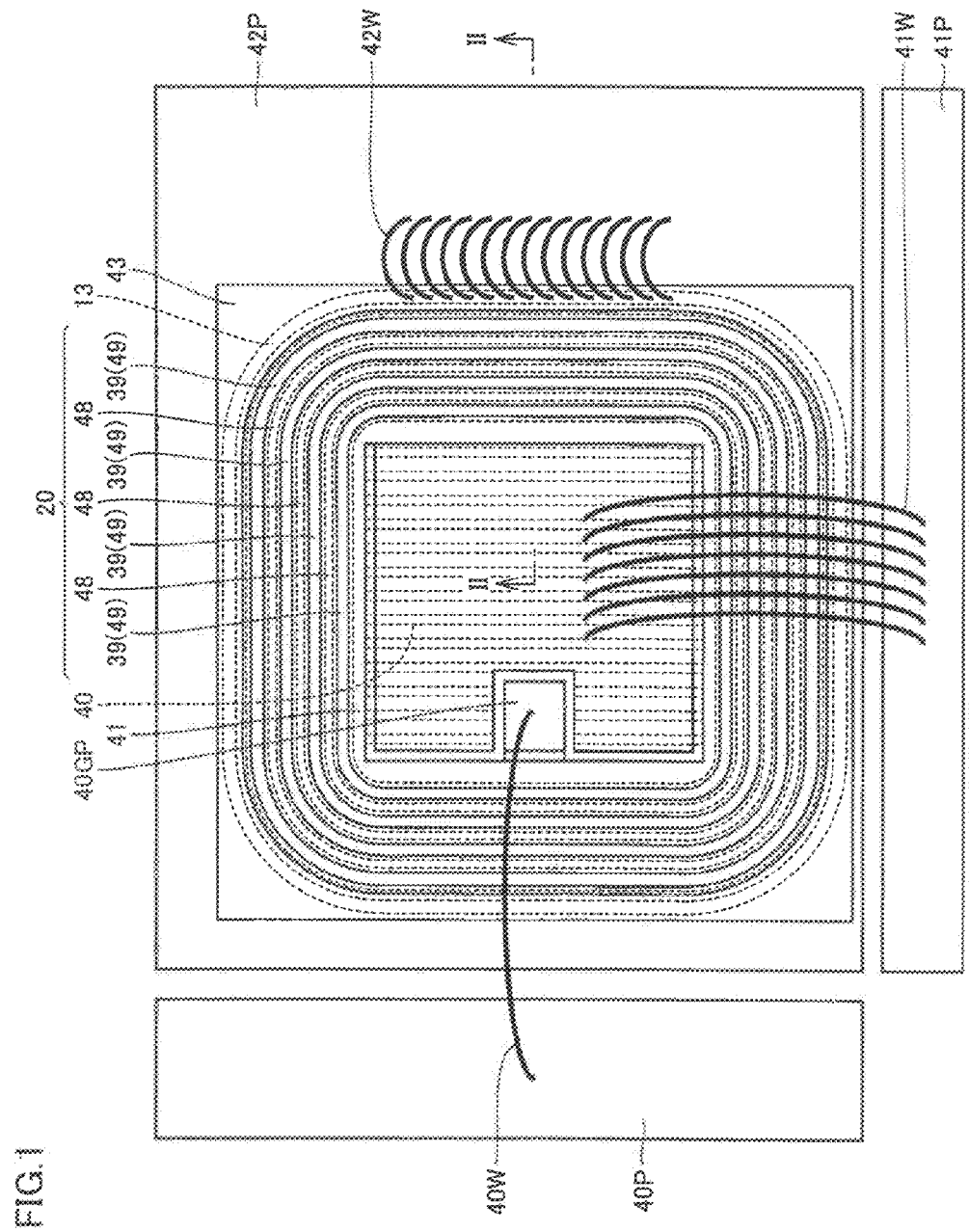
FIG. 1 is a plan view showing a high voltage semiconductor device of Embodiment 1.

Hereinafter, a high voltage semiconductor device in embodiments according to the present invention will be described with reference to the drawings. When the number, amount, or the like is referred to in the embodiments described below, the scope of the present invention is not necessarily limited to such a number, amount, or the like, unless otherwise specified. Identical or corresponding parts will be designated by the same reference characters, and an overlapping description may not be repeated.

Embodiment 1

Figure 2:
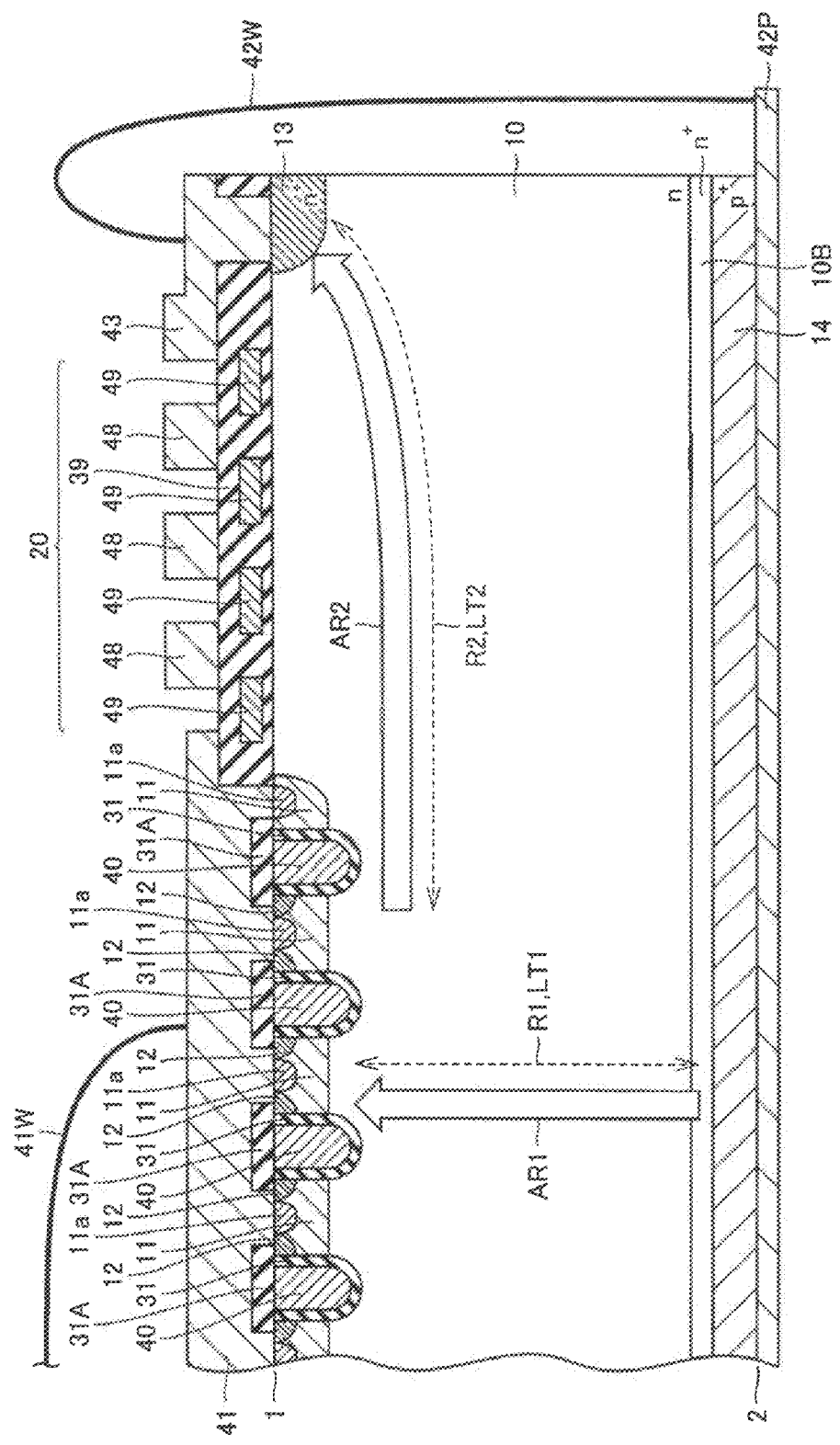
FIG. 2 is a cross sectional view along a line II-II in FIG. 1 seen in the direction of arrows.

Referring to FIGS. 1 and 2, Embodiment 1 according to the present invention will be described. In a high voltage semiconductor device of the present embodiment, an IGBT (n channel type) and a free wheel diode are formed in a single semiconductor substrate.

(IGBT)

Referring to FIG. 2, the IGBT formed within the high voltage semiconductor device will be described. The IGBT includes an n type semiconductor substrate 10, a relatively highly concentrated n$^+$ type buffer region 10B, a p type base region (a first semiconductor region) 11, a relatively highly concentrated p$^+$ type region 11a, a relatively highly concentrated n$^+$ type emitter region (a second semiconductor region) 12, a relatively highly concentrated p$^+$ type collector region (a fourth semiconductor region) 14, an insulating film 31, and a gate electrode (a control electrode) 40.

P type base region 11 is formed in a first main surface 1 of n type semiconductor substrate 10 in a substantially rectangular shape in a planar view. P type base region 11 is surrounded by semiconductor substrate 10 in the first main surface 1. P$^+$ type region 11a is formed in a surface of p type base region 11. P$^+$ type region 11a is formed to obtain a good ohmic connection between p type base region 11 and a first main electrode 41 described later.

N$^+$ type emitter region 12 is selectively formed in the surface of p type base region 11. N$^+$ type emitter region 12 and semiconductor substrate 10 sandwich p type base region 11 therebetween. In other words, n$^+$ type emitter region 12 is surrounded by p type base region 11 in the first main surface 1 of semiconductor substrate 10.

P$^+$ type collector region 14 is formed in an entire second main surface 2 of semiconductor substrate 10. N$^+$ type buffer region 10B is formed on a side opposite to the second main surface 2 with p$^+$ type collector region 14 sandwiched therebetween. N$^+$ type buffer region 10B can suppress spread of a depletion layer during reverse biasing, as a channel stopper.

Gate electrode 40 is formed inside a groove provided in the first main surface 1 of semiconductor substrate 10, with insulating film 31 interposed therebetween. Insulating film 31 penetrates p type base region 11 in a thickness direction of semiconductor substrate 10. Gate electrode 40 faces p type base region 11 sandwiched between semiconductor substrate 10 and n$^+$ type emitter region 12, with insulating film 31 interposed therebetween. A portion of p type base region 11 sandwiched between semiconductor substrate 10 and n$^+$ type emitter region 12 that faces gate electrode 40 with insulating film 31 interposed therebetween forms a channel region. Although gate electrode 40 and insulating film 31 in the present embodiment constitute a trench electrode as shown in FIG. 2, they may constitute a so-called planar electrode formed on the surface of semiconductor substrate 10.

A plurality of gate electrodes 40 are formed along the first main surface 1 of semiconductor substrate 10. Referring to FIG. 1, gate electrodes 40 are formed in parallel, with a predetermined gap therebetween (in a horizontal direction in a paper plane of FIG. 1). Ends of gate electrodes 40 are electrically connected to each other by a gate wire (not shown). The gate wire is connected to a gate pad 40GP, and thereby gate electrodes 40 have a common potential. A gate wire 40W has one end connected to gate pad 40GP, and the other end connected to a gate pad 40P on an external terminal side.

Referring to FIG. 2, in the IGBT, n type semiconductor substrate 10 and n$^+$ type emitter region 12 are source/drain regions. The channel region (n channel) of p type base region 11 is controlled by gate electrode 40. N type semiconductor substrate 10, n$^+$ type emitter region 12, gate electrode 40, and p type base region 11 form a field effect transistor structure.

In the IGBT, a pnp transistor structure including p type base region 11, n type semiconductor substrate 10, n$^+$ type buffer region 10B, and p$^+$ type collector region 14 is formed, and its base current is controlled by the field effect transistor described above. Thereby, the high voltage semiconductor device of the present embodiment can serve as an IGBT.

(Free Wheel Diode)

The free wheel diode formed within the high voltage semiconductor device includes an n$^+$ type cathode region (a third semiconductor region) 13, n type semiconductor substrate 10, p type base region 11, and relatively highly concentrated p$^+$ type region 11a. N type semiconductor substrate 10, p type base region 11, and p$^+$ type region 11a are shared by the IGBT and the free wheel diode formed within the high voltage semiconductor device.

N$^+$ type cathode region 13 is formed adjacent to an end surface of semiconductor substrate 10, from the first main surface 1 toward the second main surface 2. N$^+$ type cathode region 13 is formed with a depth not penetrating semiconductor substrate 10 in the thickness direction. N$^+$ type cathode region 13 can suppress spread of a depletion layer during forward biasing, as a channel stopper.

N$^+$ type cathode region 13 and n type semiconductor substrate 10 constitute an n type region as a diode, and p type base region 11 and p$^+$ type region 11a constitute a p type region as a diode. A pn junction structure is formed between these n type region and p type region. Thereby, the free wheel diode can serve as a diode.

(Electric Field Relaxing Portion)

An electric field relaxing portion 20 is formed between p type base region 11 and n$^+$ type cathode region 13 in the first main surface 1 of semiconductor substrate 10. Referring to FIG. 1, electric field relaxing portion 20 of the present embodiment exhibits a planar field plate structure. Electric field relaxing portion 20 is annularly provided to surround a region where the IGBT is formed.

Referring to FIG. 2, electric field relaxing portion 20 exhibiting a planar field plate structure includes an interlayer insulating film 39, a plurality of conductive films 48, and a plurality of conductive films 49. Each of conductive films 48 and conductive films 49 has a floating potential.

Interlayer insulating film 39 is formed on the first main surface 1 of semiconductor substrate 10. Conductive films 49 are each annularly formed inside interlayer insulating film 39. Conductive films 49 are formed with a predetermined gap in a normal direction. Conductive films 49 are covered with interlayer insulating film 39, and conductive films 49 are insulated from each other with interlayer insulating film 39.

Each conductive film 48 is annularly formed on a front surface of interlayer insulating film 39 located between adjacent conductive films 49. Each conductive film 48 is formed to straddle adjacent conductive films 49 in a planar view. Conductive films 48 are formed with a predetermined gap therebetween in the normal direction.

(Main Electrode)

An interlayer insulating film 31A is formed on the first main surface 1 of semiconductor substrate 10 to cover gate electrode 40. From above interlayer insulating film 31A, the first main electrode 41 is formed on the first main surface 1 of semiconductor substrate 10. Gate electrode 40 is insulated from the first main electrode 41 with interlayer insulating film 31A.

The first main electrode 41 is formed in contact with both of $p^+$ type region 11a and $n^+$ type emitter region 12. The first main electrode 41 is formed to cover a portion of interlayer insulating film 39 constituting electric field relaxing portion 20 (a left end portion of interlayer insulating film 39 in FIG. 2).

Referring to FIG. 1, an emitter wire 41W has one end connected to the first main electrode 41, and the other end connected to an emitter pad 41P. Referring to FIGS. 1 and 2, the first main electrode 41 provides a (reference) potential to $p^+$ type region 11a, p type base region 11, and $n^+$ type emitter region 12, through emitter pad 41P and emitter wire 41W.

Referring to FIG. 2, a second main electrode 42P is formed in contact with $p^+$ type collector region 14 formed in the second main surface 2 of semiconductor substrate 10. The second main electrode 42P serves as a collector pad. The second main electrode 42P provides a (high) potential to $p^+$ type collector region 14.

A third main electrode 43 is formed to extend into an opening (contact hole) formed in interlayer insulating film 39, and is in contact with a surface of $n^+$ type cathode region 13. The third main electrode 43 provides a (high) potential to $n^+$ type cathode region 13. The second main electrode 42P and the third main electrode 43 are electrically connected by a connection portion 42W such as a conductive wire.

When the high voltage semiconductor device of the present embodiment serves as an IGBT, the first main electrode 41 is equivalent to an emitter electrode, the second main electrode 42P is equivalent to a collector electrode, and gate electrode 40 is equivalent to a gate electrode.

When the high voltage semiconductor device of the present embodiment serves as a (free wheel) diode, the first main electrode 41 is equivalent to an anode electrode, and the third main electrode 43 is equivalent to a cathode electrode.

As described above, $n^+$ type cathode region 13 is formed adjacent to the end surface of semiconductor substrate 10, from the first main surface 1 toward the second main surface 2, with a depth not penetrating semiconductor substrate 10 in the thickness direction. $N^+$ type cathode region 13 is in contact with the third main electrode 43, and the second main electrode 42P and the third main electrode 43 are electrically connected by connection portion 42W such as a conductive wire.

Since $n^+$ type cathode region 13 is formed adjacent to the end surface of semiconductor substrate 10, from the first main surface 1 toward the second main surface 2, with a depth not penetrating semiconductor substrate 10, a resistance R2 between p type base region 11 and $n^+$ type cathode region 13 is greater than a resistance R1 between p type base region 11 and $p^+$ type collector region 14.

(Function/Effect)

Referring to FIG. 2, an ON operation of the IGBT will be described. A positive collector voltage is applied between the first main electrode 41 and the second main electrode 42P. By applying a predetermined positive gate voltage between the first main electrode 41 and gate electrode 40 in this state, a gate is turned on. The channel region of p type base region 11 is inverted from p type to n type.

Through the channel region, electrons are injected from the first main electrode 41 into n type semiconductor substrate 10. Due to the injected electrons, $p^+$ type collector region 14 and n type semiconductor substrate 10 are forward biased. Holes are injected from $p^+$ type collector region 14 into n type semiconductor substrate 10. Thereby, a resistance of n type semiconductor substrate 10 is considerably reduced (so-called conductivity modulation). An ON resistance of the IGBT is considerably reduced, and a current flows in a direction indicated by an arrow AR1.

An OFF operation (turning-off) of the IGBT will be described. In an ON state, a positive gate voltage is applied between the first main electrode 41 and gate electrode 40. By setting the gate voltage to zero or to be negative (reverse bias), the channel region inverted into n type of p type base region 11 returns to p type, and the injection of electrons from the first main electrode 41 into semiconductor substrate 10 is stopped. Due to the stop, the injection of holes from $p^+$ type collector region 14 into semiconductor substrate 10 is also stopped, and no current flows in the direction indicated by arrow AR1.

Thereafter, the electrons and holes accumulated in n type semiconductor substrate 10 are collected to the second main electrode 42P and the first main electrode 41, respectively, or recombine with each other and disappear.

An ON operation of the free wheel diode will be described. As described above, the free wheel diode has the pn junction structure including $n^+$ type cathode region 13 and n type semiconductor substrate 10, and p type base region 11 and $p^+$ type region 11a. When a forward bias (anode voltage) exceeding a predetermined threshold value is applied between the first main electrode 41 and the third main electrode 43, holes are injected from p type base region 11 and electrons are injected from $n^+$ type cathode region 13 into n type semiconductor substrate 10. Thereby, a forward voltage is considerably reduced, and a current flows in a direction indicated by an arrow AR2.

An OFF operation of the free wheel diode will be described. When a forward voltage is applied to the free wheel diode (i.e., ON state) and thereafter the voltage is switched to an opposite direction (i.e., OFF state), a current flows in a direction opposite to the direction indicated by arrow AR2 for a determined time (i.e., a recovery operation). $N^+$ type cathode region 13 suppresses injection of minority carriers (holes) into n type semiconductor substrate 10, and reduces a turn-off time of the IGBT.

An equivalent circuit in which an IGBT and a diode are connected in anti-parallel is formed between the first main electrode 41 and the second main electrode 42P, and between the first main electrode 41 and the third main electrode 43. Namely, the high voltage semiconductor device of the present embodiment serves as a circuit in which an IGBT and a free wheel diode are connected in anti-parallel.

As described above, $n^+$ type cathode region 13 is formed adjacent to the end surface of semiconductor substrate 10, from the first main surface 1 toward the second main surface 2, with a depth not penetrating semiconductor substrate 10 in the thickness direction. According to the high voltage semiconductor device of the present embodiment, a sufficient distance is ensured between $p^+$ type collector region 14 of the IGBT and $n^+$ type cathode region 13 of the free wheel diode, when compared with a case where $n^+$ type cathode region 13 is formed on a $p^+$ type collector region 14 side of the IGBT (on a back surface (the second main surface 2 side) of semiconductor substrate 10).

According to the high voltage semiconductor device of the present embodiment, resistance R2 between p type base region 11 and $n^+$ type cathode region 13 is greater than resistance R1 between p type base region 11 and $p^+$ type collector region 14, suppressing occurrence of a snap-back phenomenon. Since a sufficient distance is ensured between $p^+$ type collector region 14 of the IGBT and $n^+$ type cathode region 13 of the free wheel diode, occurrence of a snap-back phenomenon is suppressed without an increase in a chip area, and an increase in manufacturing cost is also suppressed.

Since $n^+$ type cathode region 13 is formed adjacent to the end surface of semiconductor substrate 10, from the first main surface 1 toward the second main surface 2, with a depth not penetrating semiconductor substrate 10 in the thickness direction, an effective area of $p^+$ type collector region 14 of the IGBT is not decreased. Further, performance as a high voltage semiconductor device is not deteriorated.

Another Form of Embodiment 1

Referring to FIG. 2, another form of Embodiment 1 will be described. It is desirable that, in the high voltage semiconductor device of Embodiment 1 described above, a lifetime LT1 between p type base region 11 and $p^+$ type collector region 14 is different from a lifetime LT2 between p type base region 11 and $n^+$ type cathode region 13.

During the OFF operation (turning-off) of the IGBT formed within the high voltage semiconductor device, the electrons and holes accumulated in n type semiconductor substrate 10 are collected to the second main electrode 42P and the first main electrode 41, respectively, or recombine with each other and disappear, as described above in Embodiment 1.

An average time taken until when the electrons and holes recombine and disappear during the OFF operation of the IGBT is a lifetime (lifetime of the minority carriers).

To differentiate lifetime LT1 from lifetime LT2, for example, an electron beam, proton, helium, or the like may be locally applied to semiconductor substrate 10 between p type base region 11 and $n^+$ type cathode region 13 (or semiconductor substrate 10 between p type base region 11 and $p^+$ type collector region 14). Further, an electron beam, proton, helium, or the like may be applied to semiconductor substrate 10 using a mask or the like.

Due to different lifetime LT1 and lifetime LT2, characteristics of the IGBT and the free wheel diode formed within the high voltage semiconductor device can be controlled independently.

Embodiment 2

Figure 3:
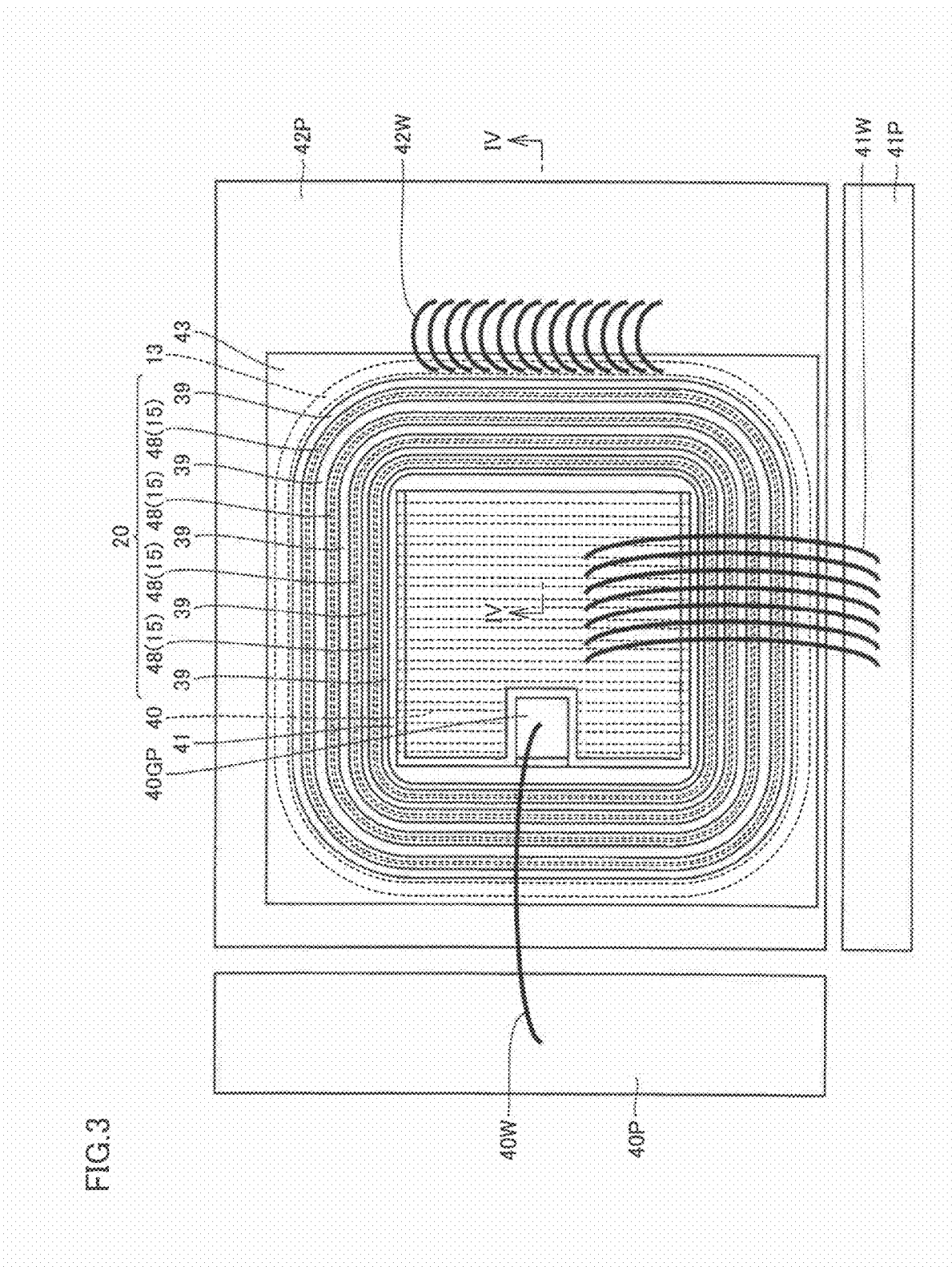
FIG. 3 is a plan view showing a high voltage semiconductor device of Embodiment 2.
Figure 4:
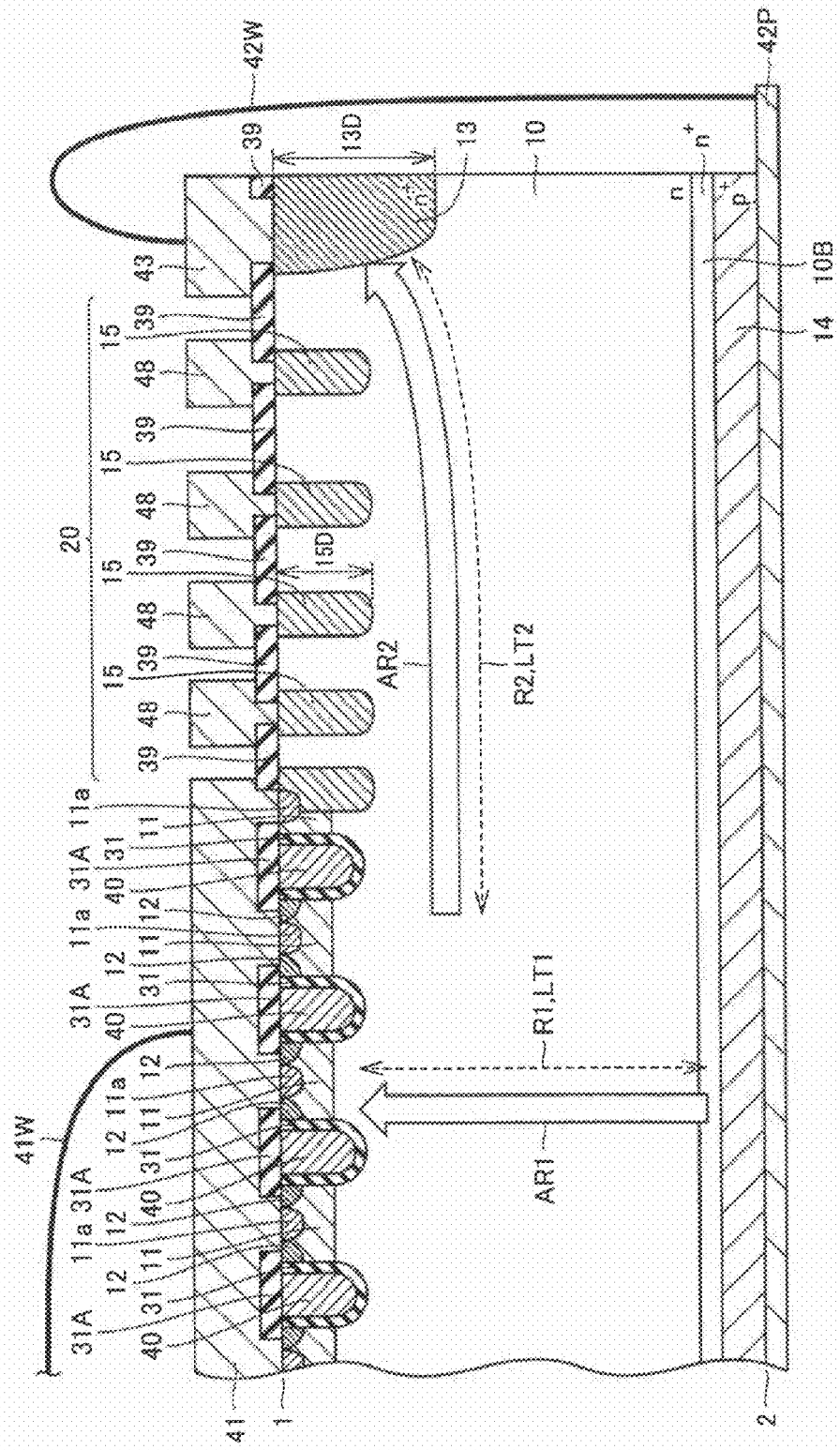
FIG. 4 is a cross sectional view along a line IV-IV in FIG. 3 seen in the direction of arrows.

Referring to FIGS. 3 and 4, Embodiment 2 according to the present invention will be described. A high voltage semiconductor device of the present embodiment is different from the high voltage semiconductor device of Embodiment 1 in configurations of electric field relaxing portion 20 and $n^+$ type cathode region 13, and other configurations are substantially the same.

Referring to FIG. 4, electric field relaxing portion 20 of the present embodiment exhibits a field contact ring structure. Specifically, electric field relaxing portion 20 exhibiting a field contact ring structure includes a plurality of relatively highly concentrated $p^+$ type regions (fifth semiconductor regions) 15.

Each $p^+$ type region 15 is formed from the first main surface 1 toward the second main surface 2 of semiconductor substrate 10, with a depth 15D. $P^+$ type regions 15 are each annularly formed inside semiconductor substrate 10, and surround the region where the IGBT is formed (see FIG. 3). $P^+$ type regions 15 are formed with a predetermined gap therebetween in the normal direction, and each $p^+$ type region 15 has a floating potential.

Conductive film 48 may be formed on a surface side of $p^+$ type region 15, with interlayer insulating film 39 interposed therebetween. Conductive film 48 is formed to extend into an opening formed in interlayer insulating film 39, and brought into contact with the surface side of $p^+$ type region 15. A plurality of conductive films 48 are annularly formed along respective $p^+$ type regions 15. By forming conductive film 48 on the surface side of $p^+$ type region 15, a depletion layer can be spread more stably. Since a potential difference between the front surface and a back surface of interlayer insulating film 39 is reduced, breakdown voltage characteristics as a high voltage semiconductor device can be further ensured.

$N^+$ type cathode region 13 of the present embodiment is formed adjacent to the end surface of semiconductor substrate 10, from the first main surface 1 toward the second main surface 2. $N^+$ type cathode region 13 is formed with a depth (13D) not penetrating semiconductor substrate 10 in the thickness direction. Depth 13D of $n^+$ type cathode region 13 of the present embodiment is set deeper than depth 15D of $p^+$ type region 15.

Since depth 13D of $n^+$ type cathode region 13 is deeper than depth 15D of $p^+$ type region 15, a path of a current flowing between $n^+$ type cathode region 13 and n type semiconductor substrate 10, and p type base region 11 and $p^+$ type region 11a as the free wheel diode is short. Therefore, according to the high voltage semiconductor device of the present embodiment, since the current path as the free wheel diode is short, performance as the free wheel diode can be improved.

As described in the other form of Embodiment 1, lifetime LT1 between p type base region 11 and $p^+$ type collector region 14 may be different from lifetime LT2 between p type base region 11 and $n^+$ type cathode region 13. Characteristics of the IGBT and the free wheel diode formed within the high voltage semiconductor device can be controlled independently.

Another Form of Embodiment 2

Figure 5:
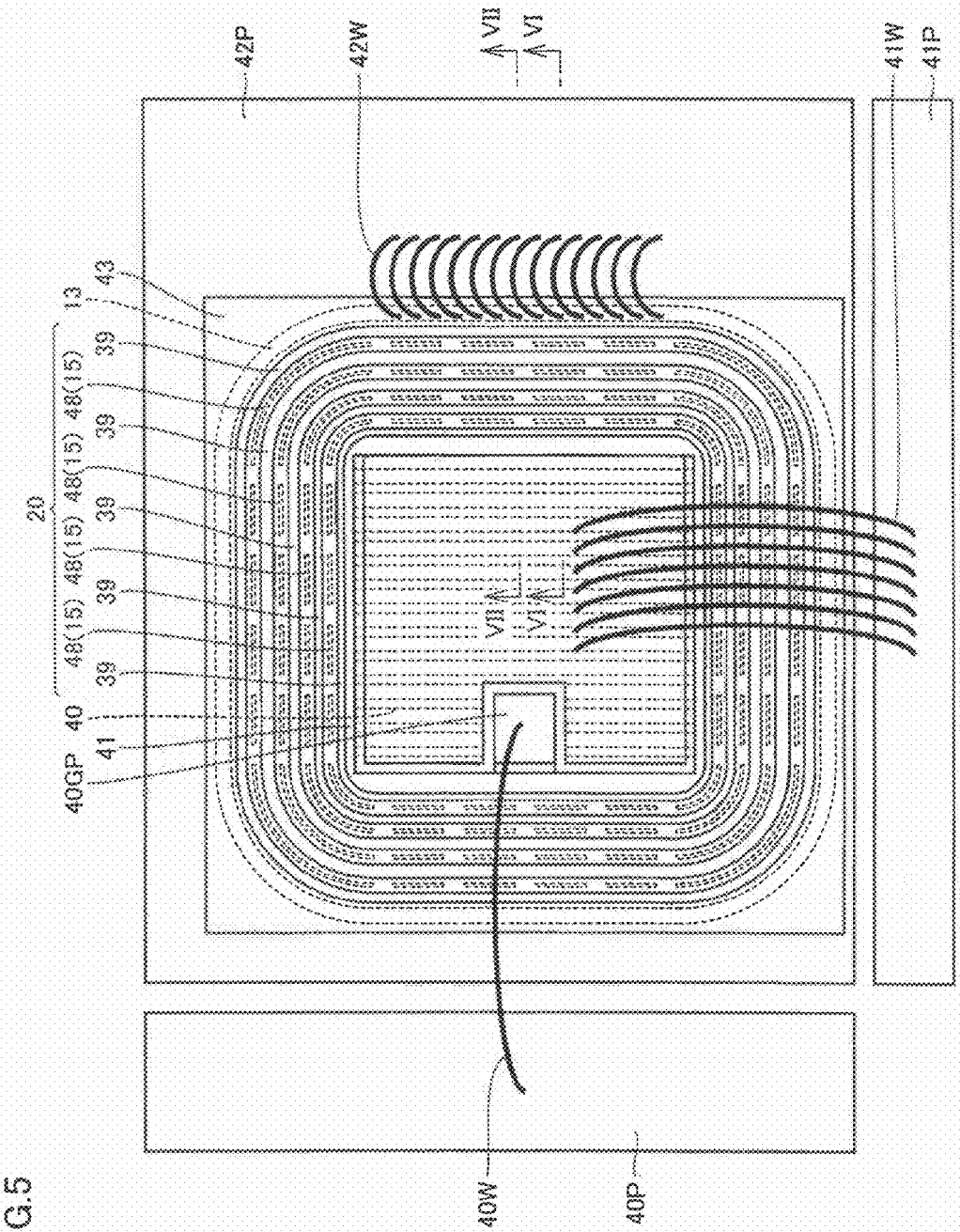
FIG. 5 is a plan view showing a high voltage semiconductor device of another form of Embodiment 2.
Figure 6:
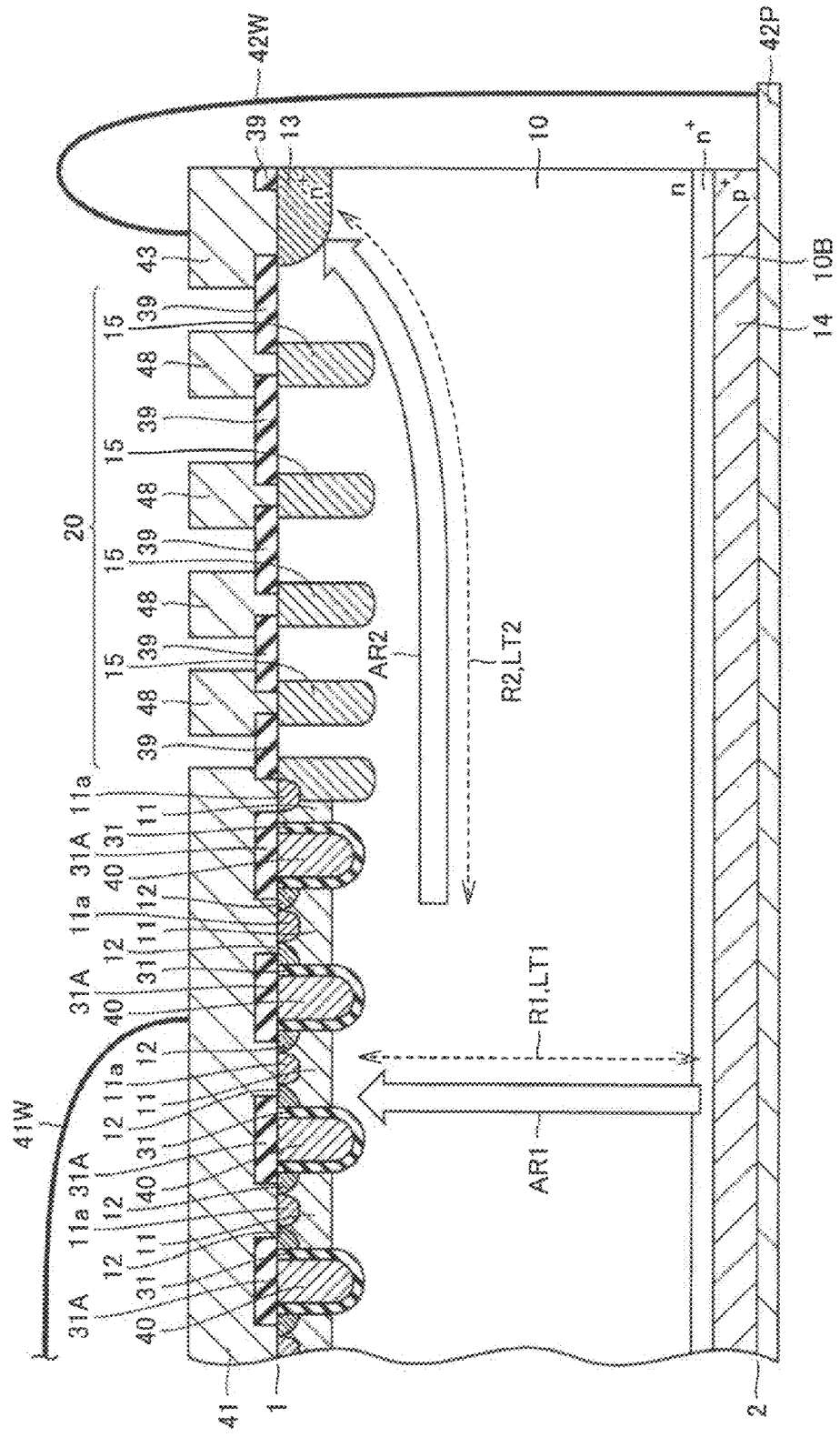
FIG. 6 is a cross sectional view along a line VI-VI in FIG. 5 seen in the direction of arrows.
Figure 7:
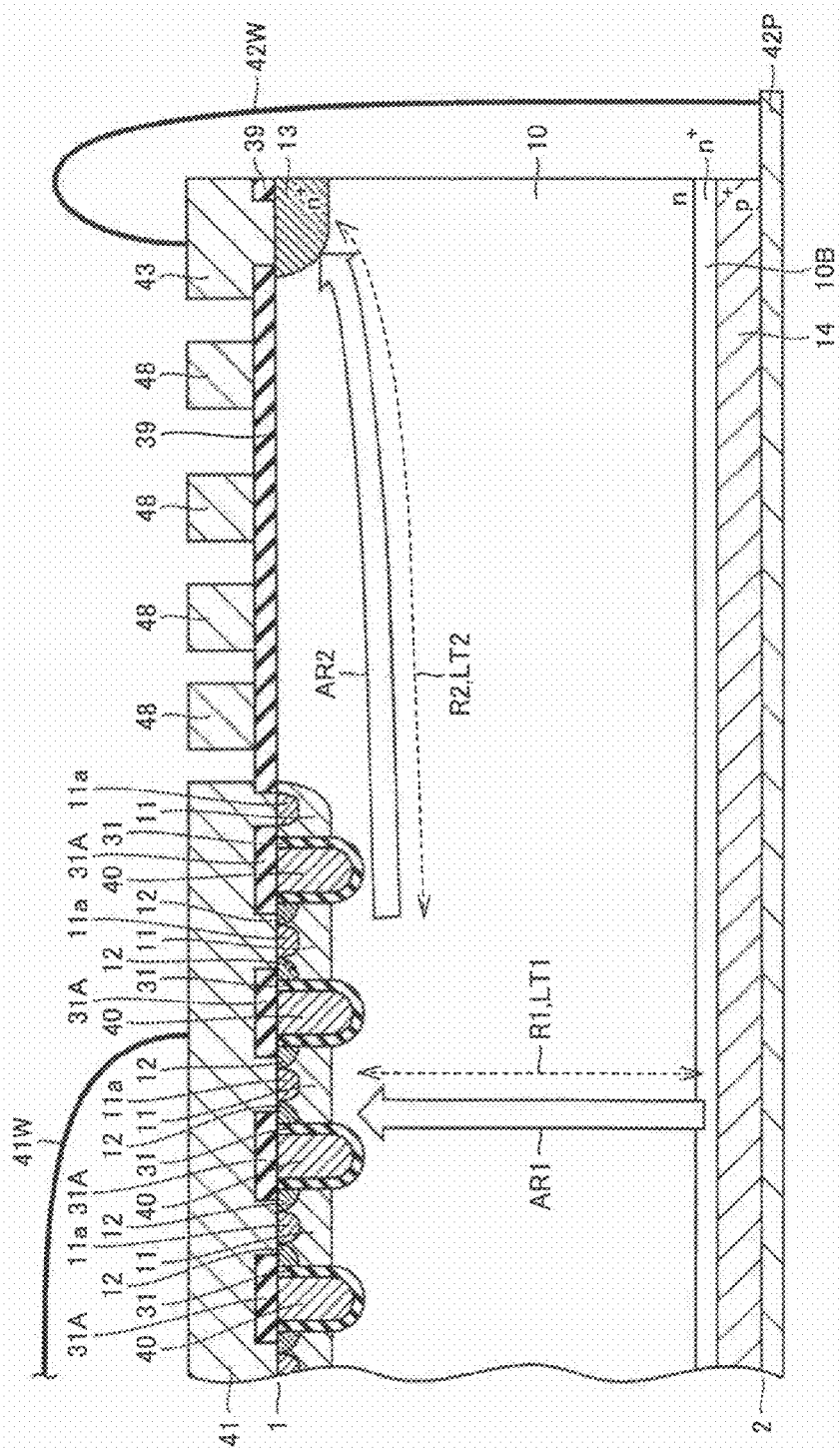
FIG. 7 is a cross sectional view along a line VII-VII in FIG. 5 seen in the direction of arrows.

Referring to FIGS. 5 to 7, another form of Embodiment 2 will be described. A high voltage semiconductor device of the other form is different from the high voltage semiconductor device of Embodiment 2 in the configurations of electric field relaxing portion 20 and $n^+$ type cathode region 13, and other configurations are substantially the same.

Referring to FIG. 6, electric field relaxing portion 20 of the present embodiment exhibits a field contact ring structure including a plurality of $p^+$ type regions 15, as in Embodiment 2.

Referring to FIG. 5, each $p^+$ type region 15 of the present embodiment is provided in the form of a dashed line in a circumferential direction surrounding the region where the IGBT is formed (p type base region 11). Namely, each p$^+$ type region 15 has a portion formed as p$^+$ type region 15 (a portion shown in FIG. 6) and a portion not formed as p$^+$ type region 15 (a portion shown in FIG. 7) in the circumferential direction.

Conductive film 48 may be formed on the surface side of each p$^+$ type region 15, as in Embodiment 2. A plurality of conductive films 48 are annularly formed along respective p$^+$ type regions 15. Although conductive film 48 may be formed in the shape of one continuous ring along both of the portion formed as p$^+$ type region 15 and the portion not formed as p$^+$ type region 15 described above, the present invention is not limited thereto. Conductive film 48 may be formed only above the portion formed as p$^+$ type region 15 described above, and provided in the form of a dashed line in the circumferential direction, as with p$^+$ type region 15 described above.

N$^+$ type cathode region 13 of the present embodiment is formed adjacent to the end surface of semiconductor substrate 10, from the first main surface 1 toward the second main surface 2. N$^+$ type cathode region 13 is formed with a depth not penetrating semiconductor substrate 10 in the thickness direction. Unlike Embodiment 2, the depth of n$^+$ type cathode region 13 of the present embodiment may be deeper than, shallower than, or identical to the depth of p$^+$ type region 15.

Since the plurality of p$^+$ type regions 15 constituting electric field relaxing portion 20 are provided in the form of dashed lines in the circumferential direction surrounding the region where the IGBT is formed (p type base region 11), a path of a current flowing between n$^+$ type cathode region 13 and n type semiconductor substrate 10, and p type base region 11 and p$^+$ type region 11a as the free wheel diode is short in the portion not formed as p$^+$ type region 15 (the portion shown in FIG. 7). According to the high voltage semiconductor device of the present embodiment, performance as the free wheel diode can be improved.

The depth of n$^+$ type cathode region 13 may be set deeper than the depth of p$^+$ type region 15, as in Embodiment 2. According to this configuration, the current path as the free wheel diode is short also in the portion formed as p$^+$ type region 15 (the portion shown in FIG. 6), and performance as the free wheel diode can be improved.

Embodiment 3

Figure 8:
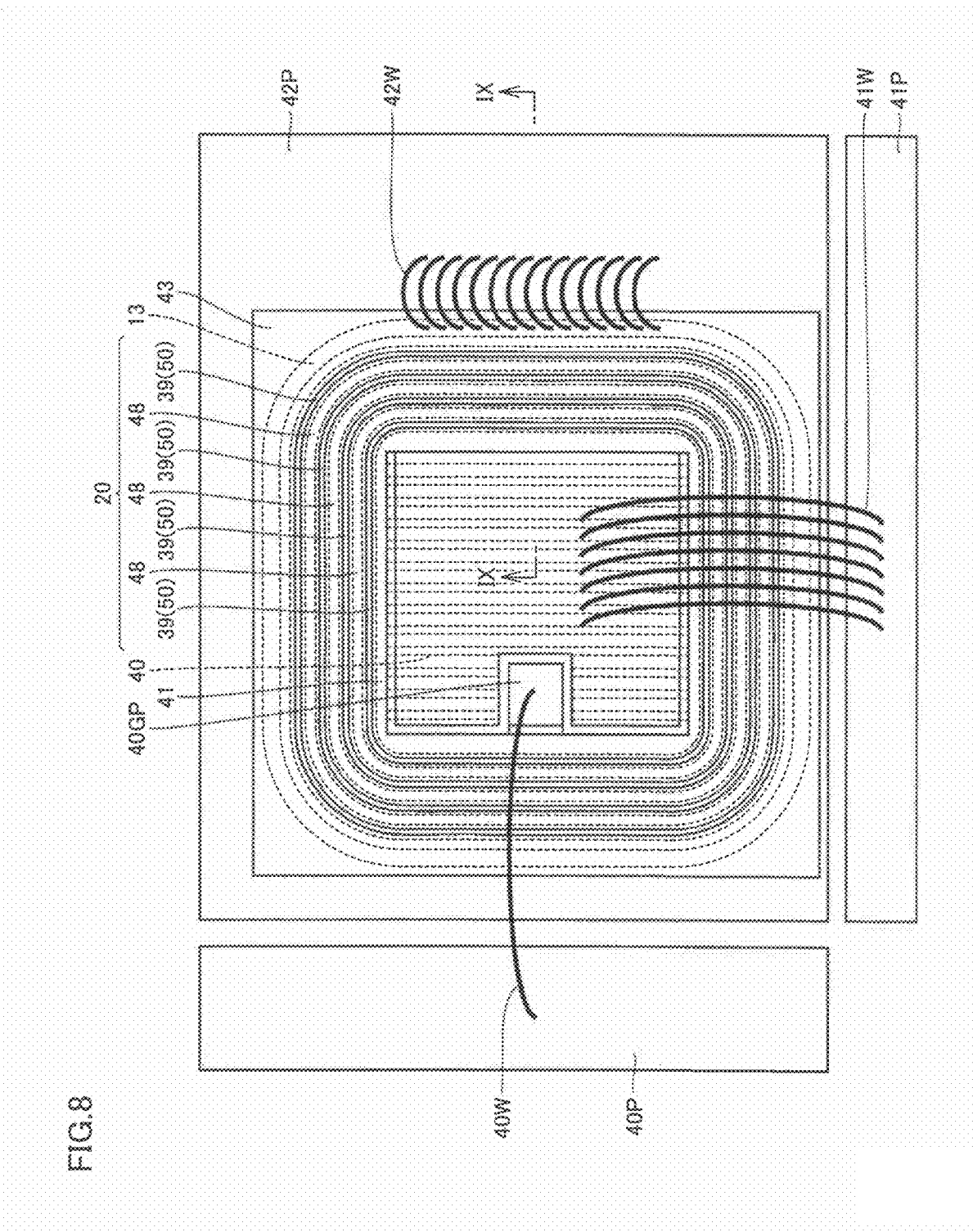
FIG. 8 is a plan view showing a high voltage semiconductor device of Embodiment 3.
Figure 9:
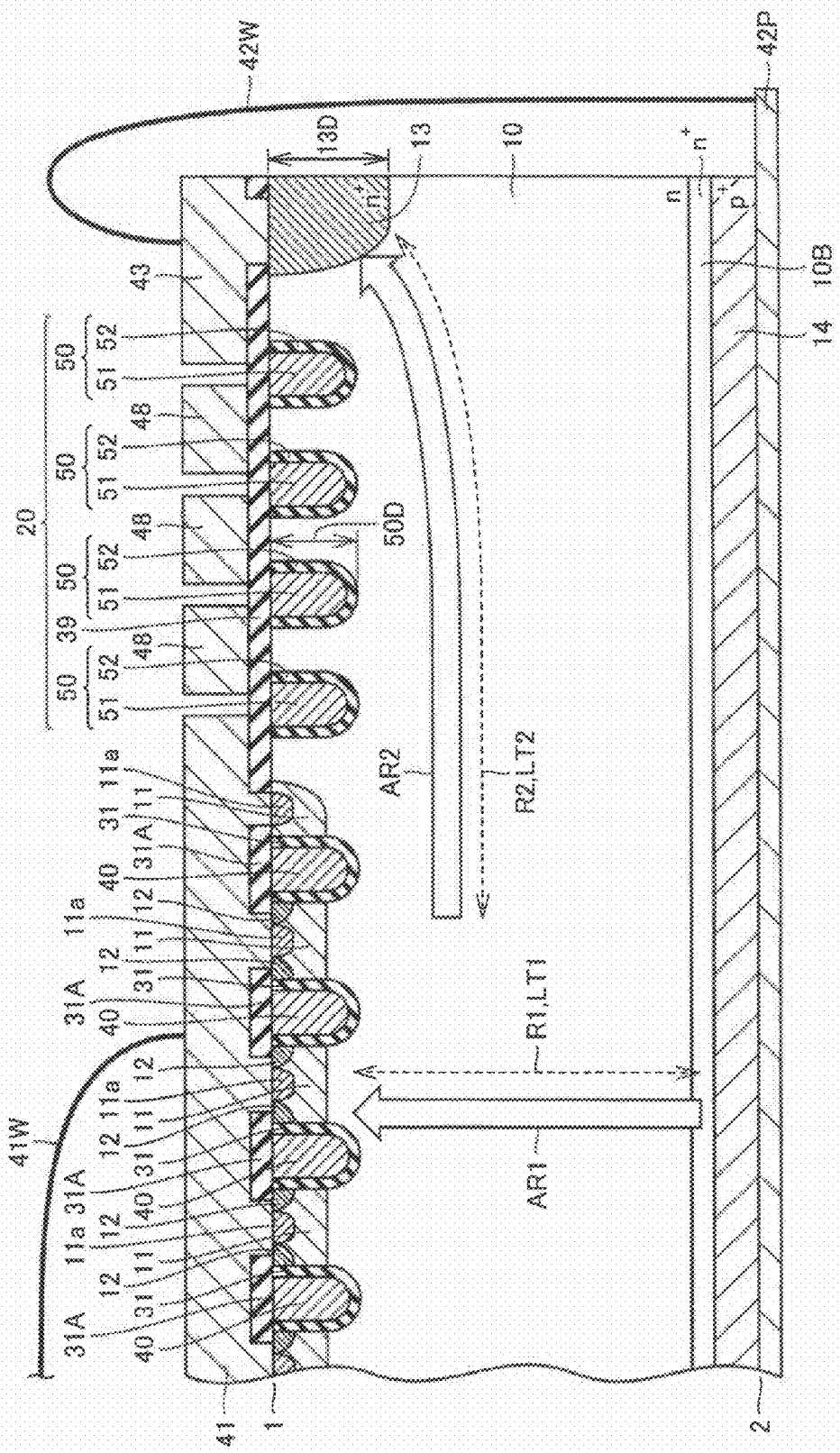
FIG. 9 is a cross sectional view along a line IX-IX in FIG. 8 seen in the direction of arrows.

Referring to FIGS. 8 and 9, Embodiment 3 according to the present invention will be described. A high voltage semiconductor device of the present embodiment is different from the high voltage semiconductor device of Embodiment 2 in the configurations of electric field relaxing portion 20 and n$^+$ type cathode region 13, and other configurations are substantially the same.

Referring to FIG. 9, electric field relaxing portion 20 of the present embodiment exhibits a trench field plate structure. Specifically, electric field relaxing portion 20 exhibiting a trench field plate structure includes a plurality of first trench regions 50.

Each first trench region 50 has a conductive layer 51 and an insulating film 52. Conductive layer 51 is formed inside a groove provided in the first main surface 1 of semiconductor substrate 10, with insulating film 52 interposed therebetween. Conductive layer 51 is surrounded by insulating film 52, and conductive layer 51 is insulated from semiconductor substrate 10 with insulating film 52.

Each first trench region 50 is formed from the first main surface 1 toward the second main surface 2 of semiconductor substrate 10, with a depth 50D. The first trench regions 50 are each annularly formed inside semiconductor substrate 10, and surround the region where the IGBT is formed (see FIG. 8). The first trench regions 50 are formed with a predetermined gap therebetween in the normal direction, and each first trench region 50 has a floating potential.

Conductive film 48 may be formed on a surface side of the first trench region 50, with interlayer insulating film 39 interposed therebetween. In this case, conductive film 48 is annularly formed on the front surface of interlayer insulating film 39 located between adjacent first trench regions 50. Conductive film 48 is formed to straddle adjacent first trench regions 50 in a planar view. Conductive films 48 are formed with a predetermined gap therebetween in the normal direction. By forming conductive film 48 on the surface side of the first trench region 50, breakdown voltage characteristics as a high voltage semiconductor device can be further ensured. Although it is shown that conductive film 48 is insulated from conductive layer 51 with interlayer insulating film 39, they may be configured such that interlayer insulating film 39 has an opening to allow conductive film 48 to come into contact with conductive layer 51 of the first trench region 50.

N$^+$ type cathode region 13 of the present embodiment is formed adjacent to the end surface of semiconductor substrate 10, from the first main surface 1 toward the second main surface 2. N$^+$ type cathode region 13 is formed with a depth (13D) not penetrating semiconductor substrate 10 in the thickness direction. Depth 13D of n$^+$ type cathode region 13 of the present embodiment is set deeper than depth 50D of the first trench region 50.

Since depth 13D of n$^+$ type cathode region 13 is deeper than depth 50D of the first trench region 50, a path of a current flowing between n$^+$ type cathode region 13 and n type semiconductor substrate 10, and p type base region 11 and p$^+$ type region 11a as the free wheel diode is short. Therefore, according to the high voltage semiconductor device of the present embodiment, since the current path as the free wheel diode is short, performance as the free wheel diode can be improved.

As described in the other form of Embodiment 1, lifetime LT1 between p type base region 11 and p$^+$ type collector region 14 may be different from lifetime LT2 between p type base region 11 and n$^+$ type cathode region 13. Characteristics of the IGBT and the free wheel diode formed within the high voltage semiconductor device can be controlled independently.

Another Form of Embodiment 3

Figure 10:
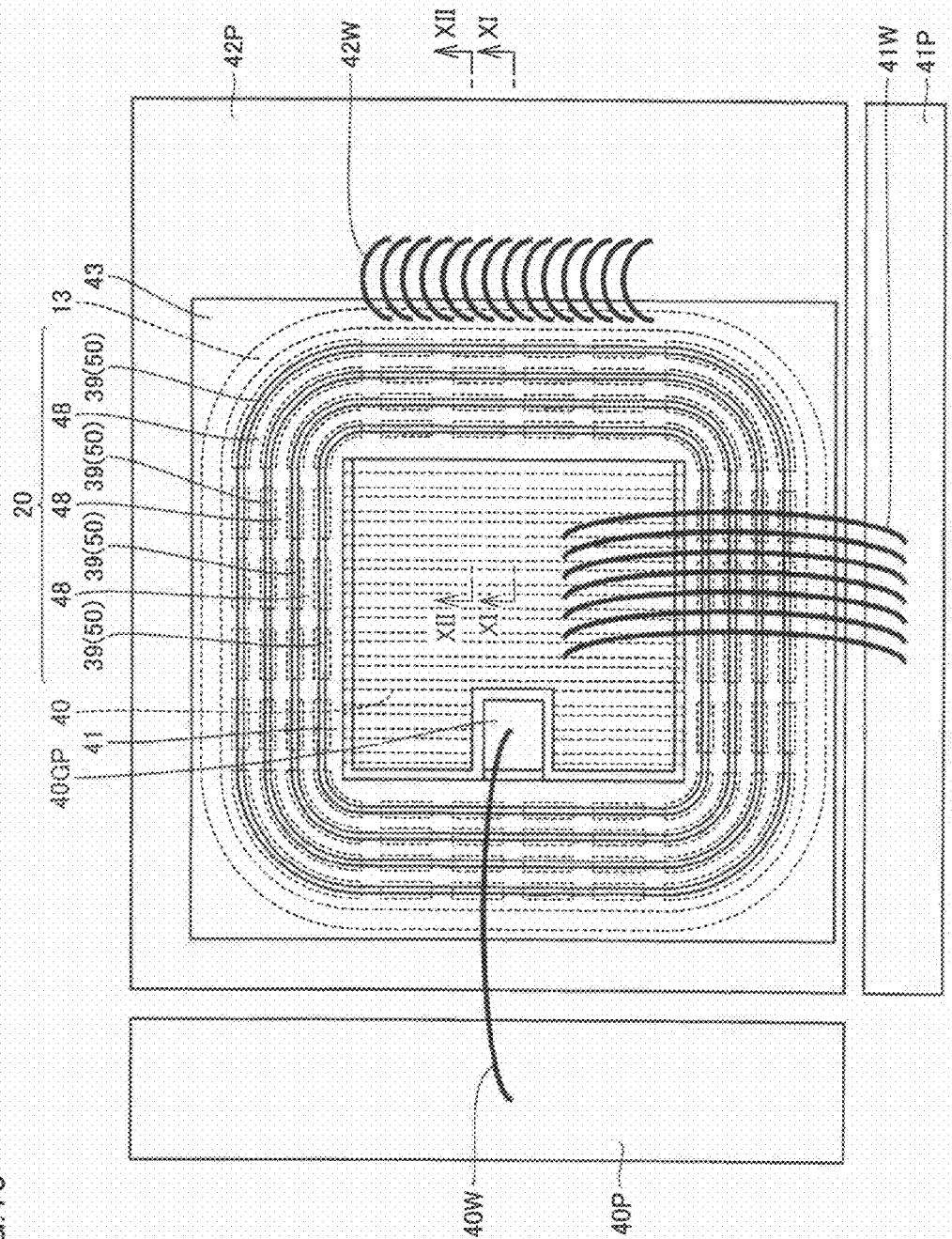
FIG. 10 is a plan view showing a high voltage semiconductor device of another form of Embodiment 3.
Figure 11:
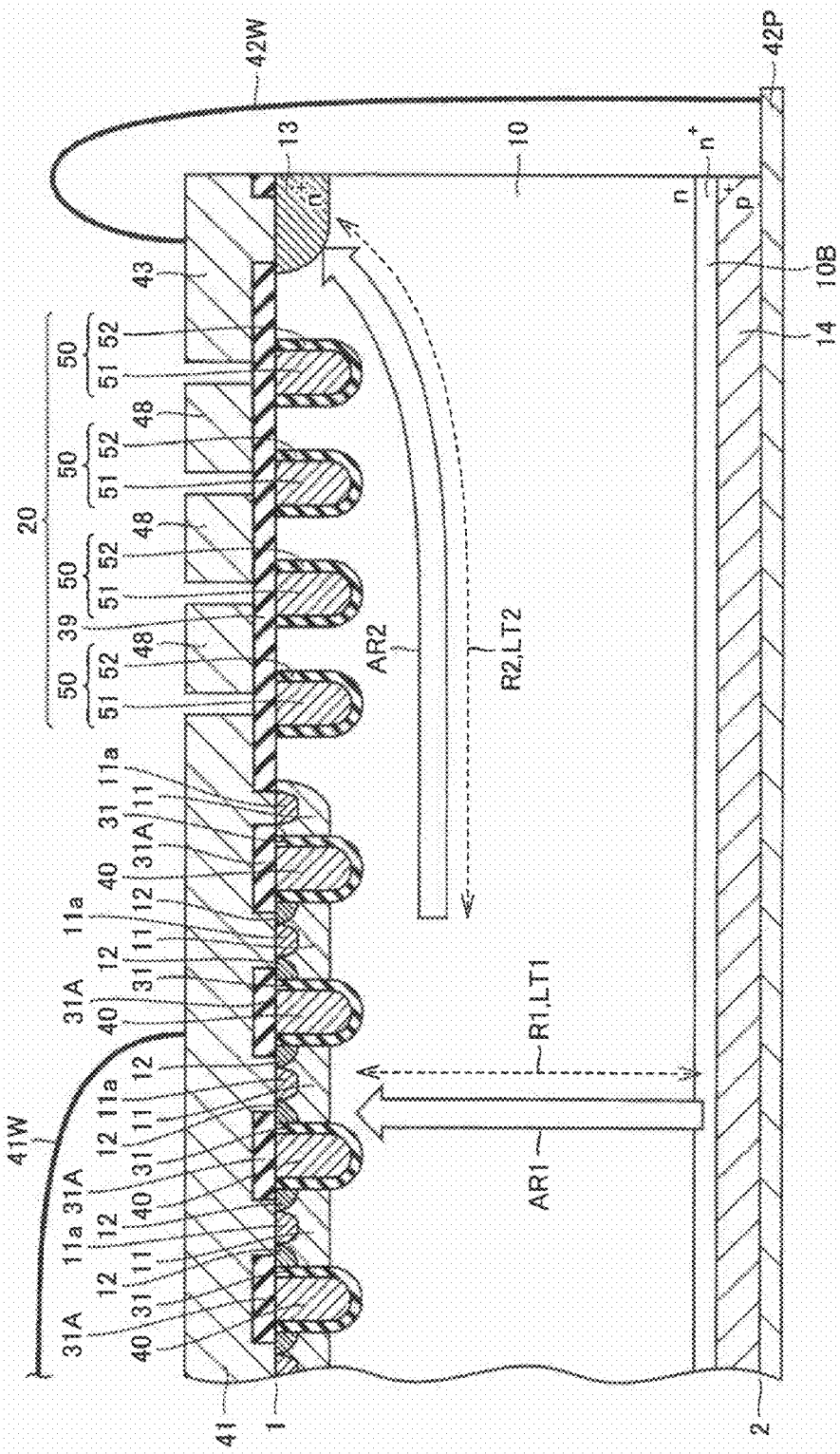
FIG. 11 is a cross sectional view along a line XI-XI in FIG. 10 seen in the direction of arrows.
Figure 12:
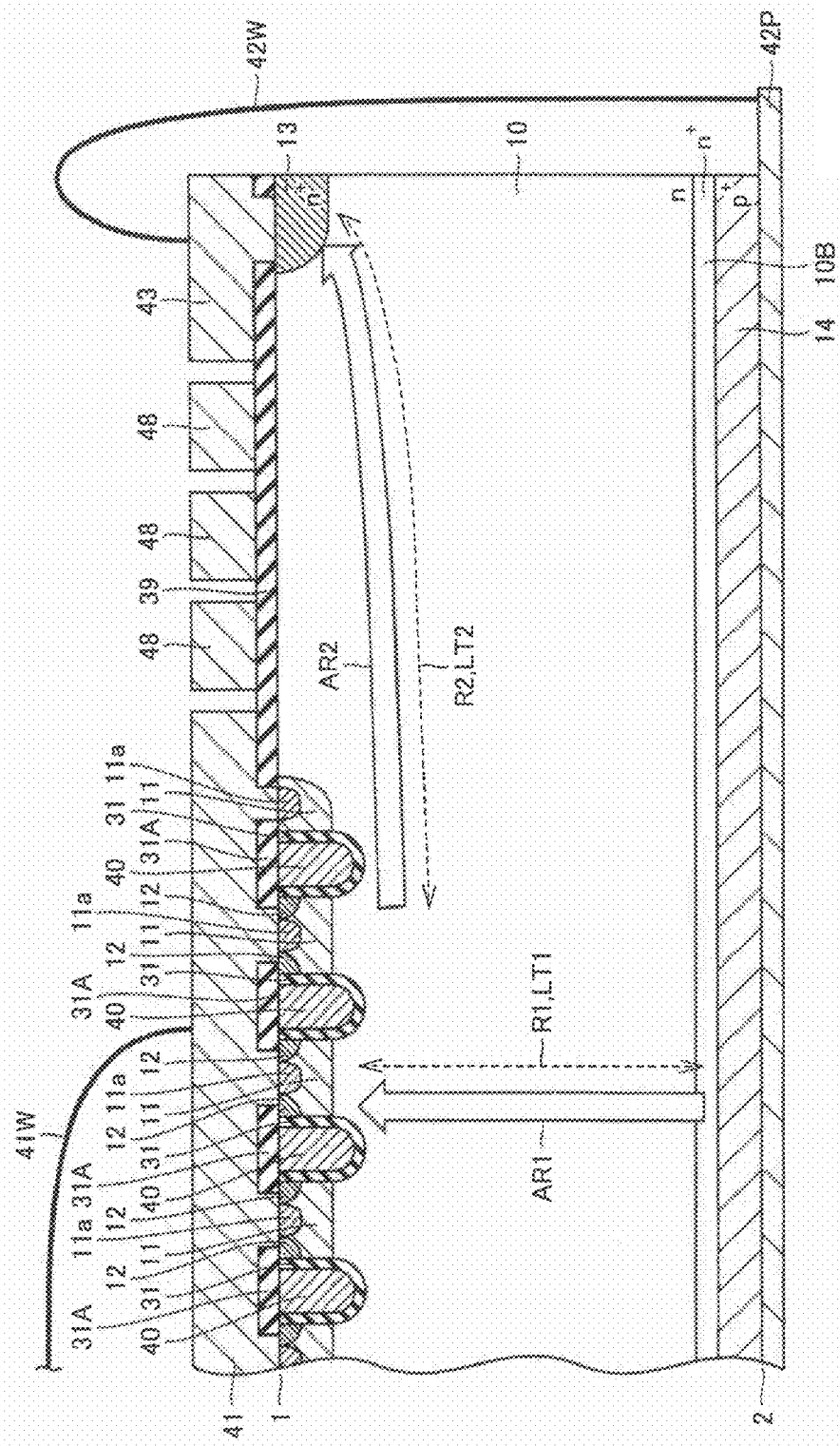
FIG. 12 is a cross sectional view along a line XII-XII in FIG. 10 seen in the direction of arrows.

Referring to FIGS. 10 to 12, another form of Embodiment 3 will be described. A high voltage semiconductor device of the other form is different from the high voltage semiconductor device of Embodiment 3 in the configurations of electric field relaxing portion 20 and n$^+$ type cathode region 13, and other configurations are substantially the same.

Referring to FIG. 11, electric field relaxing portion 20 of the present embodiment exhibits a trench field plate structure including a plurality of first trench regions 50, as in Embodiment 3.

Referring to FIG. 10, each first trench region 50 of the present embodiment is provided in the form of a dashed line in the circumferential direction surrounding the region where the IGBT is formed (p type base region 11). Namely, each first trench region 50 has a portion formed as the first trench region 50 (a portion shown in FIG. 11) and a portion not formed as the first trench region 50 (a portion shown in FIG. 12) in the circumferential direction.

Conductive film 48 may be formed on the surface side of each first trench region 50, with interlayer insulating film 39 interposed therebetween, as in Embodiment 3. A plurality of conductive films 48 are annularly formed along respective first trench region 50. Although conductive film 48 may be formed in the shape of one continuous ring along both of the portion formed as the first trench region 50 and the portion not formed as the first trench region 50 described above, the present invention is not limited thereto. Conductive film 48 may be formed only above the portion formed as the first trench region 50 described above, and provided in the form of a dashed line in the circumferential direction, as with the first trench region 50 described above.

N$^+$ type cathode region 13 of the present embodiment is formed adjacent to the end surface of semiconductor substrate 10, from the first main surface 1 toward the second main surface 2. N$^+$ type cathode region 13 is formed with a depth not penetrating semiconductor substrate 10 in the thickness direction. Unlike Embodiment 3, the depth of n$^+$ type cathode region 13 of the present embodiment may be deeper than, shallower than, or identical to the depth of the first trench region 50.

Since the plurality of first trench regions 50 constituting electric field relaxing portion 20 are provided in the form of dashed lines in the circumferential direction surrounding the region where the IGBT is formed (p type base region 11), a path of a current flowing between n$^+$ type cathode region 13 and n type semiconductor substrate 10, and p type base region 11 and p$^+$ type region 11a as the free wheel diode is short in the portion not formed as the first trench region 50 (the portion shown in FIG. 12). According to the high voltage semiconductor device of the present embodiment, performance as the free wheel diode can be improved.

The depth of n$^+$ type cathode region 13 may be set deeper than the depth of the first trench region 50, as in Embodiment 3. According to this configuration, the current path as the free wheel diode is short also in the portion formed as the first trench region 50 (the portion shown in FIG. 11), and performance as the free wheel diode can be improved.

Embodiment 4

Figure 13:
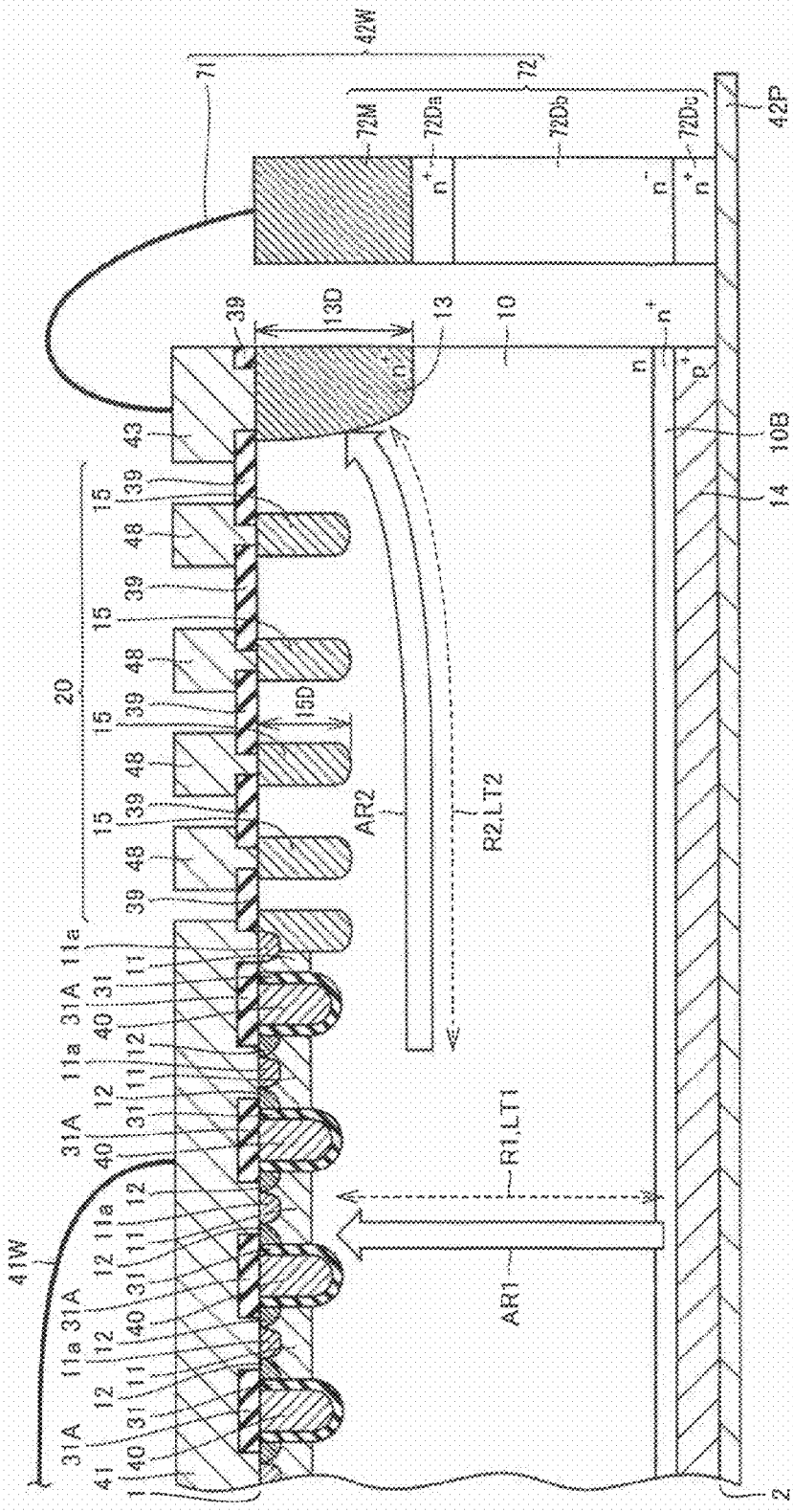
FIG. 13 is a cross sectional view showing a high voltage semiconductor device of Embodiment 4.

Referring to FIG. 13, Embodiment 4 according to the present invention will be described. A high voltage semiconductor device of the present embodiment is different from the high voltage semiconductor device of Embodiment 2 in connection portion 42W, and other configurations are substantially the same. FIG. 13 corresponds to FIG. 4 in Embodiment 2.

Connection portion 42W of the present embodiment includes a conductive wire 71 and a resistor 72 formed on a surface of the second main electrode 42P. Resistor 72 is configured by sequentially stacking a conductive film 72M, a relatively highly concentrated n$^+$ type region 72Da, a relatively low concentrated n$^-$ type region 72Db, and a relatively highly concentrated n$^+$ type region 72Dc. Conductive film 72M, n$^+$ type region 72Da, n$^-$ type region 72Db, and n$^+$ type region 72Dc are electrically conducted with each other.

Conductive wire 71 has one end connected to the third main electrode 43, and the other end connected to a surface of conductive film 72M of resistor 72. N$^+$ type region 72Dc of resistor 72 is in contact with the surface of the second main electrode 42P. Thus, the second main electrode 42P and the third main electrode 43 are electrically connected by connection portion 42W.

Since connection portion 42W electrically connecting the second main electrode 42P and the third main electrode 43 includes resistor 72, a resistance on a cathode side of the free wheel diode is increased. According to the high voltage semiconductor device of the present embodiment, occurrence of a snap-back phenomenon can be further suppressed.

Although the description has been given based on a configuration that the configuration of connection portion 42W of the present embodiment is applied to the high voltage semiconductor device of Embodiment 2, the present invention is not limited thereto. The configuration of connection portion 42W of the present embodiment can also be applied to the high voltage semiconductor device of Embodiment 1 or 3.

Another Form of Embodiment 4

Figure 14:
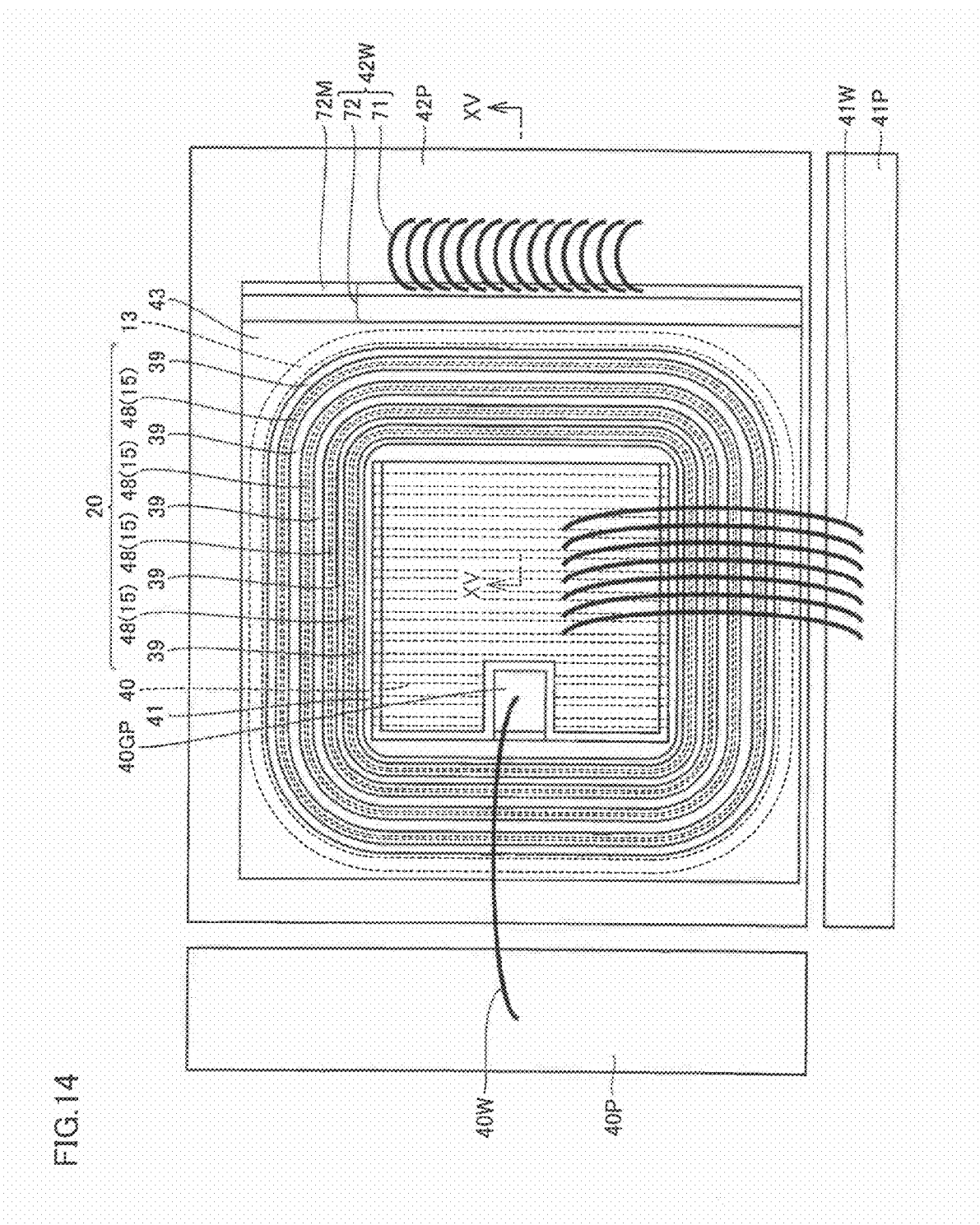
FIG. 14 is a plan view showing a high voltage semiconductor device of another form of Embodiment 4.
Figure 15:
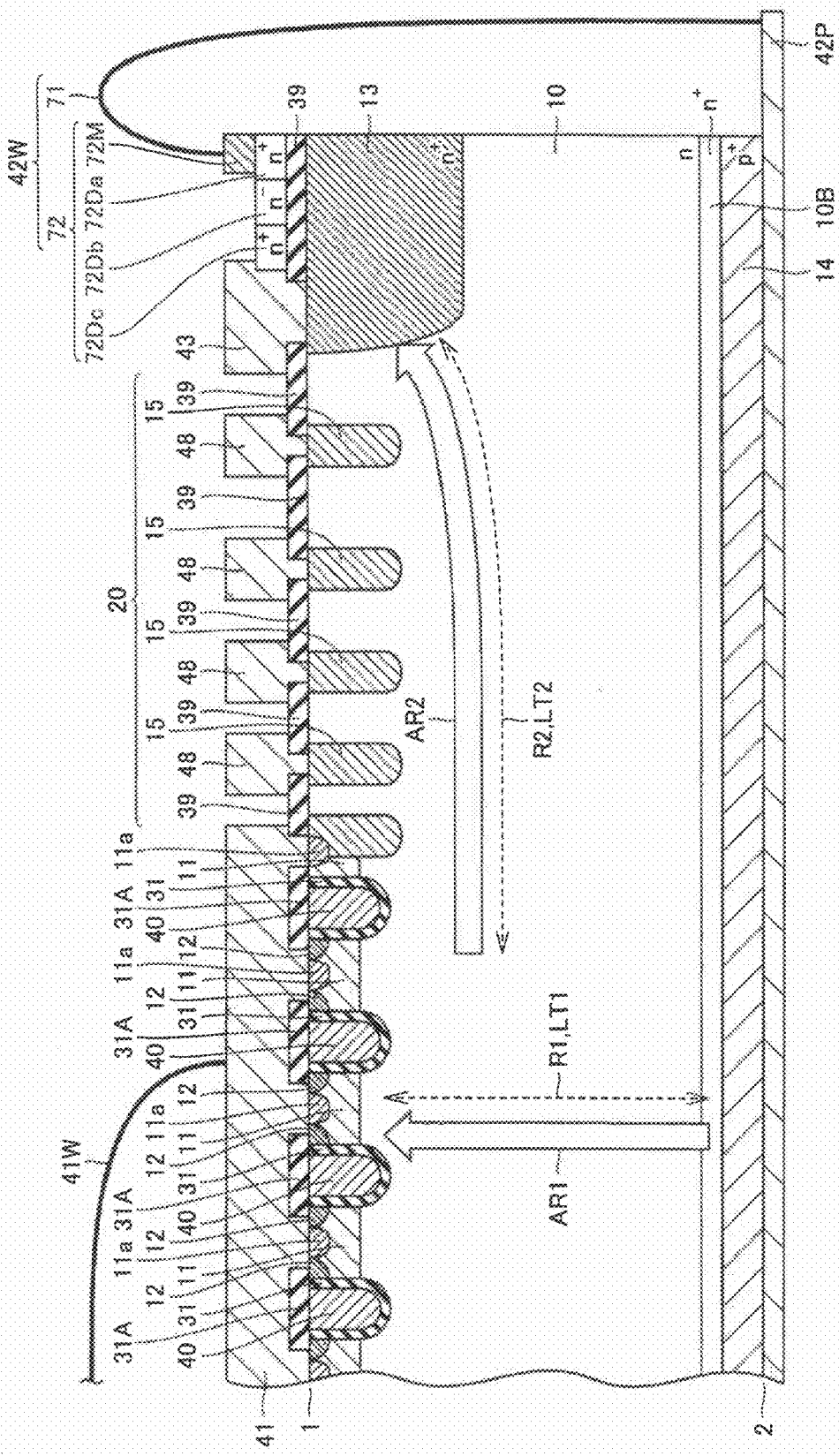
FIG. 15 is a cross sectional view along a line XV-XV in FIG. 14 seen in the direction of arrows.

Referring to FIGS. 14 and 15, another form of Embodiment 4 will be described. A high voltage semiconductor device of the other form is different from the high voltage semiconductor device of Embodiment 4 in the configuration of connection portion 42W, and other configurations are substantially the same.

Referring to FIG. 15, resistor 72 of the present embodiment is formed on the first main surface 1 of semiconductor substrate 10, with interlayer insulating film 39 sandwiched therebetween. Resistor 72 is located on a side opposite to n$^+$ type cathode region 13 with interlayer insulating film 39 sandwiched therebetween.

The third main electrode 43 and n$^+$ type region 72Dc are formed in contact. Conductive wire 71 has one end in contact with a surface of conductive film 72M, and the other end connected to the second main electrode 42P. Thus, the second main electrode 42P and the third main electrode 43 are electrically connected by connection portion 42W.

According to the high voltage semiconductor device of the present embodiment, by forming resistor 72 on the first main surface 1 of semiconductor substrate 10 (with interlayer insulating film 39 sandwiched therebetween), the size of the high voltage semiconductor device as an entire system can be reduced.

Embodiment 5

Figure 16:
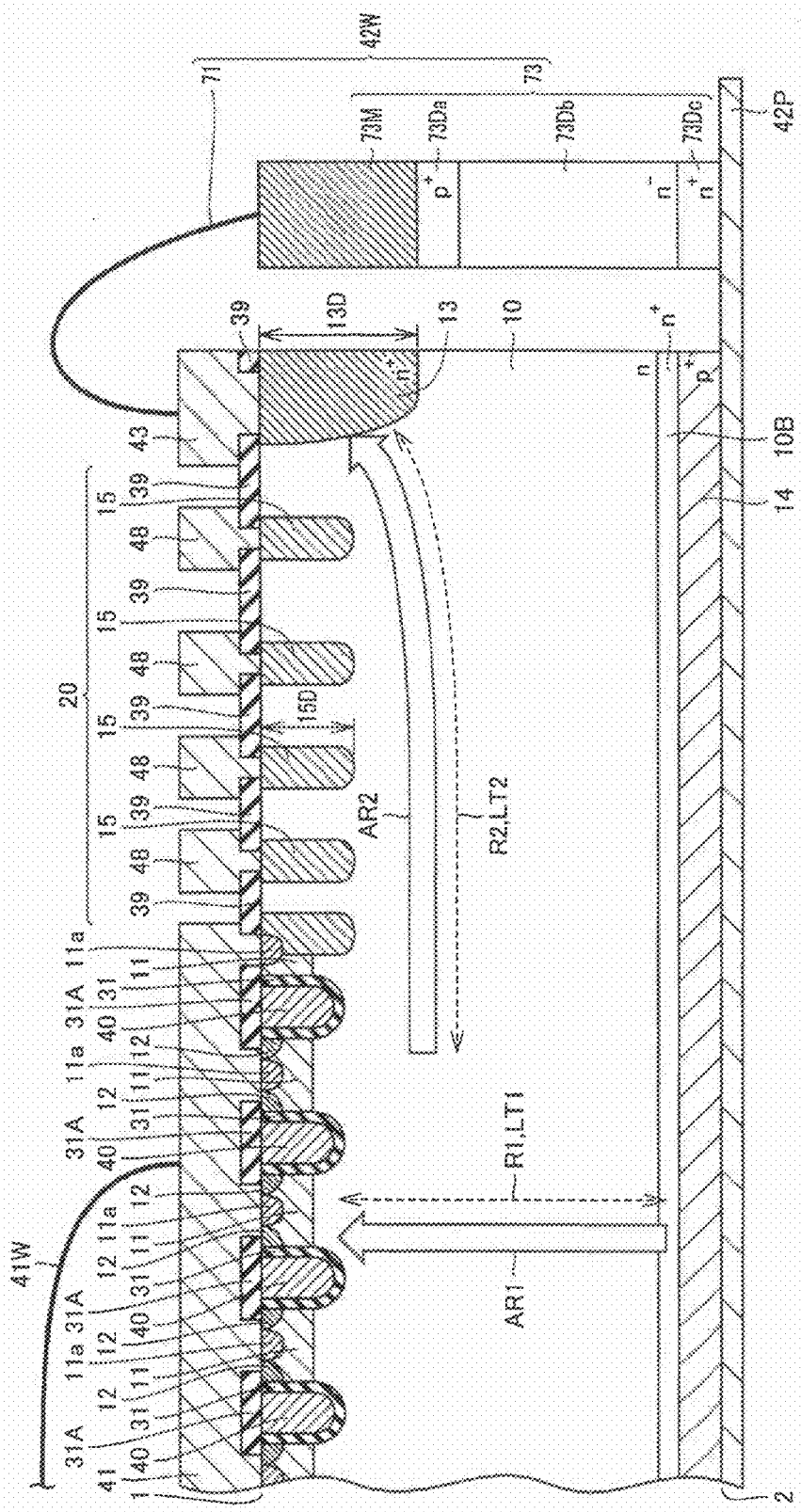
FIG. 16 is a cross sectional view showing a high voltage semiconductor device of Embodiment 5.

Referring to FIG. 16, Embodiment 5 according to the present invention will be described. A high voltage semiconductor device of the present embodiment is different from the high voltage semiconductor device of Embodiment 2 in connection portion 42W, and other configurations are substantially the same. FIG. 16 corresponds to FIG. 4 in Embodiment 2.

Connection portion 42W of the present embodiment includes conductive wire 71 and a diode 73 formed on a surface of the second main electrode 42P. Diode 73 is configured by sequentially stacking a conductive film 73M, a relatively highly concentrated p$^+$ type region 73Da, a relatively low concentrated n$^-$ type region 73Db, and a relatively highly concentrated n$^+$ type region 73Dc. Conductive film 73M, p$^+$ type region 73Da, n$^-$ type region 73Db, and n$^+$ type region 73Dc are electrically conducted with each other.

Conductive wire 71 has one end connected to the third main electrode 43, and the other end connected to a surface of conductive film 73M of diode 73. N$^+$ type region 73Dc of diode 73 is in contact with the surface of the second main electrode 42P. Thus, the second main electrode 42P and the third main electrode 43 are electrically connected by connection portion 42W.

Since connection portion 42W electrically connecting the second main electrode 42P and the third main electrode 43 includes diode 73, a resistance on a cathode side of the free wheel diode is increased. According to the high voltage semiconductor device of the present embodiment, occurrence of a snap-back phenomenon can be further suppressed.

Although the description has been given based on a configuration that the configuration of connection portion 42W of the present embodiment is applied to the high voltage semiconductor device of Embodiment 2, the present invention is not limited thereto. The configuration of connection portion 42W of the present embodiment can also be applied to the high voltage semiconductor device of Embodiment 1 or 3.

Another Form of Embodiment 5

Figure 17:
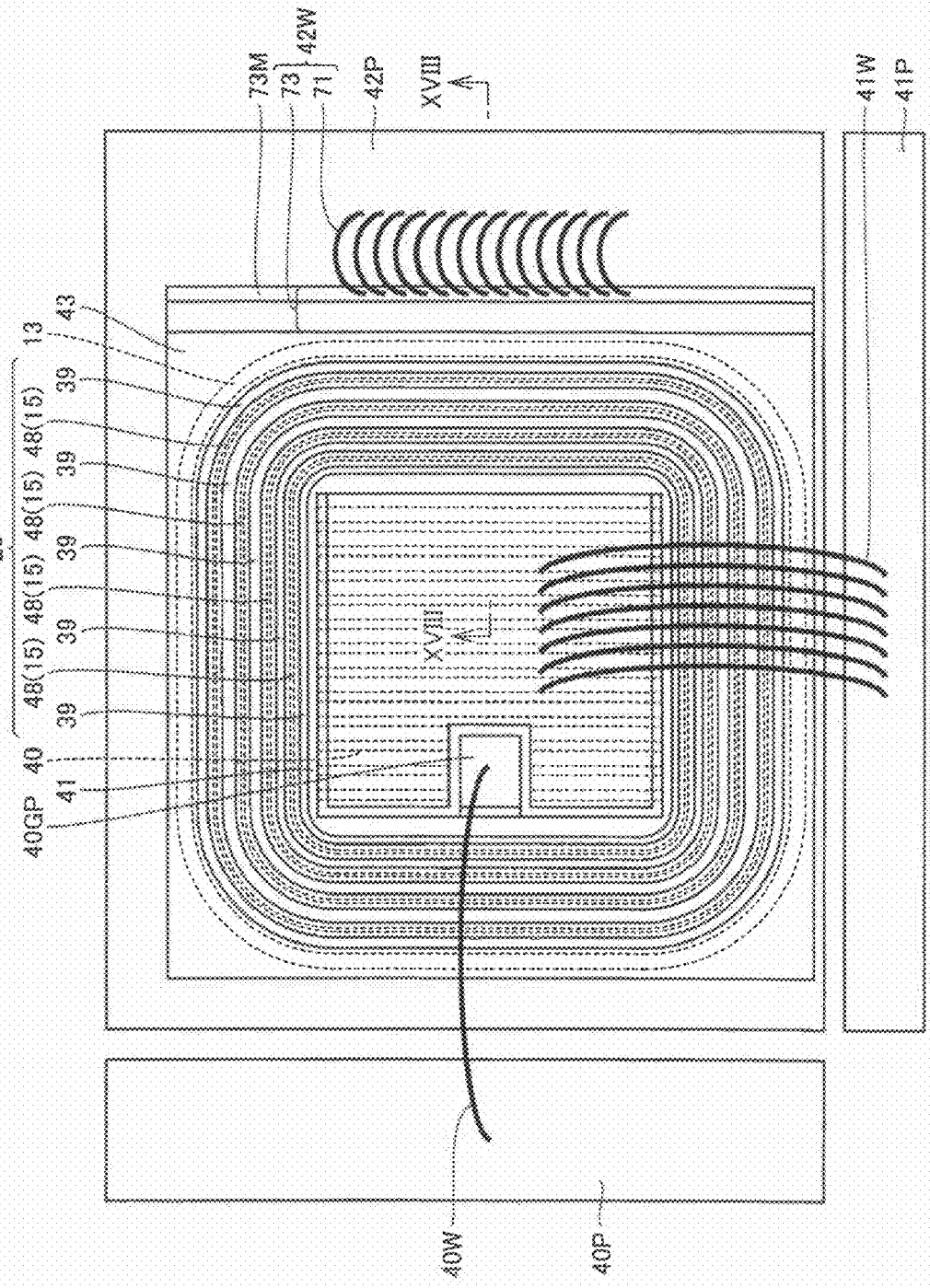
FIG. 17 is a cross sectional view showing a high voltage semiconductor device of another form of Embodiment 5.
Figure 18:
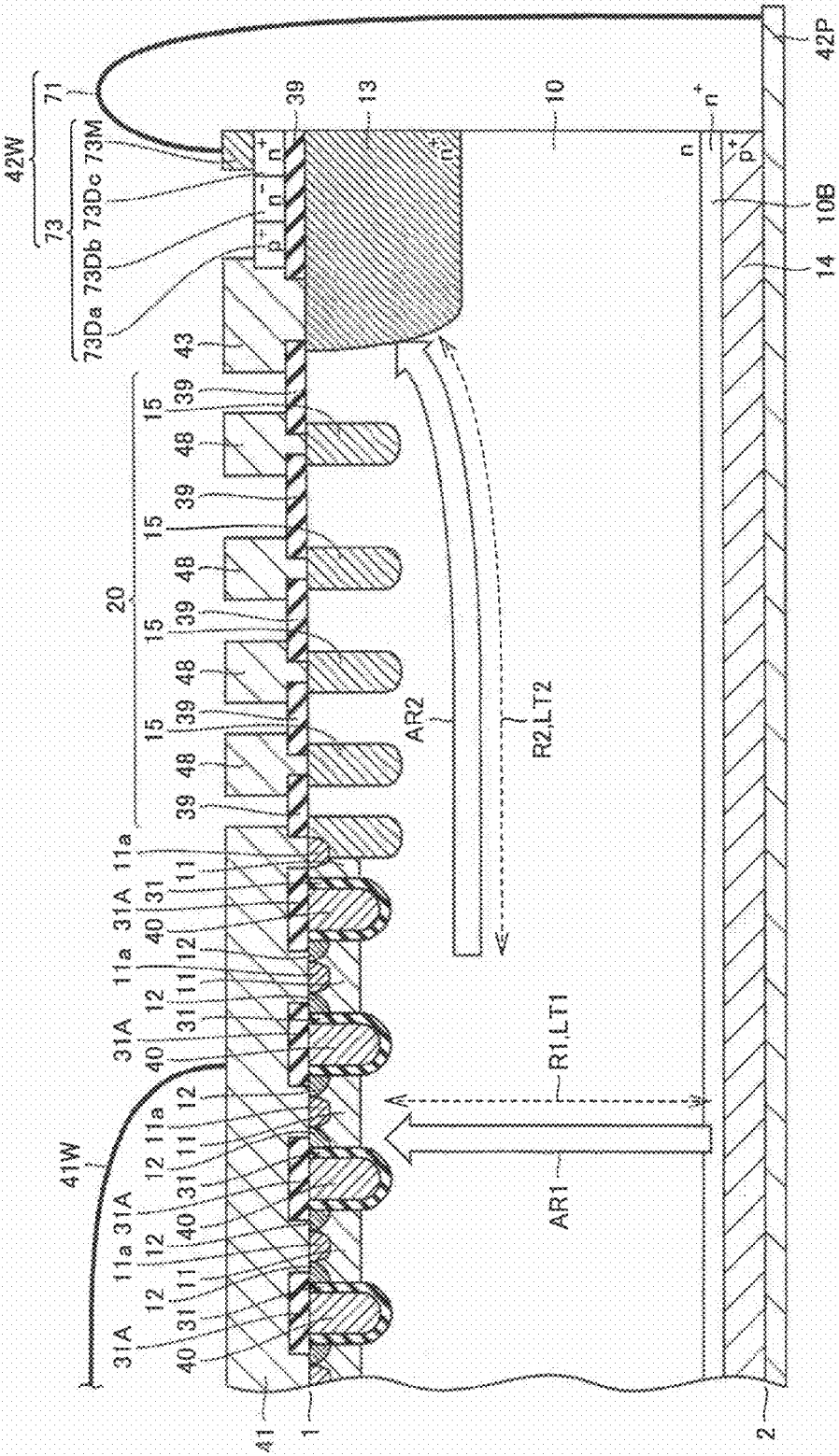
FIG. 18 is a cross sectional view along a line XVIII-XVIII in FIG. 17 seen in the direction of arrows.

Referring to FIGS. 17 and 18, another form of Embodiment 5 will be described. A high voltage semiconductor device of the other form is different from the high voltage semiconductor device of Embodiment 5 in the configuration of connection portion 42W, and other configurations are substantially the same.

Referring to FIG. 18, diode 73 of the present embodiment is formed on the first main surface 1 of semiconductor substrate 10, with interlayer insulating film 39 sandwiched therebetween. Diode 73 is located on a side opposite to n$^+$ type cathode region 13 with interlayer insulating film 39 sandwiched therebetween.

The third main electrode 43 and p$^+$ type region 73Da are formed in contact. Conductive wire 71 has one end in contact with a surface of conductive film 73M, and the other end connected to the second main electrode 42P. Thus, the second main electrode 42P and the third main electrode 43 are electrically connected by connection portion 42W.

According to the high voltage semiconductor device of the present embodiment, by forming diode 73 on the first main surface 1 of semiconductor substrate 10 (with interlayer insulating film 39 sandwiched therebetween), the size of the high voltage semiconductor device as an entire system can be reduced.

Embodiment 6

Figure 19:
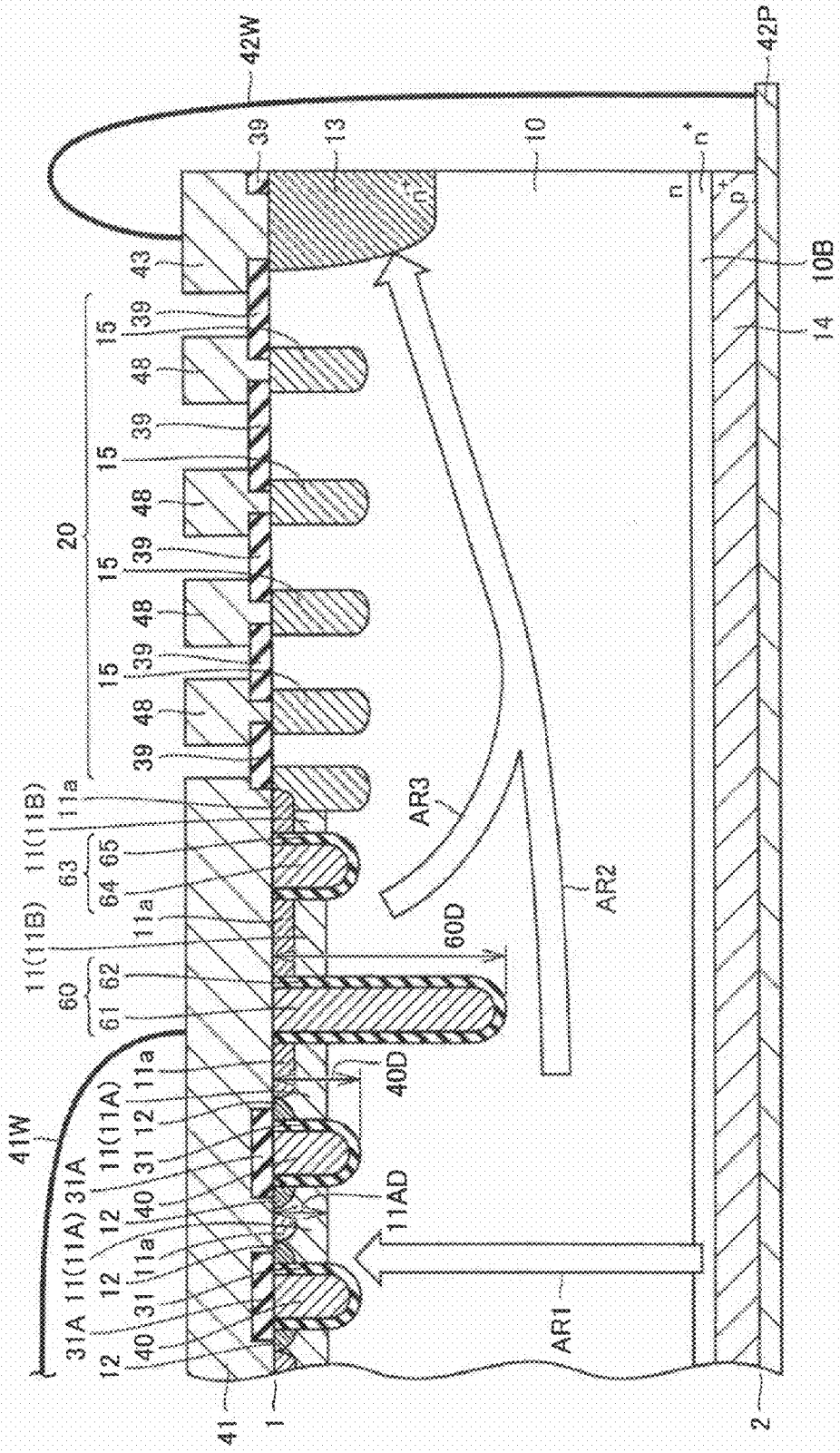
FIG. 19 is a cross sectional view showing a high voltage semiconductor device of Embodiment 6.

Referring to FIG. 19, Embodiment 6 according to the present invention will be described. A high voltage semiconductor device of the present embodiment is different from the high voltage semiconductor device of Embodiment 2 in that the former further includes a second trench region 60, and other configurations are substantially the same. FIG. 19 corresponds to FIG. 4 in Embodiment 2.

The second trench region 60 of the present embodiment has a conductive layer 61 and an insulating film 62. Conductive layer 61 is formed inside a groove provided in the first main surface 1 of semiconductor substrate 10, with insulating film 62 interposed therebetween. Conductive layer 61 is surrounded by insulating film 62, and conductive layer 61 is insulated from semiconductor substrate 10 and p type base region 11 with insulating film 62. It is desirable to set the thickness of insulating film 62 constituting the second trench region 60 to be relatively thick. A p type base region 11A including the channel region (details of which will be described below) is less likely to be inverted as a channel, and occurrence of a snap-back phenomenon can be further suppressed.

The second trench region 60 is formed from the first main surface 1 of semiconductor substrate 10 to penetrate p type base region 11 in the thickness direction of semiconductor substrate 10. By penetrating p type base region 11, the second trench region 60 is formed at a position where both sides of the second trench region 60 are sandwiched by p type base region 11 (11A, 11B) in the first main surface 1.

As described above, the channel region is formed at a portion of p type base region 11 sandwiched between semiconductor substrate 10 and n$^+$ type emitter region 12 that faces gate electrode 40 with insulating film 31 interposed therebetween. In the high voltage semiconductor device of the present embodiment (and Embodiments 1 to 5), since a plurality of gate electrodes 40, a plurality of p type base regions 11, and a plurality of n$^+$ type emitter regions 12 are formed inside semiconductor substrate 10, a plurality of the channel regions are formed.

The second trench region 60 is located on a side closer to n$^+$ type cathode region 13 than a region where the plurality of channel regions are formed. The second trench region 60 divides p type base region 11 penetrated by the second trench region 60 into p type base region 11A including the channel region and a p type base region 11B not including the channel region. P type base region 11A and p type base region 11B are electrically connected by the first main electrode 41, with being divided by the second trench region 60.

P type base region 11A and p type base region 11B may be electrically connected by another connection portion such as another resistor, with being divided by the second trench region 60. In addition to the configuration that the second trench region 60 is disposed on the side closer to n$^+$ type cathode region 13 than the region where the plurality of channel regions are formed, a plurality of the second trench regions 60 may be formed in parallel to gate electrodes 40 and on both sides of gate electrodes 40. In addition to the configuration that the second trench region 60 is disposed on the side closer to n$^+$ type cathode region 13 than the region where the plurality of channel regions are formed, each second trench region 60 may be formed in parallel to gate electrodes 40 and on either side of all gate electrodes 40.

A third trench region 63 may be further formed in p type base region 11B not including the channel region. The third trench region 63 has a conductive layer 64 and an insulating film 65. Conductive layer 64 is formed inside a groove provided in the first main surface 1 of semiconductor substrate 10, with insulating film 65 interposed therebetween. Conductive layer 64 is surrounded by insulating film 65, and conductive layer 64 is insulated from semiconductor substrate 10 and p type base region 11B with insulating film 65.

It is desirable that an impurity concentration of p type base region 11A including the channel region is set lower than an impurity concentration of p type base region 11B not including the channel region. Even when an anode potential of the free wheel diode is increased, p type base region 11B not including the channel region is not inverted as a channel by a potential of the second trench region 60, and thus occurrence of a snap-back phenomenon can be further suppressed.

A depth 60D of the second trench region 60 is formed to extend deeper than a depth 11AD of p type base region 11 so as to penetrate at least p type base region 11.

Gate electrode 40 and insulating film 31 of the present embodiment constitute a trench electrode. In the present embodiment, it is desirable that depth 60D of the second trench region 60 is formed to extend deeper than a depth 40D of the trench electrode. More preferably, it is desirable that the second trench region 60 is formed to extend to a substantially central position in the thickness direction of semiconductor substrate 10, as shown in FIG. 19.

In a case where gate electrode 40 and insulating film 31 are formed as a planar electrode on the first main surface 1 of semiconductor substrate 10, depth 60D of the second trench region 60 only needs to be formed to extend deeper than depth 11AD of p type base region 11 so as to penetrate at least p type base region 11. Also in this case, more preferably, it is desirable that the second trench region 60 is formed to extend to a substantially central position in the thickness direction of semiconductor substrate 10, as shown in FIG. 19.

According to the high voltage semiconductor device of the present embodiment, even during the ON operation of the IGBT, p type base region 11B located on a side closer to $n^+$ type cathode region 13 than the second trench region 60 can independently serve as an anode of the free wheel diode. Namely, even during the ON operation of the IGBT, the free wheel diode can be operated (turned on) independently.

A more specific description will be given. It is assumed that an emitter of the IGBT ($n^+$ type emitter region 12) and the anode of the free wheel diode (p type base region 11) are set to a positive potential by the first main electrode 41, a collector of the IGBT ($p^+$ type collector region 14) is set to 0 V by the second main electrode 42P, and a gate of the IGBT (gate electrode 40) is set to a positive potential.

Since the second trench region 60 is formed, a resistance in a current path in the direction indicated by arrow AR2 passing the emitter of the IGBT ($n^+$ type emitter region 12), the channel region of the IGBT (p type base region 11A), and a cathode of the free wheel diode ($n^+$ type cathode region 13) becomes higher than a resistance in a current path in a direction indicated by an arrow AR3 passing the anode of the free wheel diode (p type base region 11B) and the cathode of the free wheel diode ($n^+$ type cathode region 13).

Therefore, an MOS operation in the IGBT is suppressed, and the free wheel diode can be operated (turned on) independently even during the ON operation of the IGBT. According to the configuration described above, a resistance in a current path in the direction indicated by arrow ARI passing the collector of the IGBT ($p^+$ type collector region 14), the channel region of the IGBT (p type base region 11A), and the emitter of the IGBT ($n^+$ type emitter region 12) stays constant or becomes lower.

A description will be given of a case where the second trench region 60 and p type base region 11B described above are not formed. In this case, during the ON operation of the IGBT, it is difficult to operate (turn on) the free wheel diode independently.

A more specific description will be given. It is assumed that the emitter of the IGBT ($n^+$ type emitter region 12) and the anode of the free wheel diode (p type base region 11) are set to a positive potential by the first main electrode 41, the collector of the IGBT ($p^+$ type collector region 14) is set to 0 V by the second main electrode 42P, and the gate of the IGBT (gate electrode 40) is set to a positive potential.

The resistance in the current path in the direction indicated by arrow AR2 passing the emitter of the IGBT ($n^+$ type emitter region 12), the channel region of the IGBT (p type base region 11A), and the cathode of the free wheel diode ($n^+$ type cathode region 13) becomes lower than the resistance in the current path in the direction indicated by arrow AR3 passing the anode of the free wheel diode (p type base region 11B) and the cathode of the free wheel diode ($n^+$ type cathode region 13) (until a relatively high voltage is applied).

Therefore, the MOS operation in the IGBT becomes dominant, making it difficult to operate (turn on) the free wheel diode independently during the ON operation of the IGBT.

According to the high voltage semiconductor device of the present embodiment, even during the ON operation of the IGBT, p type base region 11B located on the side closer to $n^+$ type cathode region 13 than the second trench region 60 can independently serve as the anode of the free wheel diode. Therefore, even during the ON operation of the IGBT, the free wheel diode can be operated (turned on) independently.

Another Form of Embodiment 6

Figure 20:
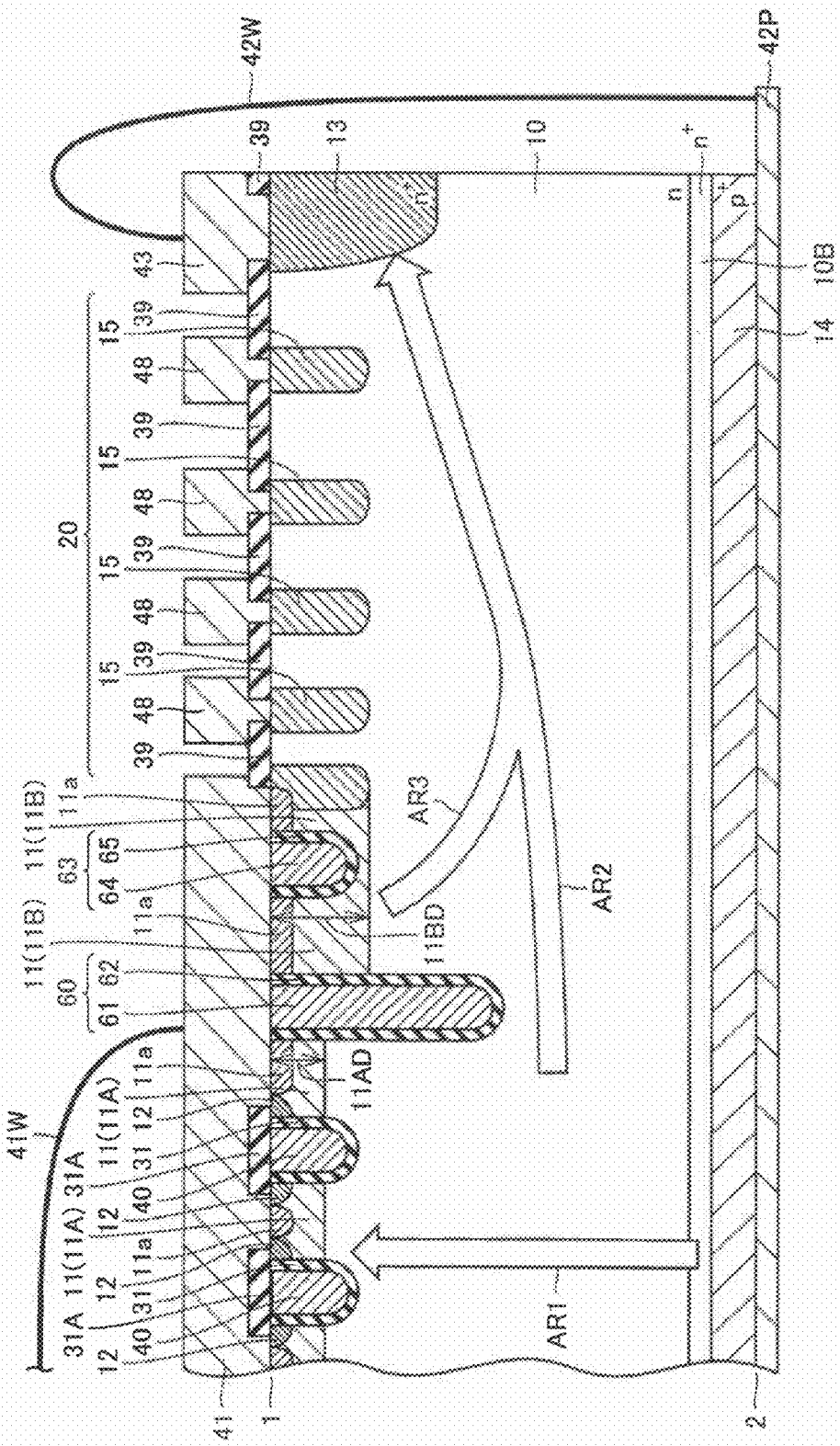
FIG. 20 is a cross sectional view showing a high voltage semiconductor device of another form of Embodiment 6.

Referring to FIG. 20, another form of Embodiment 6 will be described. It is desirable that, in the high voltage semiconductor device of Embodiment 6 described above, depth 11AD of p type base region 11A including the channel region is set shallower than a depth 11BD of p type base region 11B not including the channel region.

According to the high voltage semiconductor device of the other form, p type base region 11B not including the channel region has a hole injection efficiency higher than that of p type base region 11A including the channel region. As a result, occurrence of a snap-back phenomenon can be further suppressed.

Still Another Form of Embodiment 6

Figure 21:
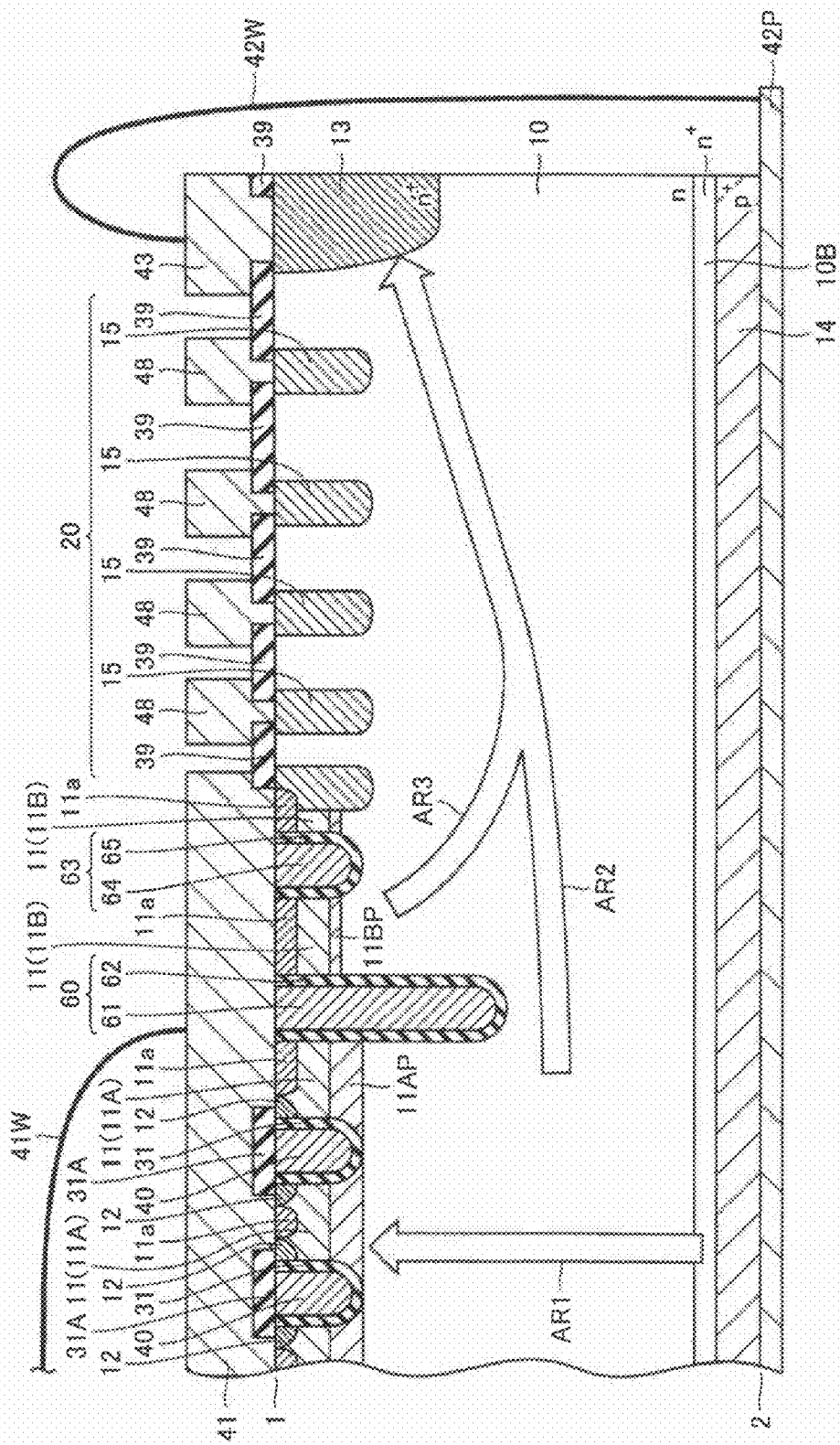
FIG. 21 is a cross sectional view showing a high voltage semiconductor device of still another form of Embodiment 6.

Referring to FIG. 21, still another form of Embodiment 6 will be described. It is desirable that, in the high voltage semiconductor device of Embodiment 6 described above, a peak concentration region 11AP of p type base region 11A including the channel region is set at a position deeper than a peak concentration region 11BP of p type base region 11B not including the channel region, in the thickness direction of semiconductor substrate 10.

According to the high voltage semiconductor device of the other form, p type base region 11B not including the channel region has a hole injection efficiency higher than that of p type base region 11A including the channel region. As a result, occurrence of a snap-back phenomenon can be further suppressed.

Embodiment 7

Figure 22:
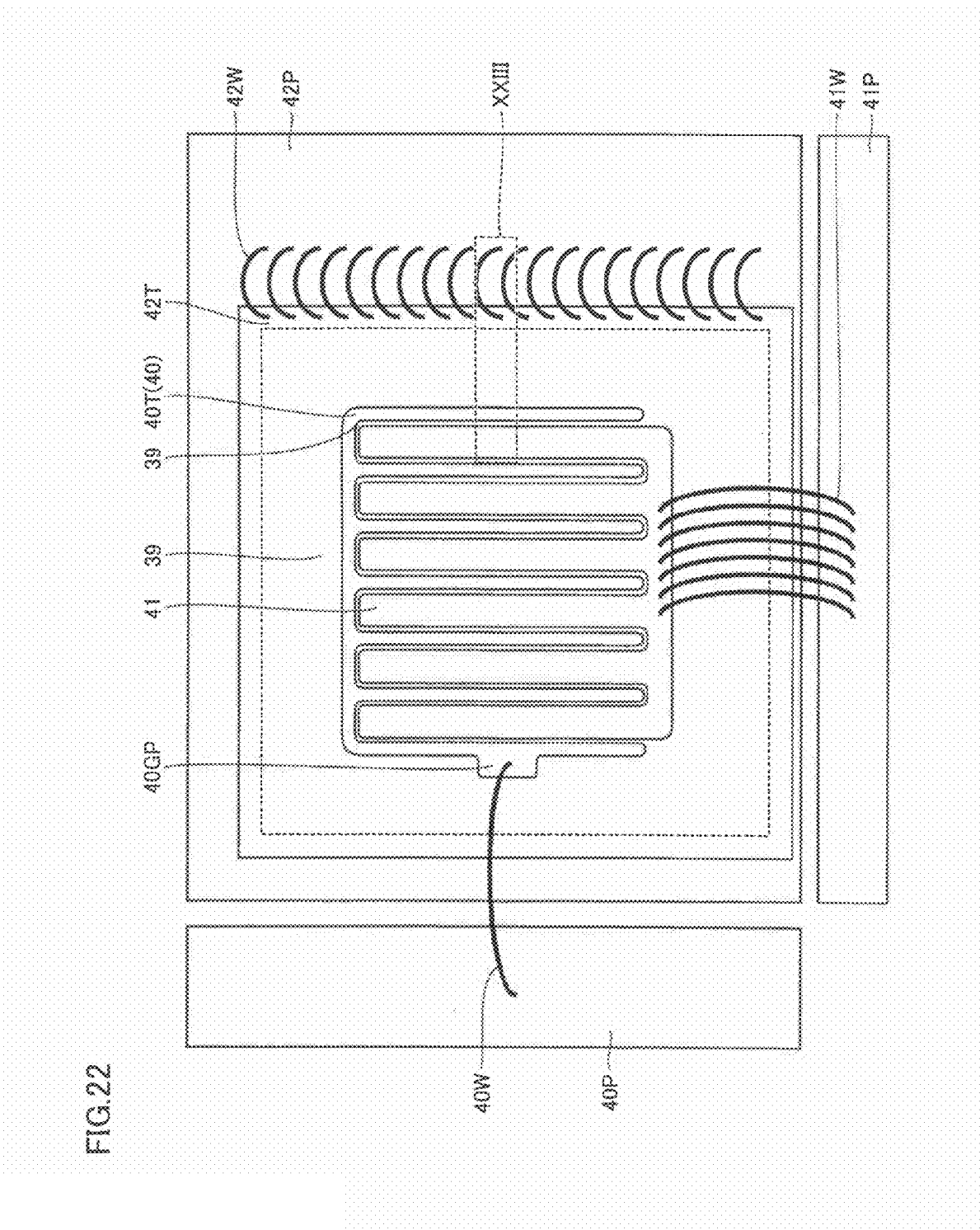
FIG. 22 is a plan view showing a high voltage semiconductor device of Embodiment 7.
Figure 23:
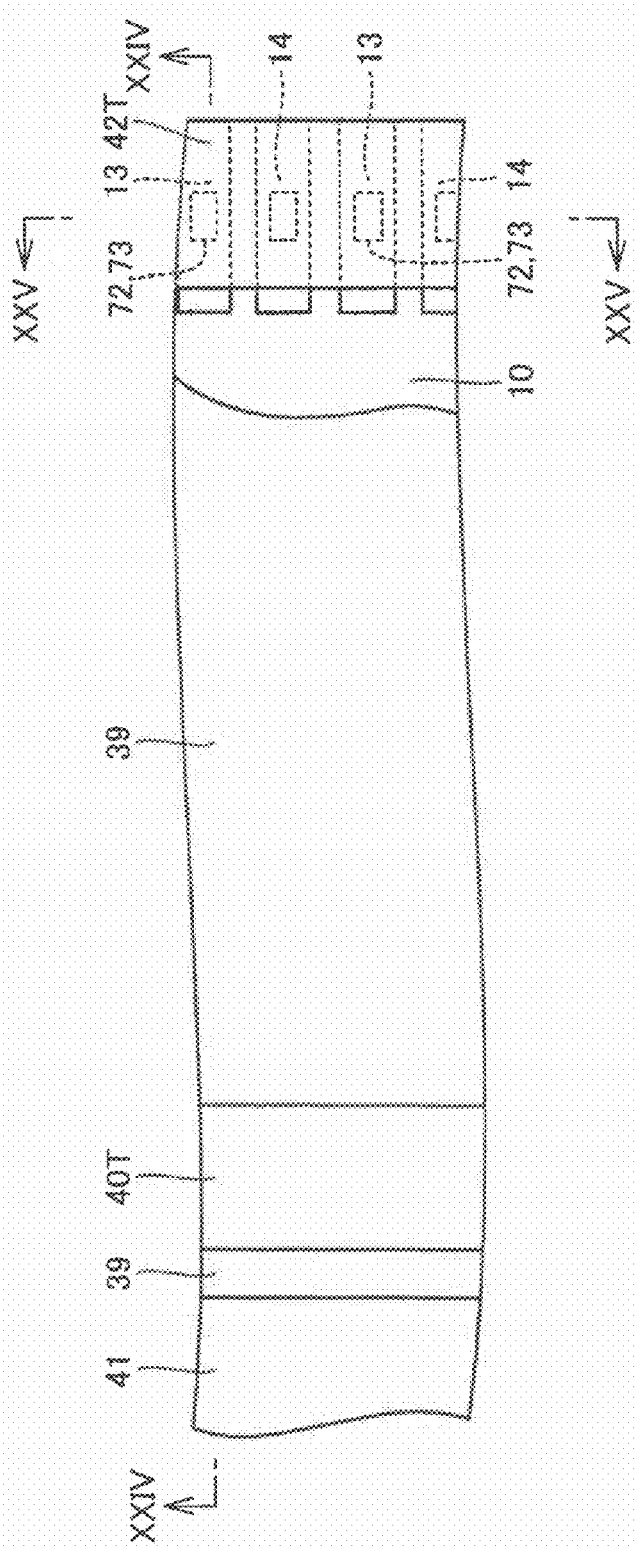
FIG. 23 is an enlarged fragmentary view of a region surrounded by a line XXIII in FIG. 22.
Figure 24:
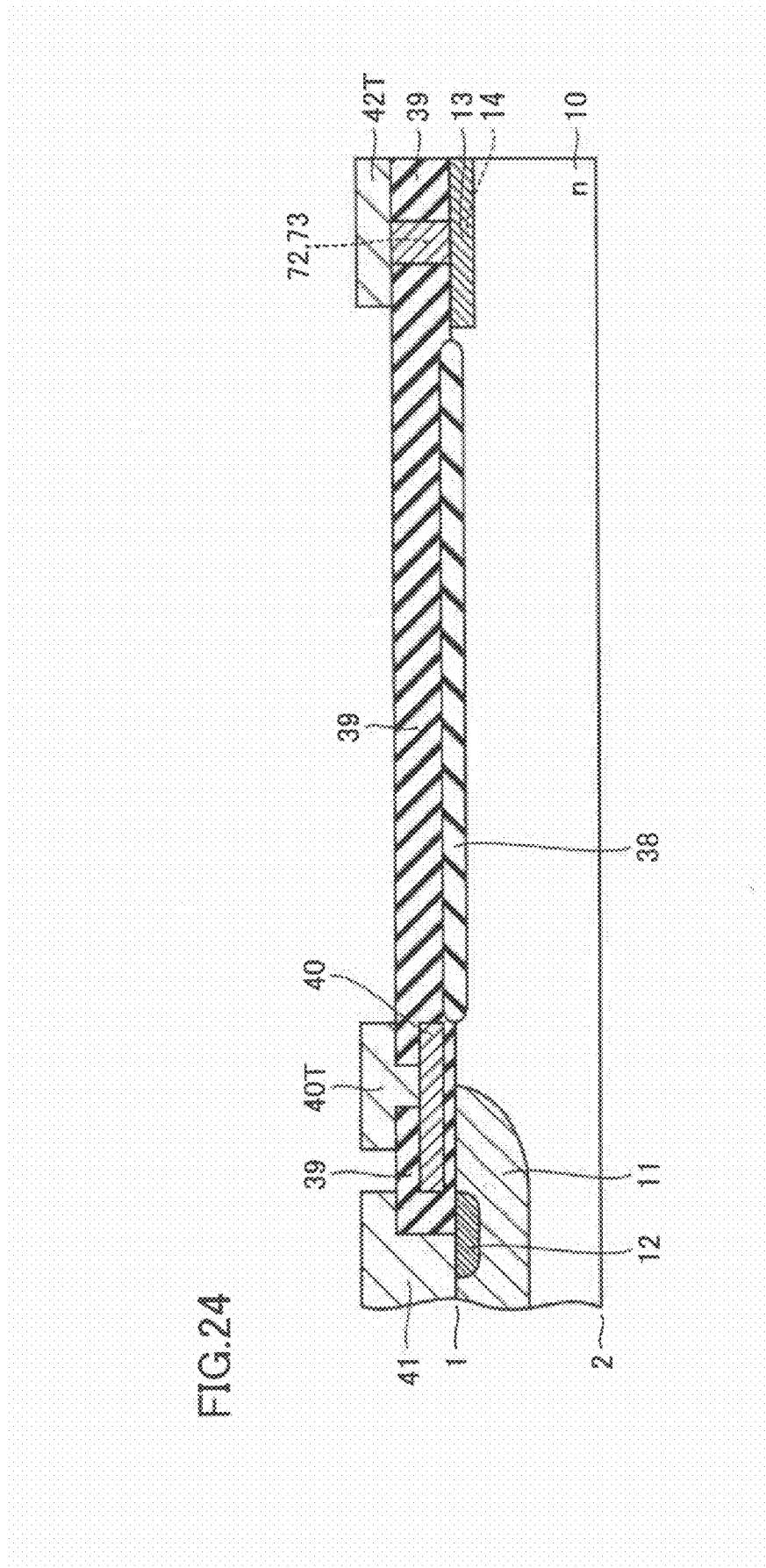
FIG. 24 is a cross sectional view along a line XXIV-XXIV in FIG. 23 seen in the direction of arrows.
Figure 25:
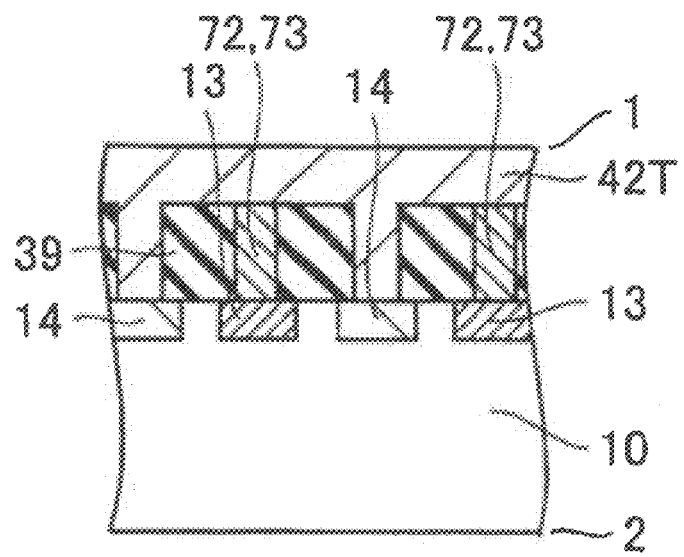
FIG. 25 is a cross sectional view along a line XXV-XXV in FIG. 23 seen in the direction of arrows.

Referring to FIGS. 22 to 25, Embodiment 7 according to the present invention will be described. Also in a high voltage semiconductor device of the present embodiment, an IGBT and a free wheel diode are formed in a single semiconductor substrate, as in Embodiments 1 to 6 described above. For convenience of description, FIG. 23 shows interlayer insulating film 39 with a portion thereof (on the right side in a paper plane) cut away. Referring to FIG. 24, interlayer insulating film 39 extends to the end surface of semiconductor substrate 10 (toward the right side in a paper plane of FIG. 24).

(IGBT)

Referring to FIGS. 22 to 25, the IGBT formed within the high voltage semiconductor device will be described. Referring to FIG. 24, the IGBT includes n type semiconductor substrate 10, p type base region (the first semiconductor region) 11, relatively highly concentrated $n^+$ type emitter region (the second semiconductor region) 12, relatively highly concentrated $p^+$ type collector region (the fourth semiconductor region) 14, interlayer insulating film 39, and gate electrode (control electrode) 40. A $p^+$ type region may be formed in a surface of p type base region 11 to obtain a good ohmic connection between p type base region 11 and the first main electrode 41 described later.

P type base region 11 is selectively formed in the first main surface 1 of n type semiconductor substrate 10. A plurality of p type base regions 11 are arranged in parallel to the first main electrode 41 described later (see FIG. 22). P type base region 11 is surrounded by semiconductor substrate 10 in the first main surface 1.

N+ type emitter region 12 is selectively formed in the surface of p type base region 11. N+ type emitter region 12 and semiconductor substrate 10 sandwich p type base region 11 therebetween. In other words, n+ type emitter region 12 is surrounded by p type base region 11 in the first main surface 1 of semiconductor substrate 10.

Unlike Embodiments 1 to 6, p+ type collector region 14 is formed adjacent to the end surface of semiconductor substrate 10, from the first main surface 1 toward the second main surface 2. P+ type collector region 14 is formed with a depth not penetrating semiconductor substrate 10 in the thickness direction.

Referring to FIG. 23, both edges of p+ type collector region 14 (in a vertical direction in the paper plane of FIG. 23) are sandwiched by semiconductor substrate 10. P+ type collector region 14 and n+ type cathode region 13 described later are arranged alternately along the end surface of semiconductor substrate 10 in the first main surface 1. In the end surface of semiconductor substrate 10, semiconductor substrate 10 is sandwiched between p+ type collector region 14 and n+ type cathode region 13 (in a direction parallel to the end surface of semiconductor substrate 10). P+ type collector region 14 and n+ type cathode region 13 are formed over an entire circumference of semiconductor substrate 10 along the end surface in the first main surface 1, in a state sandwiching semiconductor substrate 10.

Referring to FIG. 24, gate electrode 40 faces p type base region 11 sandwiched between semiconductor substrate 10 and n+ type emitter region 12, with interlayer insulating film 39 interposed therebetween. A portion of p type base region 11 sandwiched between semiconductor substrate 10 and n+ type emitter region 12 that faces gate electrode 40 with interlayer insulating film 39 interposed therebetween forms a channel region. Gate electrode 40 exhibits a so-called Double Diffuse MOS (DMOS) structure, together with semiconductor substrate 10, n+ type emitter region 12, and p type base region 11. Although gate electrode 40 and interlayer insulating film 39 in the present embodiment constitute a planar electrode as shown in FIG. 22, they may constitute a so-called trench electrode formed to extend into semiconductor substrate 10.

Referring to FIG. 22, gate electrodes 40 are formed in parallel along the first main surface 1 of semiconductor substrate 10, and ends of gate electrodes 40 are electrically connected to each other by a gate wire 40T. Gate electrodes 40 are connected to gate pad 40GP by gate wire 40T, and gate electrodes 40 have a common potential. Gate wire 40W has one end connected to gate pad 40GP, and the other end connected to gate pad 40P on the external terminal side.

Referring to FIG. 24, in the IGBT, n type semiconductor substrate 10 and n+ type emitter region 12 are source/drain regions, and the n channel of p type base region 11 is controlled by gate electrode 40. Namely, semiconductor substrate 10, n+ type emitter region 12, gate electrode 40, and p type base region 11 form a structure of a field effect transistor.

In the IGBT, a pnp transistor structure including p type base region 11, n type semiconductor substrate 10, and p+ type collector region 14 is formed, and its base current is controlled by the field effect transistor described above. Thereby, the high voltage semiconductor device of the present embodiment can serve as an IGBT.

(Free Wheel Diode)

The free wheel diode formed within the high voltage semiconductor device includes n+ type cathode region (the third semiconductor region) 13, n type semiconductor substrate 10, and p type base region 11. N type semiconductor substrate 10 and p type base region 11 are shared by the IGBT and the free wheel diode formed within the high voltage semiconductor device.

N+ type cathode region 13 is formed adjacent to the end surface of semiconductor substrate 10, from the first main surface 1 toward the second main surface 2. N+ type cathode region 13 is formed with a depth not penetrating semiconductor substrate 10 in the thickness direction.

Both edges of n+ type cathode region 13 (in the vertical direction in the paper plane of FIG. 23) are sandwiched by semiconductor substrate 10. N+ type cathode region 13 and p+ type collector region 14 are arranged alternately along the end surface of semiconductor substrate 10 in the first main surface 1, over an entire circumference of the end surface (in a state sandwiching semiconductor substrate 10).

N+ type cathode region 13 and n type semiconductor substrate 10 constitute an n type region as a diode, and p type base region 11 constitutes a p type region as a diode. A pn junction structure is formed between these n type region and p type region. Thereby, the free wheel diode can serve as a diode.

In the high voltage semiconductor device of the present embodiment, no electric field relaxing portion is formed, and an insulating film 38 is formed between p type base region 11 and n+ type cathode region 13 and p+ type collector region 14. Insulating film 38 is formed in the first main surface 1 of semiconductor substrate 10 to suppress a leak current and fluctuation in characteristics. Insulating film 38 is, for example, an oxide film having a low interface state.

(Main Electrode)

Referring to FIGS. 22 and 24, the first main electrodes 41 are formed in parallel along the first main surface 1 of semiconductor substrate 10. The first main electrodes 41 are electrically connected to each other. The first main electrode 41 is formed to extend into an opening (contact hole) provided in interlayer insulating film 39. The first main electrode 41 is formed in contact with both of p type base region 11 and n+ type emitter region 12. Gate electrode 40 is insulated from the first main electrode 41 with interlayer insulating film 39.

Emitter wire 41W has one end connected to the first main electrode 41, and the other end connected to emitter pad 41P. The first main electrode 41 is an electrode that provides a (reference) potential to p type base region 11 and n+ type emitter region 12, through emitter pad 41P and emitter wire 41W.

A collector pad 42T is formed in contact with p+ type collector region 14 formed on an end surface side of the first main surface 1 of semiconductor substrate 10. Collector pad 42T and n+ type cathode region 13 are electrically connected via resistor 72 or diode 73. Connection portion 42W has one end connected to collector pad 42T, and the other end connected to the second main electrode 42P. Thus, the second main electrode 42P can provide a (high) potential to n+ type cathode region 13 or p+ type collector region 14.

When the high voltage semiconductor device of the present embodiment serves as an IGBT, the first main electrode 41 is equivalent to an emitter electrode, the second main electrode 42P is equivalent to a collector electrode, and gate electrode 40 is equivalent to a gate electrode.

When the high voltage semiconductor device of the present embodiment serves as a (free wheel) diode, the first main electrode 41 is equivalent to an anode electrode, and the second main electrode 42P is equivalent to a cathode electrode.

(Function/Effect)

Referring to FIG. 24, in the high voltage semiconductor device of the present embodiment, both p+ type collector region 14 as the collector of the IGBT and n+ type cathode region 13 as the cathode of the free wheel diode are formed on the first main surface 1 side of semiconductor substrate 10. Namely, a current that flows during the ON operation of the IGBT and a current that flows during the ON operation of the free wheel diode flow in parallel.

The second main electrode 42P can provide a (high) potential to $n^+$ type cathode region 13 or $p^+$ type collector region 14. On this occasion, a connection portion is directly connected to $p^+$ type collector region 14, and connected to $n^+$ type cathode region 13 via resistor 72 or diode 73. This causes an increase in a resistance between the current that flows during the ON operation of the IGBT and the current that flows during the ON operation of the free wheel diode (a resistance at a point where the current that flows during the ON operation of the IGBT and the current that flows during the ON operation of the free wheel diode join together), and thus can suppress occurrence of a snap-back phenomenon.

Embodiment 8

Figure 26:
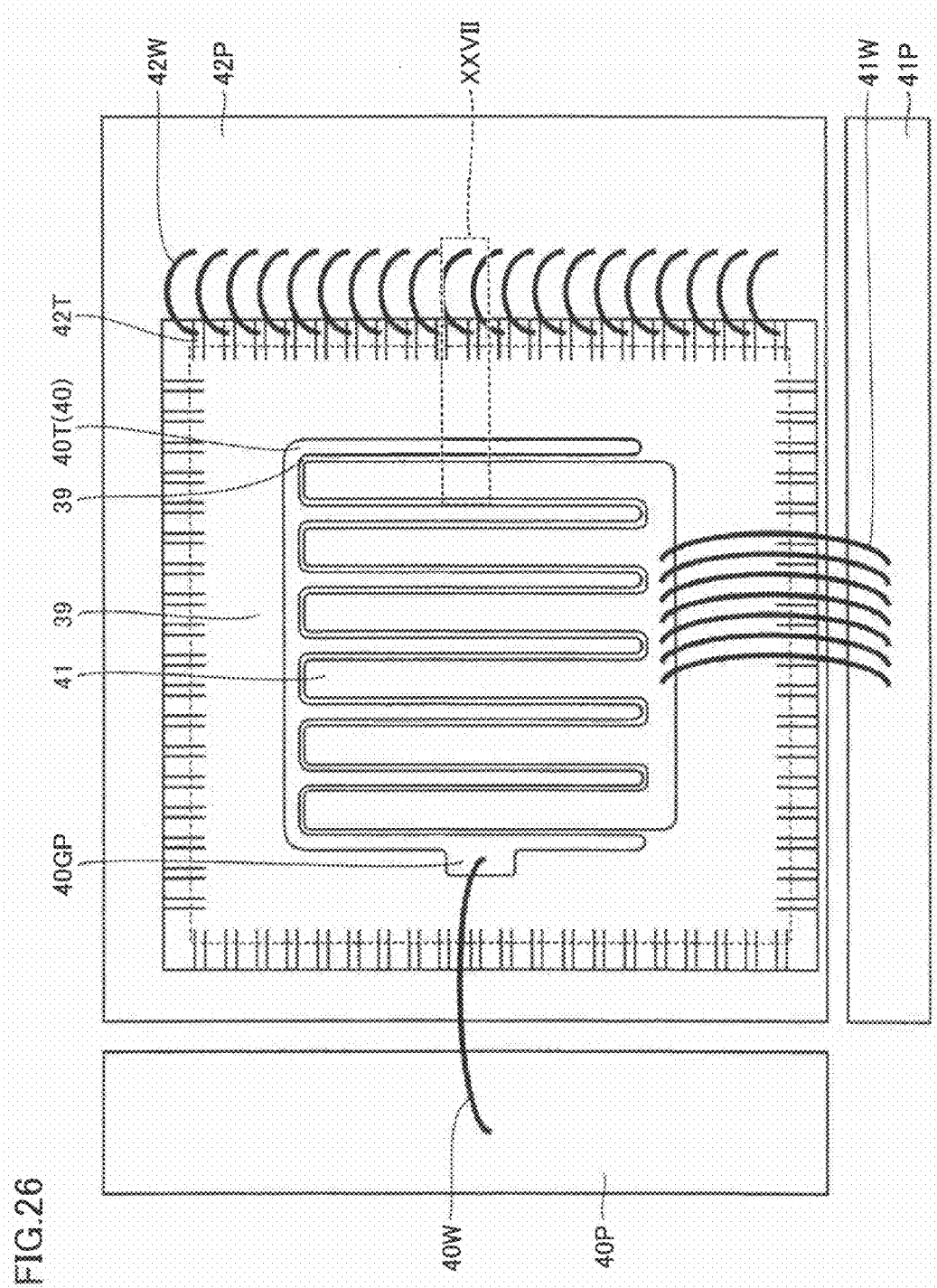
FIG. 26 is a plan view showing a high voltage semiconductor device of Embodiment 8.
Figure 27:
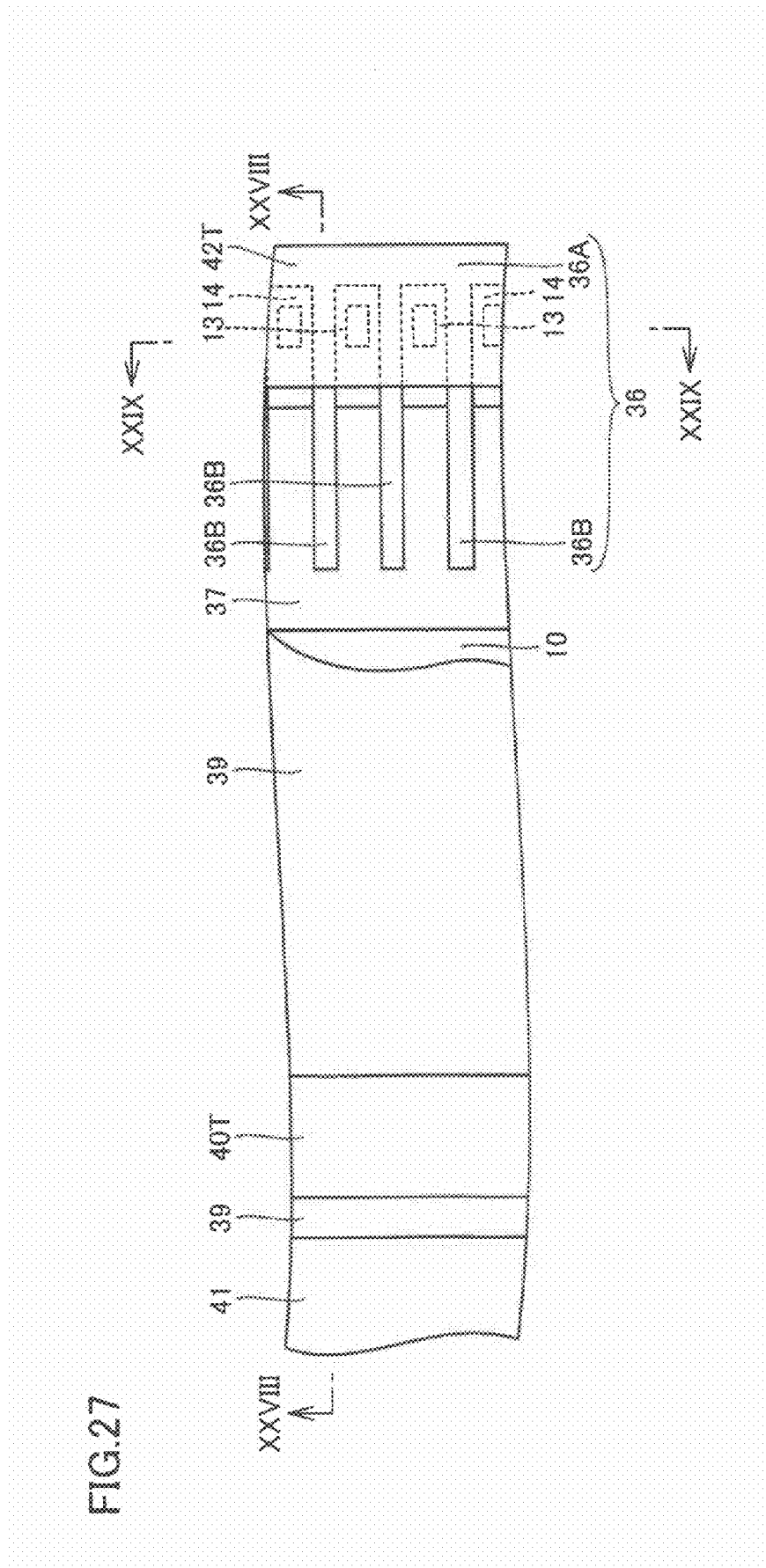
FIG. 27 is an enlarged fragmentary view of a region surrounded by a line XXVII in FIG. 26.
Figure 28:
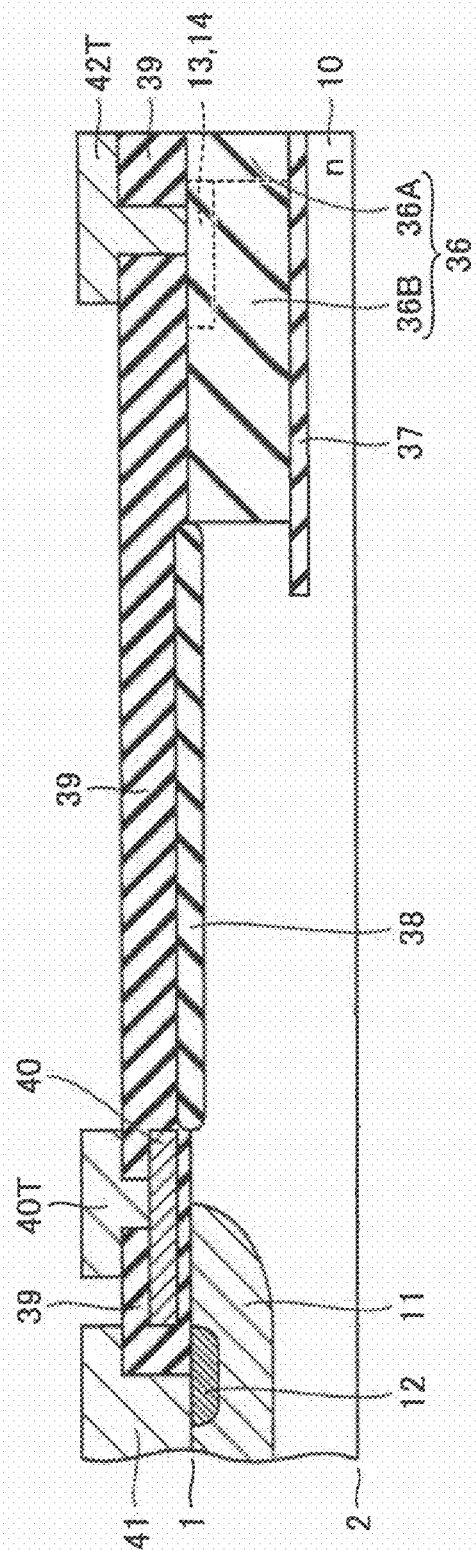
FIG. 28 is a cross sectional view along a line XXVIII-XXVIII in FIG. 27 seen in the direction of arrows.

Referring to FIGS. 26 to 29, Embodiment 8 according to the present invention will be described. Also in a high voltage semiconductor device of the present embodiment, an IGBT and a free wheel diode are formed in a single semiconductor substrate, as in Embodiments 1 to 7 described above. For convenience of description, FIG. 27 shows interlayer insulating film 39 with a portion thereof (on the right side in a paper plane) cut away. Referring to FIG. 28, interlayer insulating film 39 extends to the end surface of semiconductor substrate 10 (toward the right side in a paper plane of FIG. 28).

(IGBT)

Referring to FIGS. 26 to 29, the IGBT formed within the high voltage semiconductor device will be described. Referring to FIG. 28, the IGBT includes n type semiconductor substrate 10, p type base region (the first semiconductor region) 11, relatively highly concentrated $n^+$ type emitter region (the second semiconductor region) 12, relatively highly concentrated $p^+$ type collector region (the fourth semiconductor region) 14, interlayer insulating film 39, and gate electrode (control electrode) 40. A $p^+$ type region may be formed in a surface of p type base region 11 to obtain a good ohmic connection between p type base region 11 and the first main electrode 41 described later.

P type base region 11 is selectively formed in the first main surface 1 of n type semiconductor substrate 10. A plurality of p type base regions 11 are arranged in parallel to the first main electrode 41 described later (see FIG. 26). P type base region 11 is surrounded by semiconductor substrate 10 in the first main surface 1.

$N^+$ type emitter region 12 is selectively formed in the surface of p type base region 11. $N^+$ type emitter region 12 and semiconductor substrate 10 sandwich p type base region 11 therebetween. In other words, $n^+$ type emitter region 12 is surrounded by p type base region 11 in the first main surface 1 of semiconductor substrate 10.

Figure 29:
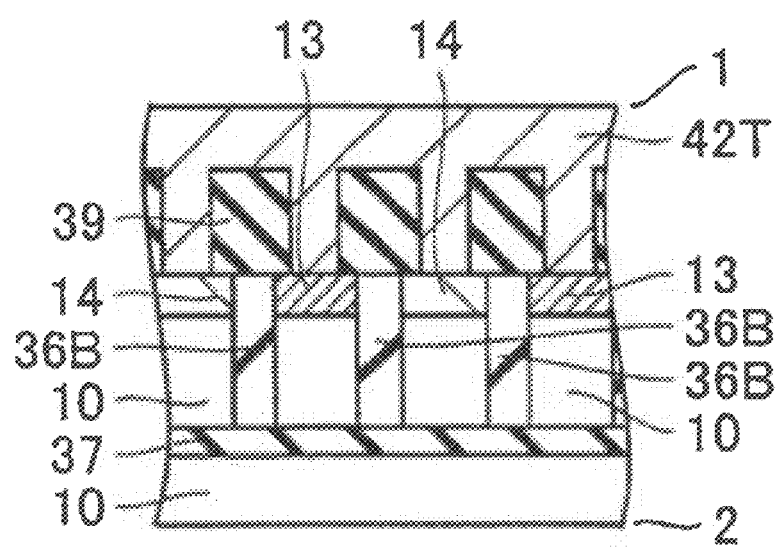
FIG. 29 is a cross sectional view along a line XXIX-XXIX in FIG. 27 seen in the direction of arrows.

Referring to FIGS. 27 to 29, a trench region 36 is formed over the entire circumference of the end surface of semiconductor substrate 10. Trench region 36 has a side wall portion 36B extending in a direction perpendicular to the end surface of semiconductor substrate 10, and a back surface portion 36A formed in contact with the end surface of semiconductor substrate 10 to connect ends of side wall portions 36B.

Side wall portion 36B and back surface portion 36A of trench region 36 are each formed in the shape of a plate, and each include an insulating film (not shown) and a conductive layer (not shown) in the shape of a thin plate included in the insulating film.

$P^+$ type collector region 14 is adjacent to the end surface of semiconductor substrate 10, with back surface portion 36A of trench region 36 interposed therebetween. $P^+$ type collector region 14 is formed from the first main surface 1 toward the second main surface 2. $P^+$ type collector region 14 is formed with a depth not penetrating semiconductor substrate 10.

Both edges of $p^+$ type collector region 14 (in a vertical direction in the paper plane of FIG. 27) are sandwiched by side wall portions 36B of trench region 36. $P^+$ type collector region 14 and $n^+$ type cathode region 13 described later are arranged alternately along the end surface of semiconductor substrate 10 in the first main surface 1. In the end surface of semiconductor substrate 10, side wall portion 36B of trench region 36 is sandwiched between $p^+$ type collector region 14 and $n^+$ type cathode region 13 (in the direction parallel to the end surface of semiconductor substrate 10). $P^+$ type collector region 14 and $n^+$ type cathode region 13 are formed over the entire circumference of semiconductor substrate 10 along the end surface of semiconductor substrate 10 in the first main surface 1, in a state sandwiching side wall portion 36B of trench region 36.

Referring to FIG. 28, gate electrode 40 faces p type base region 11 sandwiched between semiconductor substrate 10 and $n^+$ type emitter region 12, with interlayer insulating film 39 interposed therebetween. A portion of p type base region 11 sandwiched between semiconductor substrate 10 and $n^+$ type emitter region 12 that faces gate electrode 40 with interlayer insulating film 39 interposed therebetween forms a channel region. Gate electrode 40 exhibits a so-called Double Diffuse MOS (DMOS) structure, together with semiconductor substrate 10, $n^+$ type emitter region 12, and p type base region 11. Although gate electrode 40 and interlayer insulating film 39 in the present embodiment constitute a planar electrode as shown in FIG. 26, they may constitute a so-called trench electrode formed to extend into semiconductor substrate 10.

Referring to FIG. 26, gate electrodes 40 are formed in parallel along the first main surface 1 of semiconductor substrate 10, and ends of gate electrodes 40 are electrically connected to each other by gate wire 40T. Gate electrodes 40 are connected to gate pad 40GP by gate wire 40T, and gate electrodes 40 have a common potential. Gate wire 40W has one end connected to gate pad 40GP, and the other end connected to gate pad 40P on the external terminal side.

Referring to FIG. 28, in the IGBT, n type semiconductor substrate 10 and $n^+$ type emitter region 12 are source/drain regions, and the n channel of p type base region 11 is controlled by gate electrode 40. Namely, semiconductor substrate 10, $n^+$ type emitter region 12, gate electrode 40, and p type base region 11 form a structure of a field effect transistor.

In the IGBT, a pnp transistor structure including p type base region 11, n type semiconductor substrate 10, and $p^+$ type collector region 14 is formed, and its base current is controlled by the field effect transistor described above. Thereby, the high voltage semiconductor device of the present embodiment can serve as an IGBT.

(Free Wheel Diode)

The free wheel diode formed within the high voltage semiconductor device includes $n^+$ type cathode region (the third semiconductor region) 13, n type semiconductor substrate 10, and p type base region 11.

$N^+$ type cathode region 13 is adjacent to the end surface of semiconductor substrate 10, with back surface portion 36A of trench region 36 interposed therebetween. $N^+$ type cathode region 13 is formed from the first main surface 1 toward the second main surface 2. N⁺ type cathode region 13 is formed with a depth not penetrating semiconductor substrate 10 in the thickness direction.

Both edges of n⁺ type cathode region 13 (in the vertical direction in the paper plane of FIG. 27) are sandwiched by trench region 36. N⁺ type cathode region 13 and p⁺ type collector region 14 are arranged alternately along the end surface of semiconductor substrate 10 in the first main surface 1, over the entire circumference of the end surface (in a state sandwiching side wall portion 36B of trench region 36).

N⁺ type cathode region 13 and n type semiconductor substrate 10 constitute an n type region as a diode, and p type base region 11 constitutes a p type region as a diode. A pn junction structure is formed between these n type region and p type region. Thereby, the free wheel diode can serve as a diode.

In the high voltage semiconductor device of the present embodiment, no electric field relaxing portion is formed, and insulating film 38 is formed between p type base region 11 and n⁺ type cathode region 13 or p⁺ type collector region 14. Insulating film 38 is formed in the first main surface 1 of semiconductor substrate 10 to suppress a leak current and fluctuation in characteristics. Insulating film 38 is, for example, an oxide film having a low interface state.

(Main Electrode)

Referring to FIGS. 26 and 28, the first main electrodes 41 are formed in parallel along the first main surface 1 of semiconductor substrate 10. The first main electrodes 41 are electrically connected to each other. The first main electrode 41 is formed to extend into an opening (contact hole) provided in interlayer insulating film 39. The first main electrode 41 is formed in contact with both of p type base region 11 and n⁺ type emitter region 12. Gate electrode 40 is insulated from the first main electrode 41 with interlayer insulating film 39.

Emitter wire 41W has one end connected to the first main electrode 41, and the other end connected to emitter pad 41P. The first main electrode 41 is an electrode that provides a (reference) potential to p type base region 11 and n⁺ type emitter region 12, through emitter pad 41P and emitter wire 41W.

Unlike Embodiment 7, collector pad 42T is formed in contact with both of n⁺ type cathode region 13 and p⁺ type collector region 14 formed on the end surface side of the first main surface 1 of semiconductor substrate 10. Connection portion 42W has one end connected to collector pad 42T, and the other end connected to the second main electrode 42P. Thus, the second main electrode 42P can provide a (high) potential to n⁺ type cathode region 13 or p⁺ type collector region 14.

When the high voltage semiconductor device of the present embodiment serves as an IGBT, the first main electrode 41 is equivalent to an emitter electrode, the second main electrode 42P is equivalent to a collector electrode, and gate electrode 40 is equivalent to a gate electrode.

When the high voltage semiconductor device of the present embodiment serves as a (free wheel) diode, the first main electrode 41 is equivalent to an anode electrode, and the second main electrode 42P is equivalent to a cathode electrode.

(Function/Effect)

Referring to FIG. 28, in the high voltage semiconductor device of the present embodiment, both p⁺ type collector region 14 as the collector of the IGBT and n⁺ type cathode region 13 as the cathode of the free wheel diode are formed on the first main surface 1 side of semiconductor substrate 10. Namely, a current that flows during the ON operation of the IGBT and a current that flows during the ON operation of the free wheel diode flow in parallel.

Trench region 36 is formed between n⁺ type cathode region 13 and p⁺ type collector region 14. This causes an increase in the resistance between the current that flows during the ON operation of the IGBT and the current that flows during the ON operation of the free wheel diode (the resistance at a point where the current that flows during the ON operation of the IGBT and the current that flows during the ON operation of the free wheel diode join together), and thus can suppress occurrence of a snap-back phenomenon.

Another Form of Embodiment 8

Referring to FIG. 28, another form of Embodiment 8 will be described. It is desirable that an insulating film 37 (a Silicon On Insulator (SOI) separation insulating film) is formed on the second main surface 2 sides of n⁺ type cathode region 13 and p⁺ type collector region 14, with semiconductor substrate 10 sandwiched therebetween. Insulating film 37 is formed to project further toward a central portion of semiconductor substrate 10 in a planar view than side wall portion 36B of trench region 36. Insulating film 37 is formed to enclose n⁺ type cathode region 13 from the end surface side of semiconductor substrate 10, together with side wall portions 36B of trench region 36 formed at both edges of n⁺ type cathode region 13.

Formation of insulating film 37 causes a further increase in the resistance between the current that flows during the ON operation of the IGBT and the current that flows during the ON operation of the free wheel diode (the resistance at a point where the current that flows during the ON operation of the IGBT and the current that flows during the ON operation of the free wheel diode join together), and thus can further suppress occurrence of a snap-back phenomenon.

Still Another Form of Embodiment 8

Figure 30:
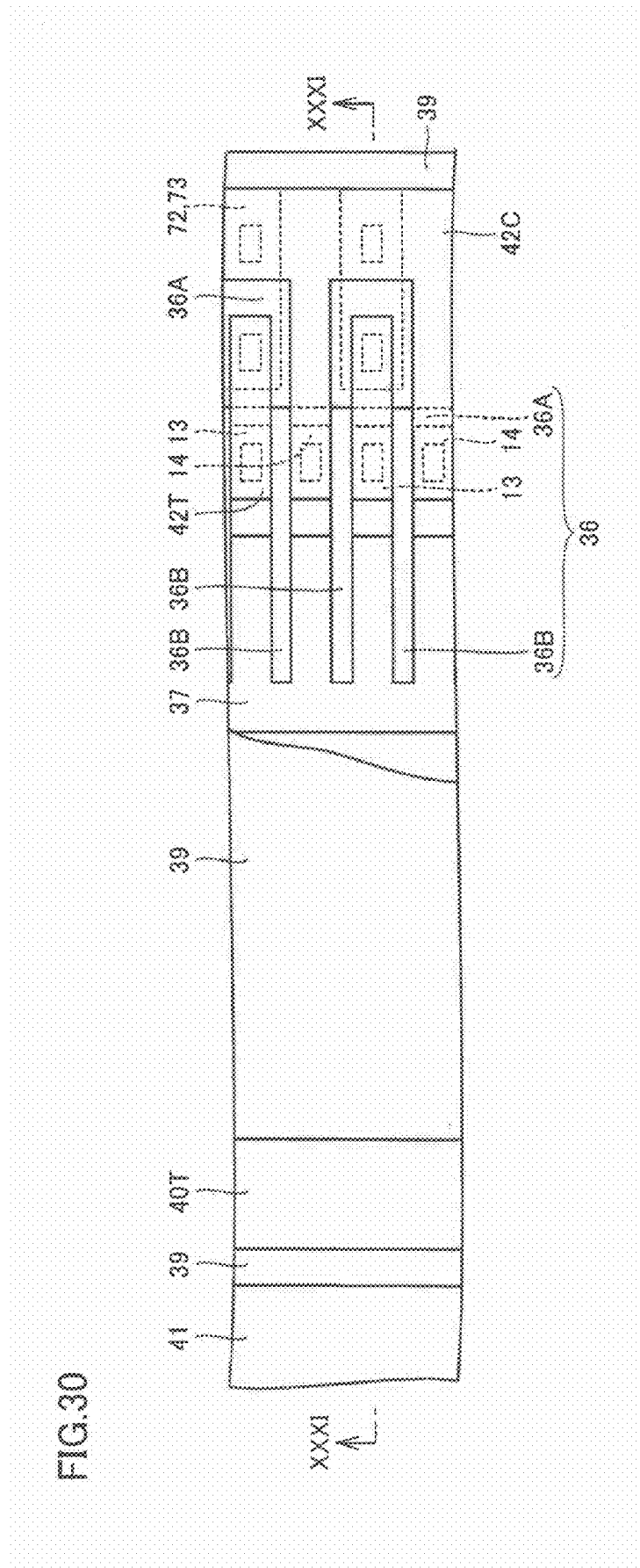
FIG. 30 is a plan view showing a high voltage semiconductor device of still another form of Embodiment 8.
Figure 31:
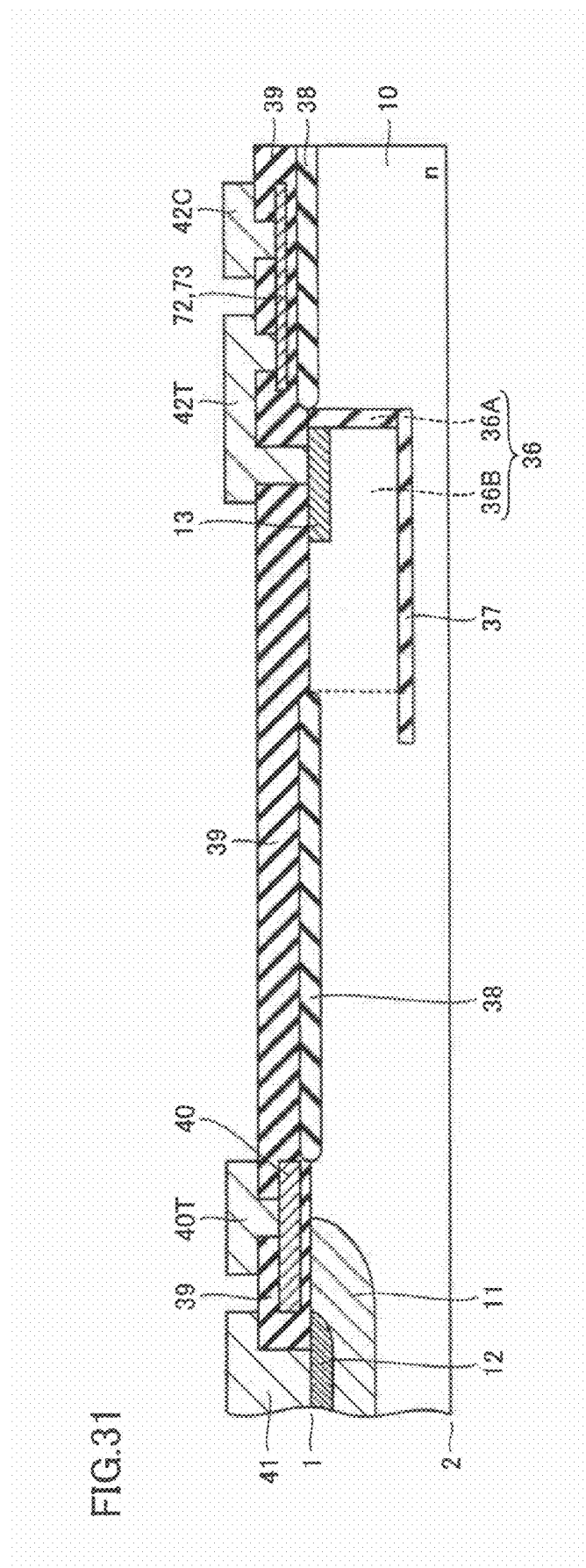
FIG. 31 is a cross sectional view along a line XXXI-XXXI in FIG. 30 seen in the direction of arrows.

Referring to FIGS. 30 and 31, still another form of Embodiment 8 will be described. A high voltage semiconductor device of the other form is different from the high voltage semiconductor device of Embodiment 8 in the configuration of collector pad 42T, in that the former further includes another collector pad 42C, and in that the former further includes resistor 72 or diode 73. Other configurations are substantially the same. FIG. 30 corresponds to FIG. 27 in Embodiment 8. FIG. 31 corresponds to FIG. 28 in Embodiment 8.

In the high voltage semiconductor device of Embodiment 8, collector pad 42T is formed in contact with both of n⁺ type cathode region 13 and p⁺ type collector region 14. In contrast, referring to FIGS. 30 and 31, collector pad 42T in the other form is formed in contact with n⁺ type cathode region 13 only.

Collector pad 42T is formed to extend in the direction perpendicular to the end surface of semiconductor substrate 10. Resistor 72 or diode 73 is embedded inside interlayer insulating film 39, on a side of collector pad 42T closer to the end surface of semiconductor substrate 10. Collector pad 42T has one end in contact with n⁺ type cathode region 13, and the other end in contact with resistor 72 or diode 73.

Collector pad 42C is formed on semiconductor substrate 10 with insulating film 38 and interlayer insulating film 39 interposed therebetween. Collector pad 42C extends into an opening (contact hole) formed in interlayer insulating film 39, and is in contact with p⁺ type collector region 14 through the opening. Referring to FIG. 30, collector pad 42C is formed to extend from a portion in contact with p⁺ type collector region 14 toward the end surface of semiconductor substrate 10. Tips of extendedly formed portions of collector pad 42C are connected in the direction parallel to the end surface of semiconductor substrate 10.

Collector pad 42C and collector pad 42T are conducted by resistor 72 or diode 73. A connection portion (equivalent to connection portion 42W in Embodiment 7, see FIG. 26) has one end connected to collector pad 42T, and the other end connected to the second main electrode 42P.

Referring to FIG. 31, in the high voltage semiconductor device of the other form, both $p^+$ type collector region 14 as the collector of the IGBT and $n^+$ type cathode region 13 as the cathode of the free wheel diode are formed on the first main surface 1 side of semiconductor substrate 10, as in Embodiment 8. Namely, a current that flows during the ON operation of the IGBT and a current that flows during the ON operation of the free wheel diode flow in parallel.

Trench region 36 is formed between $n^+$ type cathode region 13 and $p^+$ type collector region 14. This causes an increase in the resistance between the current that flows during the ON operation of the IGBT and the current that flows during the ON operation of the free wheel diode, and thus can suppress occurrence of a snap-back phenomenon.

The second main electrode 42P can provide a (high) potential to $n^+$ type cathode region 13 or $p^+$ type collector region 14. On this occasion, the connection portion is directly connected to $p^+$ type collector region 14, and connected to $n^+$ type cathode region 13 via resistor 72 or diode 73. This causes a further increase in the resistance between the current that flows during the ON operation of the IGBT and the current that flows during the ON operation of the free wheel diode (the resistance at a point where the current that flows during the ON operation of the IGBT and the current that flows during the ON operation of the free wheel diode join together) (when compared with the resistance in Embodiment 8), and thus can further suppress occurrence of a snap-back phenomenon.

Embodiment 9

Figure 32:
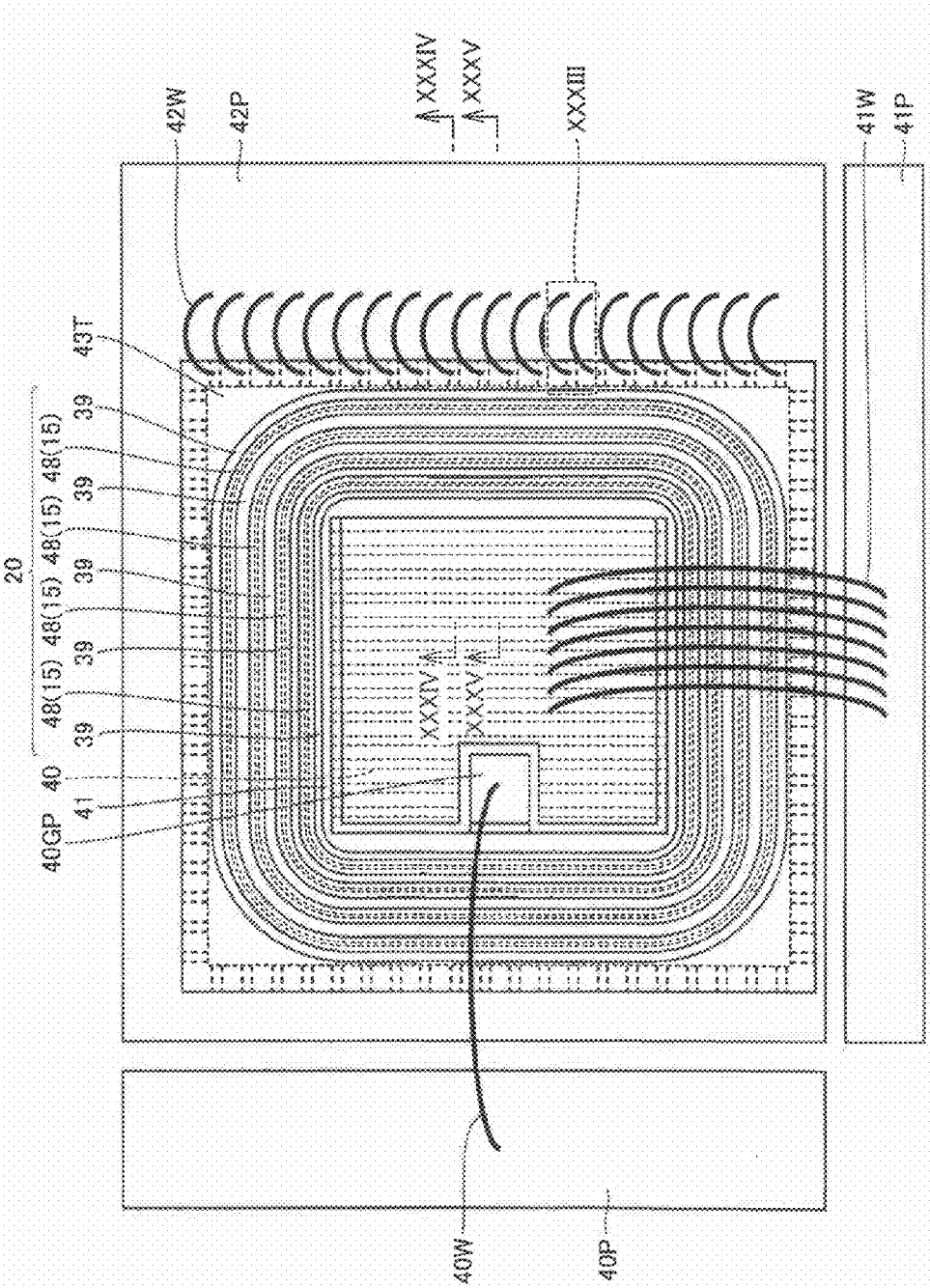
FIG. 32 is a plan view showing a high voltage semiconductor device of Embodiment 9.
Figure 33:
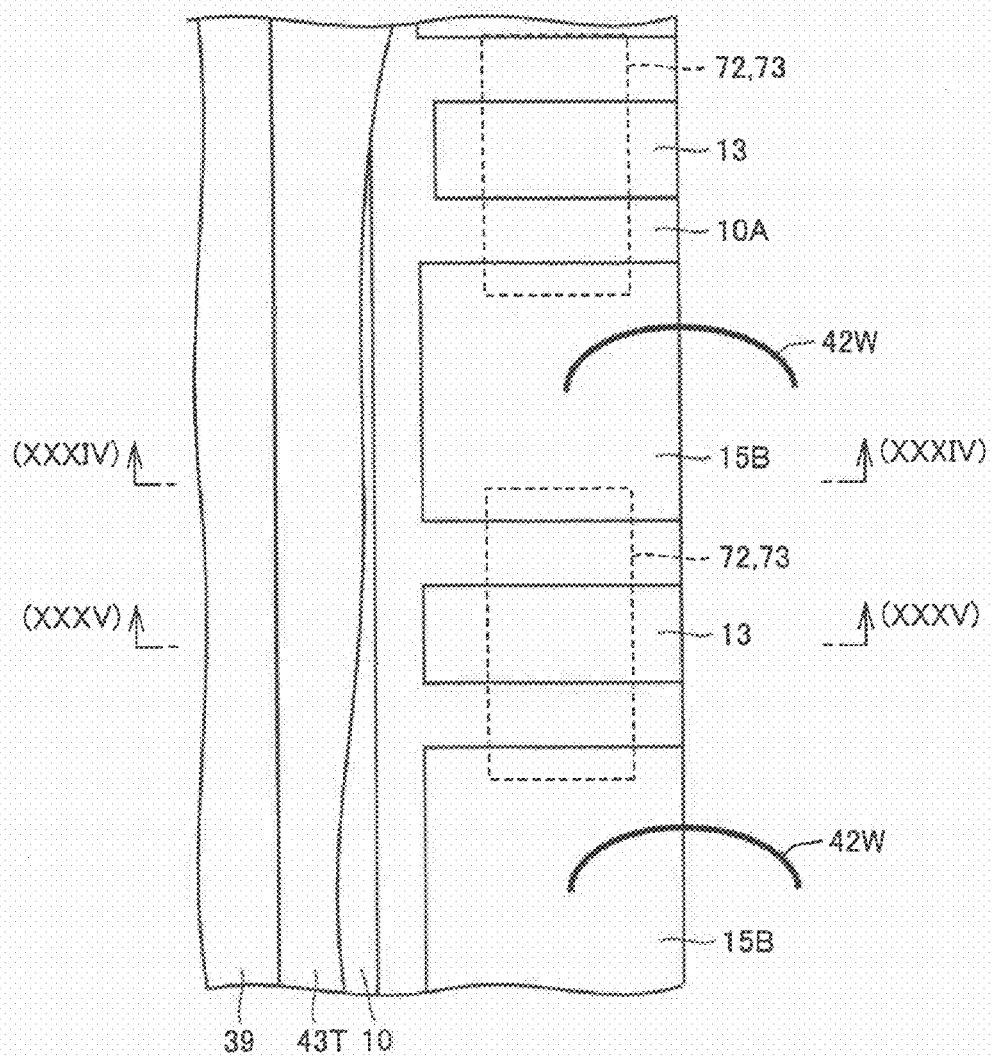
FIG. 33 is an enlarged fragmentary view of a region surrounded by a line XXXIII in FIG. 32.
Figure 34:
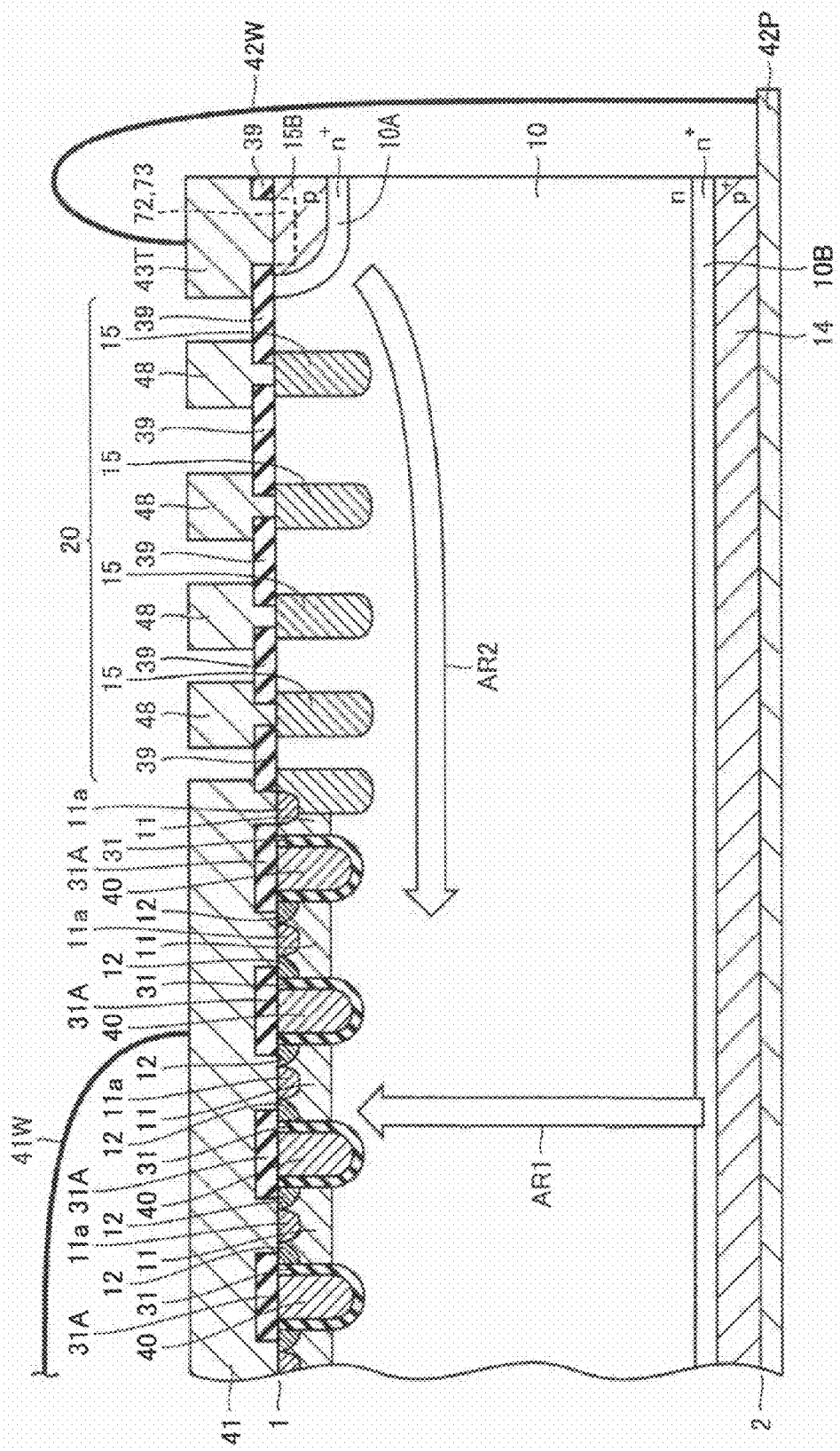
FIG. 34 is a cross sectional view along a line XXXIV-XXXIV in FIG. 32 seen in the direction of arrows.

Referring to FIGS. 32 to 35, Embodiment 9 according to the present invention will be described. In a high voltage semiconductor device of the present embodiment, a free wheel diode and two IGBTs (both n-channel type) are formed in a single semiconductor substrate. For convenience of description, FIG. 33 shows a third main electrode 43T with a portion thereof cut away. Referring to FIG. 34, the third main electrode 43T extends to the end surface of semiconductor substrate 10 (toward the right side in a paper plane of FIG. 34).

(IGBT)

Referring to FIG. 34, a first IGBT includes n type semiconductor substrate 10, relatively highly concentrated $n^+$ type buffer region 10B, p type base region (the first semiconductor region) 11, relatively highly concentrated $p^+$ type region 11a, relatively highly concentrated $n^+$ type emitter region (the second semiconductor region) 12, relatively highly concentrated $p^+$ type collector region (the fourth semiconductor region) 14, insulating film 31, and gate electrode (control electrode) 40.

N type semiconductor substrate 10, $n^+$ type buffer region 10B, p type base region 11, $p^+$ type region 11a, $n^+$ type emitter region 12, insulating film 31, and gate electrode 40 are configured substantially similarly to those in Embodiment 2.

$P^+$ type collector region 14 (see FIG. 34) is selectively formed in the second main surface 2 of semiconductor substrate 10. Specifically, $p^+$ type collector regions 14 are formed in parallel (in a vertical direction in a paper plane of FIG. 32) in the second main surface 2 of semiconductor substrate 10. $P^+$ type collector regions 14 are formed at a predetermined interval therebetween in entire second main surface 2 of semiconductor substrate 10.

Figure 35:
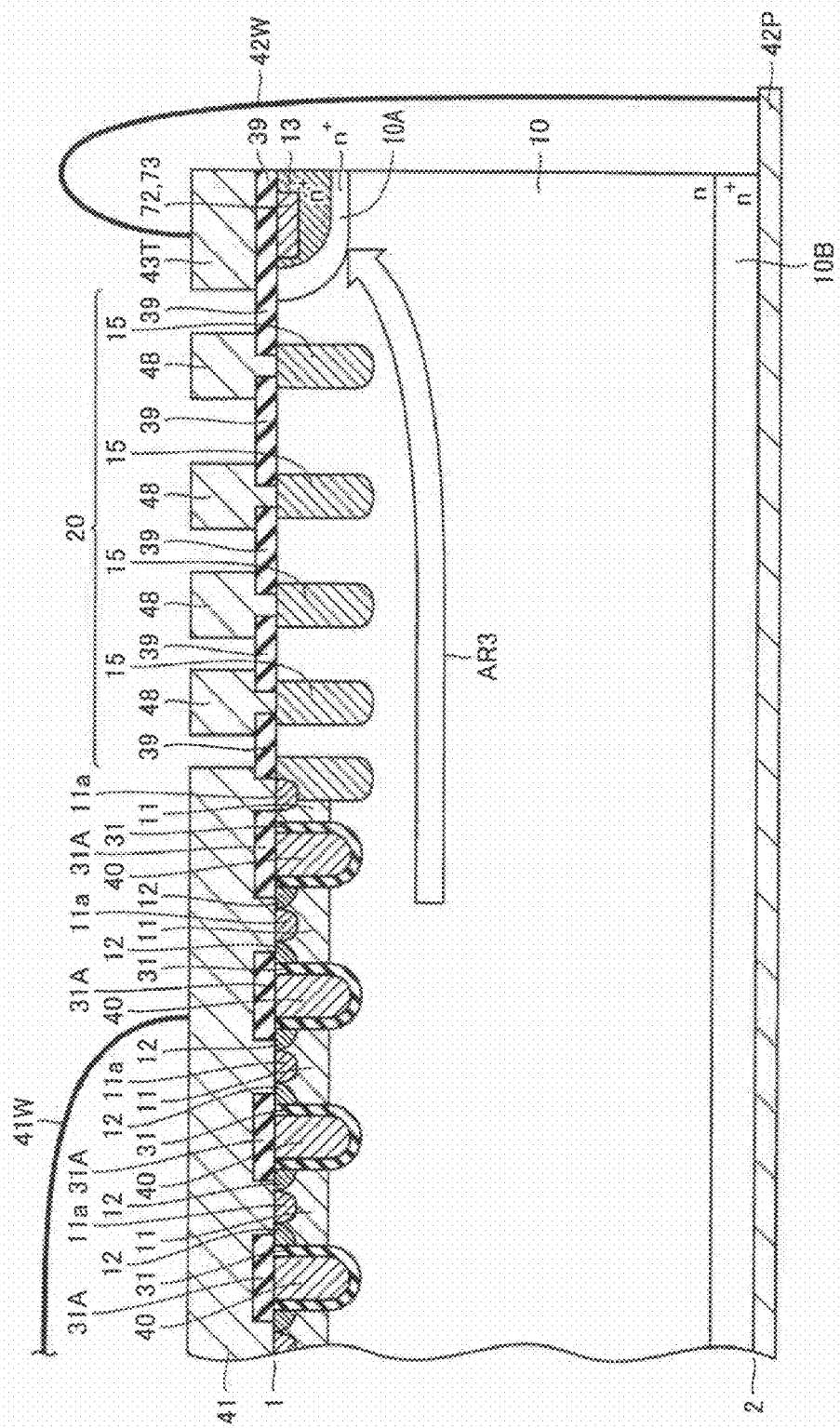
FIG. 35 is a cross sectional view along a line XXXV-XXXV in FIG. 32 seen in the direction of arrows.

Referring to FIG. 35, in a region where $p^+$ type collector region 14 is not formed, $n^+$ type buffer region 10B is formed to extend to the second main surface 2 side of semiconductor substrate 10.

In the first IGBT, n type semiconductor substrate 10 and $n^+$ type emitter region 12 are source/drain regions, and the n channel of p type base region 11 is controlled by gate electrode 40, as in Embodiment 2. Namely, semiconductor substrate 10, $n^+$ type emitter region 12, gate electrode 40, and p type base region 11 form a structure of a field effect transistor.

In the first IGBT, a pnp transistor structure including p type base region 11, n type semiconductor substrate 10, $n^+$ type buffer region 10B, and $p^+$ type collector region 14 is formed, and its base current is controlled by the field effect transistor described above. Thereby, the high voltage semiconductor device of the present embodiment can serve as an IGBT.

A second IGBT includes n type semiconductor substrate 10, a relatively highly concentrated $n^+$ type buffer region 10A, p type base region (the first semiconductor region) 11, relatively highly concentrated $p^+$ type region 11a, $n^+$ type emitter region (the second semiconductor region) 12, a $p^+$ type collector region (the fifth semiconductor region) 15B, insulating film 31, and gate electrode (control electrode) 40.

N type semiconductor substrate 10, p type base region 11, $p^+$ type region 11a, $n^+$ type emitter region 12, insulating film 31, and gate electrode 40 are shared with the first IGBT.

$P^+$ type collector region 15B is formed adjacent to the end surface of semiconductor substrate 10, from the first main surface 1 toward the second main surface 2. $P^+$ type collector region 15B is formed with a depth not penetrating semiconductor substrate 10.

Referring to FIG. 33, both edges of $p^+$ type collector region 15B (in a vertical direction in a paper plane of FIG. 33) are sandwiched by $n^+$ type buffer region 10A. $P^+$ type collector region 15B and $n^+$ type cathode region 13 described later are arranged alternately along the end surface of semiconductor substrate 10 in the first main surface 1. In the end surface of semiconductor substrate 10, $n^+$ type buffer region 10A is sandwiched between $p^+$ type collector region 15B and $n^+$ type cathode region 13. $P^+$ type collector region 15B and $n^+$ type cathode region 13 are formed over the entire circumference of semiconductor substrate 10 along the end surface of semiconductor substrate 10 in the first main surface 1.

Referring to FIG. 34, in the second IGBT, n type semiconductor substrate 10 and $n^+$ type emitter region 12 are source/drain regions, and the n channel of p type base region 11 is controlled by gate electrode 40. Namely, semiconductor substrate 10, $n^+$ type emitter region 12, gate electrode 40, and p type base region 11 form a structure of a field effect transistor.

In the second IGBT, a pnp transistor structure including p type base region 11, n type semiconductor substrate 10, $n^+$ type buffer region 10A, and $p^+$ type collector region 15B is formed, and its base current is controlled by the field effect transistor described above. Thereby, the high voltage semiconductor device of the present embodiment can serve as an IGBT.

(Free Wheel Diode)

Referring to FIG. 35, the free wheel diode formed within the high voltage semiconductor device includes $n^+$ type cathode region (the third semiconductor region) 13, n type semiconductor substrate 10, and p type base region 11.

$N^+$ type cathode region 13 is formed adjacent to the end surface of semiconductor substrate 10, from the first main surface 1 toward the second main surface 2. N$^+$ type cathode region 13 is formed with a depth not penetrating semiconductor substrate 10. N type semiconductor substrate 10, p type base region 11, and p$^+$ type region 11a are shared by the first and second IGBTs and the free wheel diode formed within the semiconductor device.

Referring to FIG. 33, both edges of n$^+$ type cathode region 13 (in the vertical direction in the paper plane of FIG. 33) are sandwiched by n$^+$ type buffer region 10A. N$^+$ type cathode region 13 and p$^+$ type collector region 15B are arranged alternately along the end surface of semiconductor substrate 10 in the first main surface 1, over the entire circumference of the end surface (in a state sandwiching semiconductor substrate 10).

N$^+$ type cathode region 13, n$^+$ type buffer region 10A, and n type semiconductor substrate 10 constitute an n type region as a diode, and p type base region 11 constitutes a p type region as a diode. A pn junction structure is formed between these n type region and p type region. Thereby, the free wheel diode can serve as a diode.

Resistor 72 or diode 73 electrically connecting n$^+$ type cathode region 13 and p$^+$ type collector region 15B is embedded in n$^+$ type buffer region 10A between n$^+$ type cathode region 13 and p$^+$ type collector region 15B. Resistor 72 or diode 73 may be formed on the first main surface 1 of semiconductor substrate 10 to electrically connect n$^+$ type cathode region 13 and p$^+$ type collector region 15B.

In the high voltage semiconductor device of the present embodiment, electric field relaxing portion 20 is formed as in Embodiment 2.

(Main Electrode)

Interlayer insulating film 31A is formed on the first main surface 1 of semiconductor substrate 10 to cover gate electrode 40, as in Embodiment 2. From above interlayer insulating film 31A, the first main electrode 41 is formed on the first main surface 1 of semiconductor substrate 10. Gate electrode 40 is insulated from the first main electrode 41 with interlayer insulating film 31A.

The first main electrode 41 is formed in contact with both of p$^+$ type region 11a and n$^+$ type emitter region 12. The first main electrode 41 is formed to cover a portion of interlayer insulating film 39 constituting electric field relaxing portion 20 (a left end portion of interlayer insulating film 39 in FIG. 34).

Referring to FIG. 32, emitter wire 41W has one end connected to the first main electrode 41, and the other end connected to emitter pad 41P. Referring to FIG. 34, the first main electrode 41 is an electrode that provides a (reference) potential to p$^+$ type region 11a, p type base region 11, and n$^+$ type emitter region 12, through emitter pad 41P and emitter wire 41W.

The second main electrode 42P is formed in contact with p$^+$ type collector region 14 formed in the second main surface 2 of semiconductor substrate 10. The second main electrode 42P serves as a collector pad. The second main electrode 42P is an electrode that provides a (high) potential to p$^+$ type collector region 14.

The third main electrode 43T is formed to extend into an opening (contact hole) formed in interlayer insulating film 39, and is in contact with only a surface side of p+type collector region 15B. The third main electrode 43T is firstly electrically connected to p$^+$ type collector region 15B, and electrically connected to n$^+$ type cathode region 13 via resistor 72 or diode 73.

The third main electrode 43T is an electrode that provides a (high) potential to n$^+$ type cathode region 13 and p$^+$ type collector region 15B. The second main electrode 42P and the third main electrode 43T are electrically connected by connection portion 42W such as a conductive wire.

When the high voltage semiconductor device of the present embodiment serves as an IGBT, the first main electrode 41 is equivalent to an emitter electrode, the second main electrode 42P or the third main electrode 43T is equivalent to a collector electrode, and gate electrode 40 is equivalent to a gate electrode.

When the high voltage semiconductor device of the present embodiment serves as a (free wheel) diode, the first main electrode 41 is equivalent to an anode electrode, and the third main electrode 43T is equivalent to a cathode electrode.

(Function/Effect)

Referring to FIG. 34, during the ON operation of the IGBTs, a current flows in the direction indicated by arrow AR1 or in the direction indicated by arrow AR2. During the OFF operation of the IGBTs, no current flows in the direction indicated by arrow AR1 and in the direction indicated by arrow AR2.

Referring to FIG. 35, during the ON operation of the free wheel diode, a current flows in the direction indicated by arrow AR3. The current flows in parallel to the current that flows in the direction indicated by arrow AR2 during the ON operation of the second IGBT, and in the opposite direction.

Therefore, an equivalent circuit in which IGBTs and a diode are connected in anti-parallel is formed between the first main electrode 41 and the second main electrode 42P, and between the first main electrode 41 and the third main electrode 43T. Namely, the high voltage semiconductor device of the present embodiment has a function as a circuit in which IGBTs and a free wheel diode are connected in anti-parallel.

The third main electrode 43T can provide a (high) potential to n$^+$ type cathode region 13 or p$^+$ type collector region 15B. On this occasion, connection portion 42W is directly connected to p$^+$ type collector region 15B, and connected to n$^+$ type cathode region 13 via resistor 72 or diode 73. This causes an increase in the resistance between the current that flows during the ON operation of the IGBTs and the current that flows during the ON operation of the free wheel diode, and thus can suppress occurrence of a snap-back phenomenon.

In the high voltage semiconductor device of the present embodiment, the first IGBT is formed between the first main surface 1 and the second main surface 2 of semiconductor substrate 10, and the second IGBT is formed along the first main surface 1. Therefore, the area on the collector side of the IGBTs can be increased, making it possible to improve performance as a high voltage semiconductor device and to reduce the size and weight thereof.

Embodiment 10

Referring to FIGS. 36 to 40, Embodiment 10 according to the present invention will be described. A high voltage semiconductor device of the present embodiment is different from the high voltage semiconductor device of Embodiment 9 in that p$^+$ type collector region 15B and n$^+$ type cathode region 13 are alternately arranged with a trench region 80 sandwiched therebetween, in that the third main electrode 43T is formed in contact with both surfaces of p$^+$ type collector region 15B and n$^+$ type cathode region 13, and in that the former does not have resistor 72 and diode 73. Other configurations are substantially the same.

Figure 36:
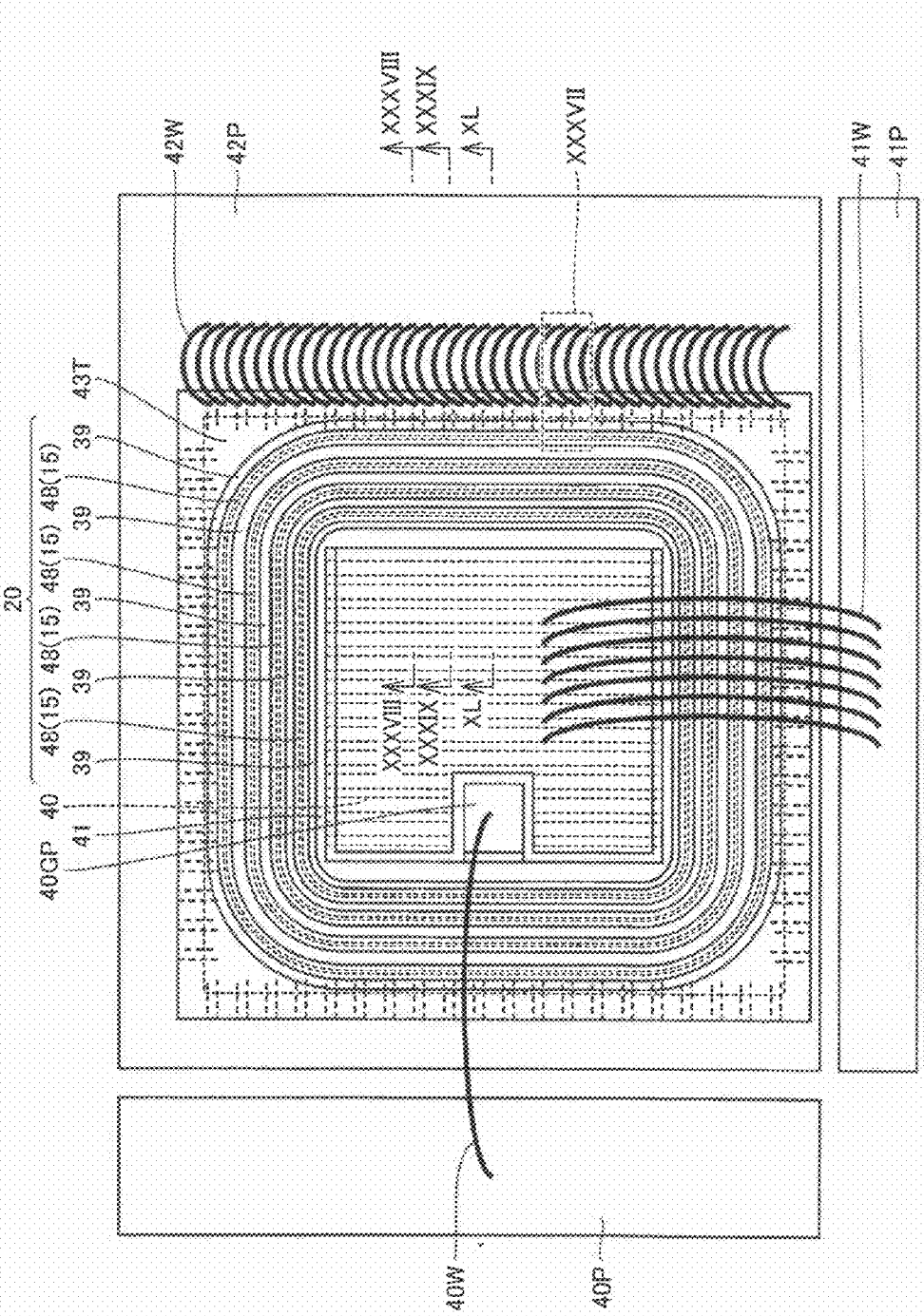
FIG. 36 is a plan view showing a high voltage semiconductor device of Embodiment 10.
Figure 37:
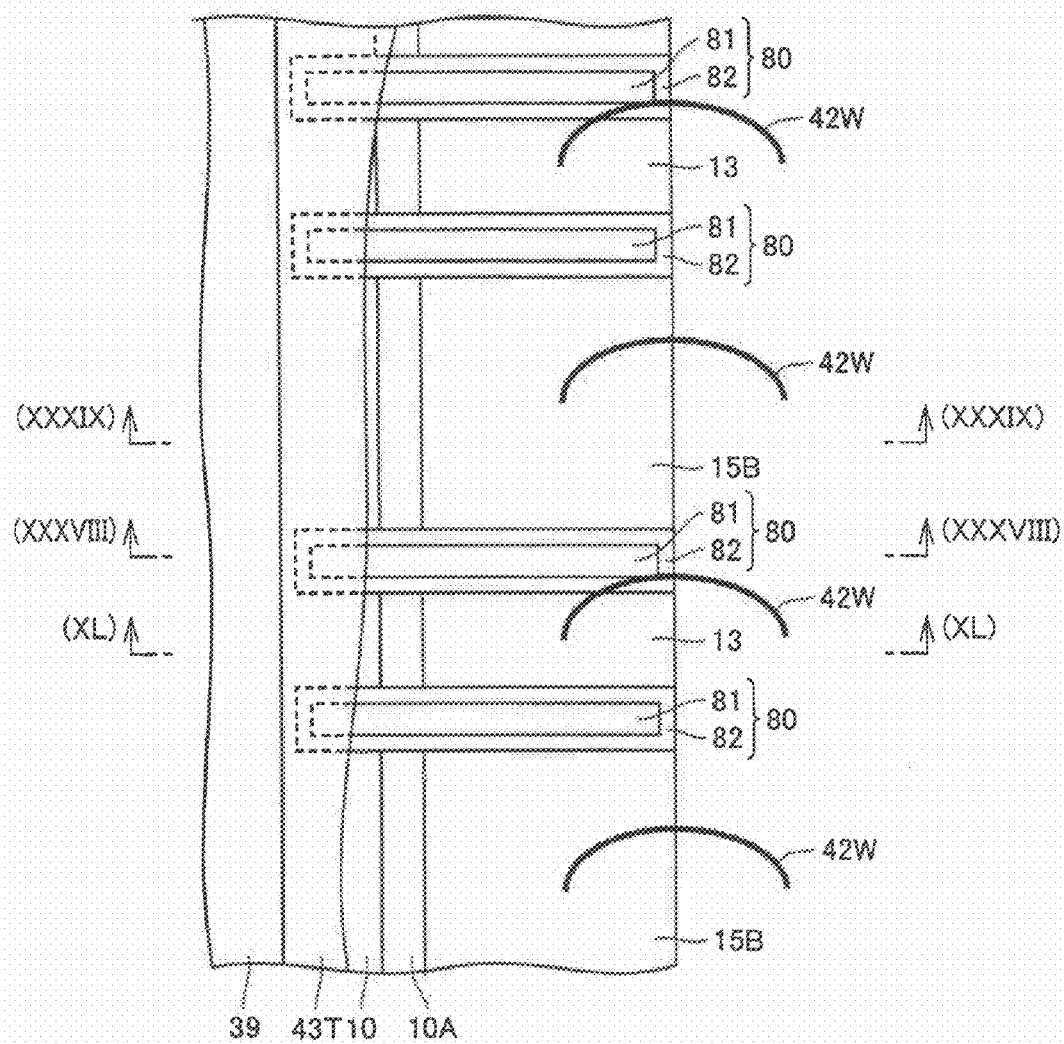
FIG. 37 is an enlarged fragmentary view of a region surrounded by a line XXXVII in FIG. 36.

Referring to FIGS. 36 and 37, p$^+$ type collector region 15B and n$^+$ type cathode region 13 are formed adjacent to the end surface of semiconductor substrate 10, from the first main surface 1 toward the second main surface 2, as in Embodiment 9. P⁺ type collector region 15B and n⁺ type cathode region 13 are each formed with a depth not penetrating semiconductor substrate 10.

Both edges of each of p⁺ type collector region 15B and n⁺ type cathode region 13 (in a vertical direction in a paper plane of FIG. 37) are sandwiched by trench regions 80. Trench region 80 includes an insulating film 82 and a conductive layer 81 in the shape of a thin plate included in insulating film 82. P⁺ type collector region 15B and n⁺ type cathode region 13 are arranged alternately along the end surface of semiconductor substrate 10 in the first main surface 1. P⁺ type collector region 15B and n⁺ type cathode region 13 are formed over the entire circumference of semiconductor substrate 10 along the end surface of semiconductor substrate 10 in the first main surface 1 (in a state sandwiching trench region 80).

The third main electrode 43T is formed in contact with both of n⁺ type cathode region 13 and p⁺ type collector region 15B formed on the end surface side of the first main surface 1 of semiconductor substrate 10. Connection portion 42W has one end connected to the third main electrode 43T, and the other end connected to the second main electrode 42P. Thus, the second main electrode 42P can provide a (high) potential to n⁺ type cathode region 13 or p⁺ type collector region 15B.

(Function/Effect)

Figure 38:
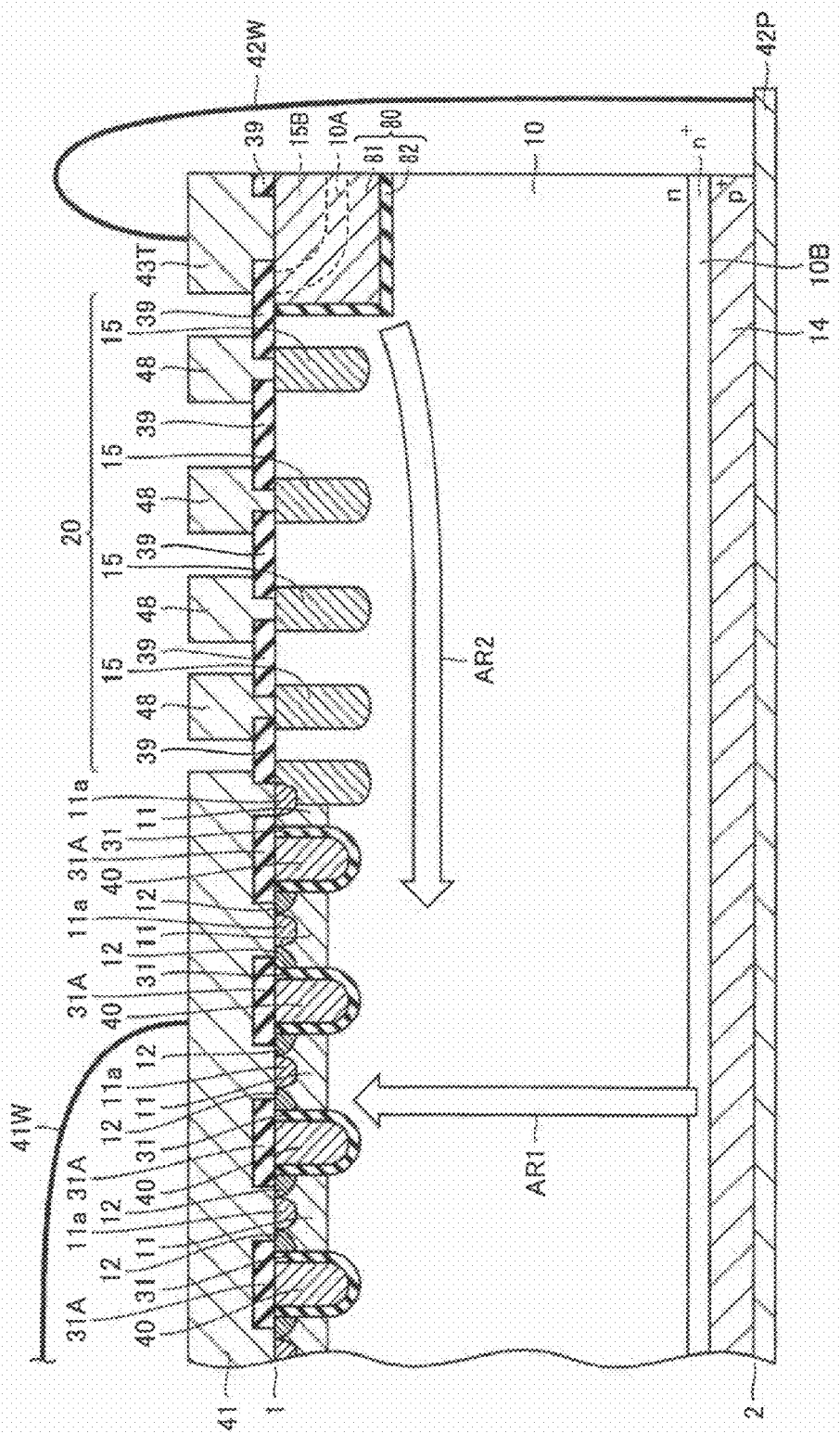
FIG. 38 is a cross sectional view along a line XXXVIII-XXXVIII in FIG. 36 seen in the direction of arrows.
Figure 39:
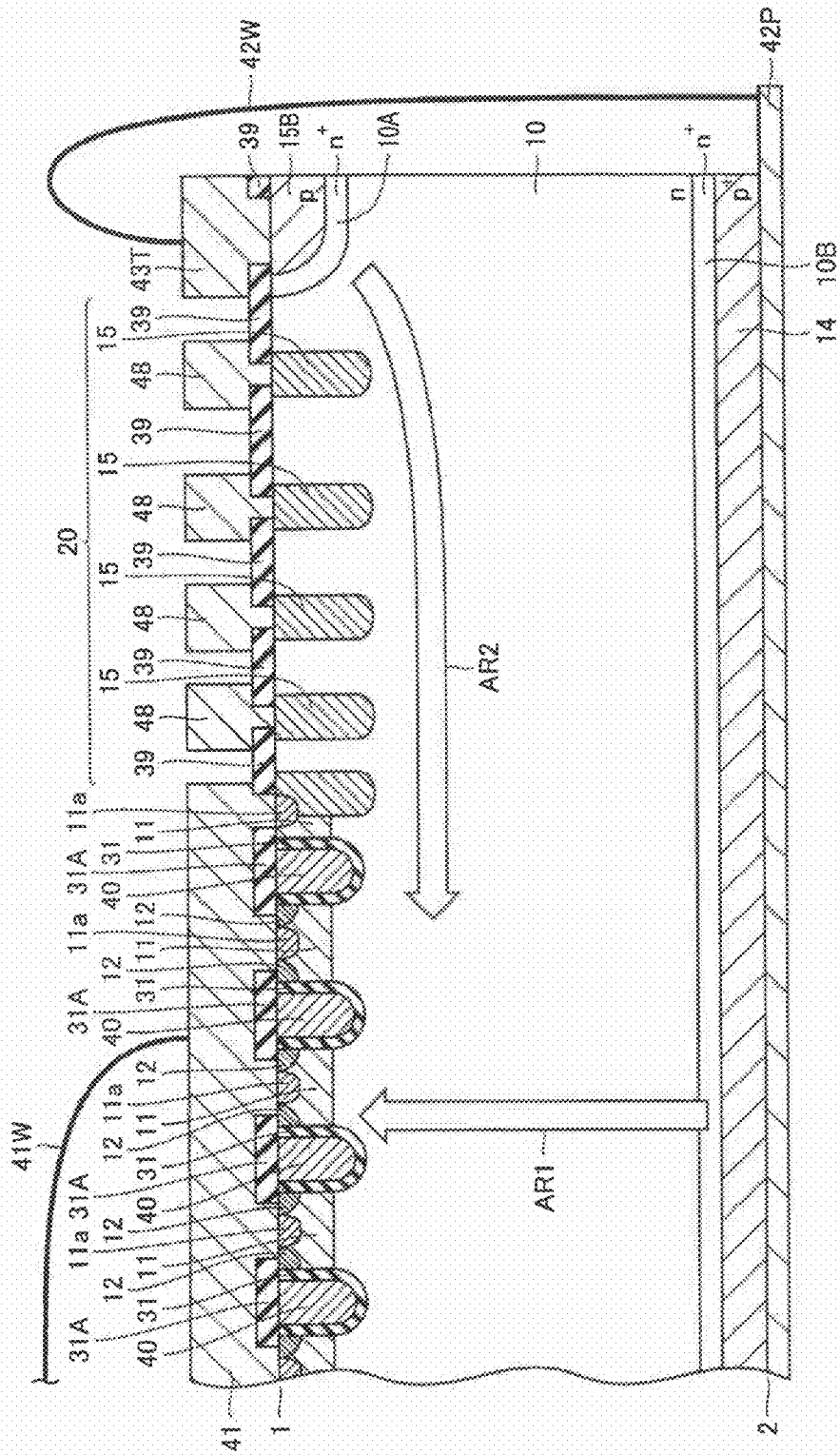
FIG. 39 is a cross sectional view along a line XXXIX-XXXIX in FIG. 36 seen in the direction of arrows.
Figure 40:
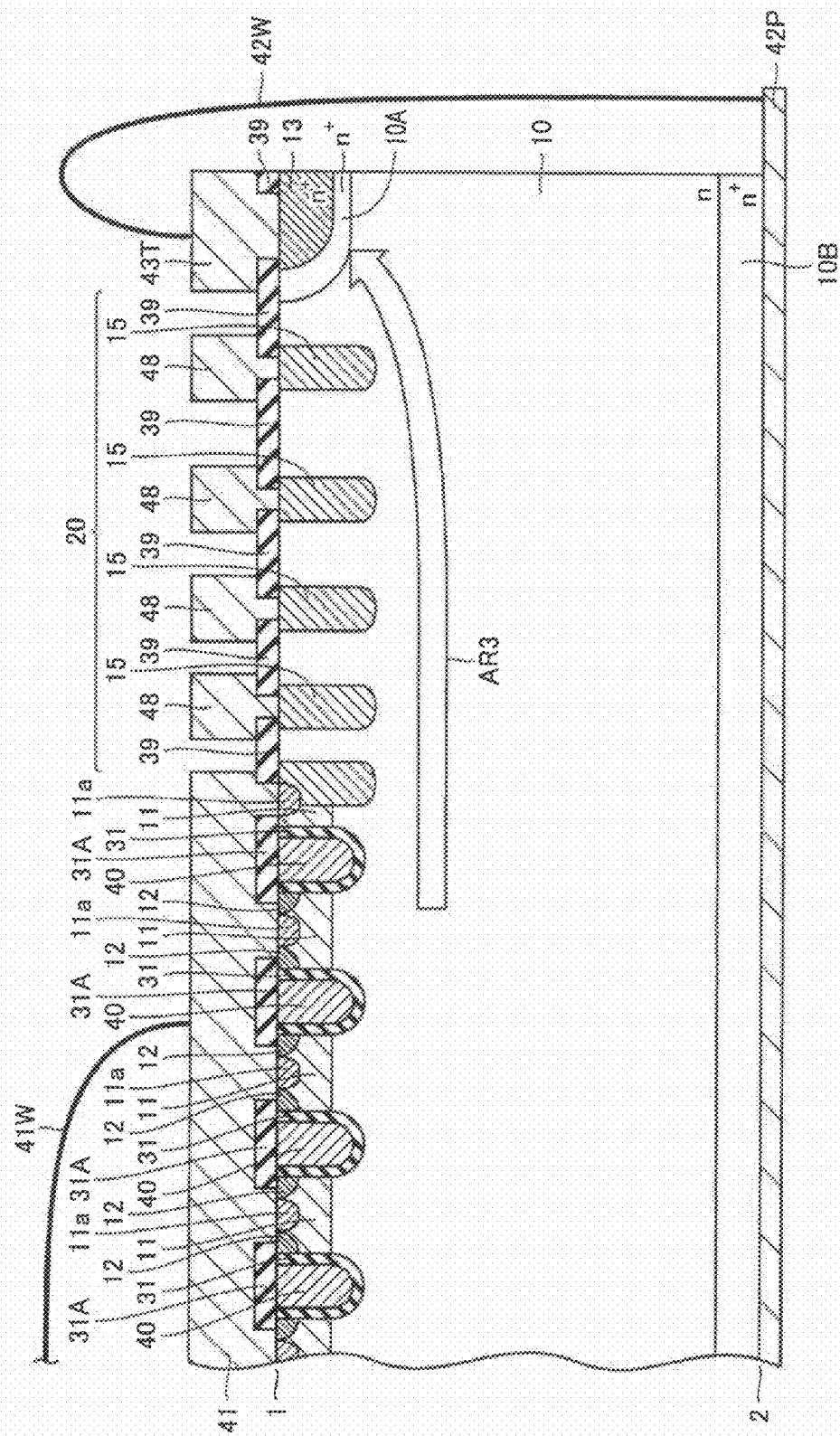
FIG. 40 is a cross sectional view along a line XL-XL in FIG. 36 seen in the direction of arrows.

Referring to FIGS. 38 and 39, as in Embodiment 9, during the ON operation of the IGBTs, a current flows in the direction indicated by arrow AR1 or in the direction indicated by arrow AR2. During the OFF operation of the IGBTs, no current flows in the direction indicated by arrow AR1 and in the direction indicated by arrow AR2. Referring to FIG. 40, during the ON operation of the free wheel diode, a current flows in the direction indicated by arrow AR3. The current flows in parallel to the current that flows in the direction indicated by arrow AR2 during the ON operation of the second IGBT, and in the opposite direction.

Therefore, as in Embodiment 9, an equivalent circuit in which IGBTs and a diode are connected in anti-parallel is formed between the first main electrode 41 and the second main electrode 42P, and between the first main electrode 41 and the third main electrode 43T. Namely, the high voltage semiconductor device of the present embodiment has a function as a circuit in which IGBTs and a free wheel diode are connected in anti-parallel.

Trench region 80 is formed between n⁺ type cathode region 13 and p⁺ type collector region 15B. This causes an increase in the resistance between the current that flows during the ON operation of the IGBTs and the current that flows during the ON operation of the free wheel diode, and thus can suppress occurrence of a snap-back phenomenon.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A high voltage semiconductor device, comprising:
a semiconductor substrate of a first conductivity type having first and second main surfaces;
a first semiconductor region of a second conductivity type formed in said first main surface of said semiconductor substrate and surrounded by said semiconductor substrate in said first main surface;
a second semiconductor region of the first conductivity type formed in said first main surface and sandwiching said first semiconductor region between it and said semiconductor substrate;
a third semiconductor region of the first conductivity type formed adjacent to an end surface of said semiconductor substrate, from said first main surface toward said second main surface, with a depth not penetrating said semiconductor substrate;
a fourth semiconductor region of the second conductivity type formed in said second main surface of said semiconductor substrate;
an electric field relaxing portion in an annular shape formed in said first main surface of said semiconductor substrate and surrounding said first semiconductor region in said first main surface;
a control electrode formed to face a channel region in said first semiconductor region sandwiched between said semiconductor substrate and said second semiconductor region, with an insulating film interposed therebetween;
a first main electrode formed in contact with both of said first semiconductor region and said second semiconductor region;
a second main electrode formed in contact with said fourth semiconductor region;
a third main electrode formed in contact with said third semiconductor region; and
a conductive wire electrically connecting said second and third main electrodes,
a resistance between said first semiconductor region and said third semiconductor region being greater than a resistance between said first semiconductor region and said fourth semiconductor region.

2. The high voltage semiconductor device according to claim 1, wherein,
said electric field relaxing portion is a fifth semiconductor region of the second conductivity type formed from said first main surface toward said second main surface with a predetermined depth, and surrounding said second semiconductor region in said first main surface, and
said depth of said third semiconductor region is greater than said predetermined depth of said fifth semiconductor region.

3. The high voltage semiconductor device according to claim 1, wherein,
said electric field relaxing portion is a fifth semiconductor region of the second conductivity type formed from said first main surface toward said second main surface with a predetermined depth, and surrounding said second semiconductor region in said first main surface with said first semiconductor region interposed therebetween, and
said fifth semiconductor region is provided in a form of a dashed line in a circumferential direction surrounding said first semiconductor region.

4. The high voltage semiconductor device according to claim 1, wherein,
said electric field relaxing portion is a first trench region formed from said first main surface toward said second main surface with a predetermined depth, and
said first trench region is provided in a form of a dashed line in a circumferential direction surrounding said first semiconductor region.

5. The high voltage semiconductor device according to claim 1, wherein a lifetime between said first semiconductor region and said fourth semiconductor region is different from a lifetime between said first semiconductor region and said third semiconductor region.

6. The high voltage semiconductor device according to claim 1, wherein said conductive wire includes a resistor or a diode.

7. The high voltage semiconductor device according to claim 1, further comprising:
a second trench region formed from said first main surface to penetrate said first semiconductor region, wherein,
said second trench region is provided to divide said first semiconductor region located on a side closer to said third semiconductor region than a region where said channel region is formed, into said first semiconductor region including said channel region and said first semiconductor region not including said channel region, and
said first semiconductor region including said channel region is electrically connected to said first semiconductor region not including said channel region.

8. The high voltage semiconductor device according to claim 6, wherein,
said resistor or said diode is formed on said first main surface with an interlayer insulating film sandwiched therebetween,
said third main electrode is electrically connected to said resistor or said diode,
said resistor or said diode is electrically connected to said conductive wire, and
said conductive wire is electrically connected to said second main electrode.

9. The high voltage semiconductor device according to claim 7, wherein an impurity concentration of said first semiconductor region including said channel region is set lower than an impurity concentration of said first semiconductor region not including said channel region.

10. The high voltage semiconductor device according to claim 7, wherein a depth of said first semiconductor region including said channel region is set shallower than a depth of said first semiconductor region not including said channel region.

11. The high voltage semiconductor device according to claim 7, wherein a peak concentration region of said first semiconductor region including said channel region is set at a position deeper than a peak concentration region of said first semiconductor region not including said channel region.

12. A high voltage semiconductor device, comprising:
a semiconductor substrate of a first conductivity type having first and second main surfaces;
a first semiconductor region of a second conductivity type formed in said first main surface of said semiconductor substrate and surrounded by said semiconductor substrate in said first main surface;
a second semiconductor region of the first conductivity type formed in said first main surface and sandwiching said first semiconductor region between it and said semiconductor substrate;
a third semiconductor region of the first conductivity type and a fourth semiconductor region of the second conductivity type provided to be alternately arranged adjacent to an end surface of said semiconductor substrate in said first main surface, and each formed from said first main surface toward said second main surface with a depth not penetrating said semiconductor substrate;
a trench region formed adjacent to the end surface of said semiconductor substrate in said first main surface, from said first main surface toward said second main surface, to separate said third semiconductor region and said fourth semiconductor region;
a control electrode formed to face said first semiconductor region sandwiched between said semiconductor substrate and said second semiconductor region, with an interlayer insulating film interposed therebetween;
a first main electrode formed in contact with both of said first semiconductor region and said second semiconductor region; and
a second main electrode formed to be electrically connected to said third semiconductor region and said fourth semiconductor region.

13. A high voltage semiconductor device, comprising:
a semiconductor substrate of a first conductivity type having first and second main surfaces;
a first semiconductor region of a second conductivity type formed in said first main surface of said semiconductor substrate and surrounded by said semiconductor substrate in said first main surface;
a second semiconductor region of the first conductivity type formed in said first main surface and sandwiching said first semiconductor region between it and said semiconductor substrate;
a third semiconductor region of the first conductivity type and a fourth semiconductor region of the second conductivity type provided to be alternately arranged adjacent to an end surface of said semiconductor substrate in said first main surface with said semiconductor substrate sandwiched therebetween, and each formed from said first main surface toward said second main surface with a depth not penetrating said semiconductor substrate;
a control electrode formed to face said first semiconductor region sandwiched between said semiconductor substrate and said second semiconductor region, with an interlayer insulating film interposed therebetween;
a first main electrode formed in contact with both of said first semiconductor region and said second semiconductor region;
a resistor or a diode connecting said third semiconductor region and said fourth semiconductor region including a conductive wire; and
a second main electrode electrically connected to said fourth semiconductor region.

14. The high voltage semiconductor device according to claim 13, wherein said resistor or said diode is provided on said first main surface to face said semiconductor substrate sandwiched between said third semiconductor region and said fourth semiconductor region with said interlayer insulating film interposed therebetween, or provided inside said semiconductor substrate between said third semiconductor region and said fourth semiconductor region.

15. The high voltage semiconductor device according to claim 13, further comprising:
a fifth semiconductor region of the second conductivity type formed in said second main surface of said semiconductor substrate; and
a third main electrode formed in contact with said fifth semiconductor region, wherein
said conductive wire connects said second main electrode and said third main electrode.

* * * * *